United States Patent
Shinozaki et al.

(10) Patent No.: US 7,471,585 B2
(45) Date of Patent: *Dec. 30, 2008

(54) SEMICONDUCTOR MEMORY

(75) Inventors: Naoharu Shinozaki, Kawasaki (JP); Tatsuya Kanda, Kawasaki (JP); Takahiko Sato, Kawasaki (JP); Akihiro Funyu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 106 days.

This patent is subject to a terminal disclaimer.

(21) Appl. No.: 11/508,917

(22) Filed: Aug. 24, 2006

(65) Prior Publication Data

US 2006/0285413 A1    Dec. 21, 2006

Related U.S. Application Data

(60) Division of application No. 11/057,841, filed on Feb. 15, 2005, now Pat. No. 7,113,441, which is a continuation of application No. PCT/JP02/11555, filed on Nov. 6, 2002.

(30) Foreign Application Priority Data

Sep. 20, 2002   (JP)   ............................ 2002-274970

(51) Int. Cl.
    *G11C 7/00*   (2006.01)
(52) U.S. Cl. .................. 365/222; 365/189.04; 365/191; 365/201
(58) Field of Classification Search ................ 365/222, 365/191, 201, 189.04

See application file for complete search history.

(56) References Cited

U.S. PATENT DOCUMENTS

| 4,829,484 | A | 5/1989 | Arimoto et al. |
| 6,324,113 | B1 * | 11/2001 | Tomita ..................... 365/222 |
| 7,113,441 | B2 * | 9/2006 | Shinozaki et al. ........... 365/222 |

FOREIGN PATENT DOCUMENTS

| EP | 1 061 523 A1 | 12/2000 |
| EP | 1 150 301 A1 | 10/2001 |
| EP | 1 235 228 A1 | 8/2002 |
| JP | 49-46349 A | 9/1972 |
| JP | 63-247995 B2 | 10/1988 |
| JP | 63-247997 A | 10/1988 |
| JP | 07-141861 A | 6/1995 |
| JP | 2000-353382 A | 12/2000 |

* cited by examiner

*Primary Examiner*—Pho M. Luu
(74) *Attorney, Agent, or Firm*—Arent Fox LLP

(57) ABSTRACT

A refresh signal is output in response to a refresh request generated at predetermined cycles, and a refresh operation is performed. The refresh operation ends when a conflict occurs between an access request and the refresh request. Consequently, an access operation corresponding to the access request can be started earlier with a reduction in access time. The access time can be reduced further by changing the end time of the refresh operation in accordance with the timing of supply of the access request. Since a test circuit for notifying the state of the refresh operation to exterior is formed, the operation margin of the refresh operation can be evaluated in a short time. As a result, it is possible to reduce the development period of the semiconductor memory.

21 Claims, 39 Drawing Sheets

SEMICONDUCTOR MEMORY

CROSS REFERENCE TO RELATED APPLICATION

This application is a divisional of prior U.S. patent application Ser. No. 11/057,841, filed Feb. 15, 2005 now U.S. Pat. No. 7,113,441, which in turn is a continuation of International Application PCT/JP 02/11555, filed on Nov. 6, 2002, which claims the benefit of priority from Japanese Patent Application No. 2002-274970, filed on Sep. 20, 2002. The disclosures of the prior applications are hereby incorporated herein in their entirety by reference.

BACKGROUND OF THE INVENTION

1. Field of the Invention

The present invention relates to a semiconductor memory which requires periodic refresh operations to retain data written in its memory cells. In particular, the present invention relates to a semiconductor memory which performs refresh operations automatically inside without requiring a refresh command from exterior. In addition, the present invention relates to a technology for testing the foregoing semiconductor memory.

2. Description of the Related Art

In recent years, mobile apparatuses such as a cellular phone have become more sophisticated in service facilities, and the amounts of data to be handled have been growing steadily. Higher capacities are then required of the work memories to be mounted on the mobile apparatuses accordingly.

Conventionally, the work memories of the mobile apparatuses have used SRAMs which allow easier system configuration. The SRAMs are, however, greater than DRAMs in the number of devices for constituting each single bit of cell, and thus are disadvantageous for higher capacities. In view of this, semiconductor memories that have DRAM memory cells and operate as SRAMs by performing refresh operations on the memory cells automatically inside have been developed.

In the semiconductor memories of this type, the refresh operation time for performing a single refresh operation is included in the read cycle time or write cycle time. Specifically, the first half of a cycle time is allocated for the refresh operation time. The actual read operation or write operation is performed in the second half of the cycle time. Thus, the systems (users) on which the semiconductor memories are mounted need not be aware of the refresh operations in the semiconductor memories. That is, the users can use these semiconductor memories as SRAMs.

Besides, in the semiconductor memories of this type, the refresh operation time is rendered shorter than the read operation time for the sake of reducing the cycle time. Specifically, the time for selecting word lines in a refresh operation is shorter than the time for selecting word lines in a read operation (for example, see Japanese Examined Patent Application Publication No. 7-58589 (pp. 2-3, FIG. 4)).

In the semiconductor memory disclosed in the foregoing publication, a refresh operation is performed before a read operation when a refresh request occurs immediately before the read operation. The refresh operation time is set to be shorter than the read operation time. The refresh operation time, however, can only be made slightly shorter than the read operation time in order to rewrite predetermined signal quantities of data to the memory cells. As described above, an actual read operation is performed in the second half of the read cycle time. Consequently, it is impossible to reduce the access time sufficiently.

Incidentally, FIG. 4 of the foregoing publication does not show that refresh operations RF are performed before and after a read operation (read data D). What is shown in FIG. 4 is a simplified example where the refresh operation RF is performed before or after the read operation in accordance with the timing of occurrence of the refresh request (lines 1-10 in column 5 of the foregoing publication).

Moreover, as stated above, the pseudo SRAMs perform refresh operations automatically without being recognized from exterior. In the meantime, the data retained in the memory cells might be corrupted unless refresh operations are performed properly. It is therefore necessary to evaluate if refresh operations are performed properly. In particular, detailed evaluations are required of the circuit operation when a conflict occurs between a request for a read operation or write operation which is supplied from exterior and a request for a refresh operation which occurs inside the chips.

SUMMARY OF THE INVENTION

It is an object of the present invention to provide a semiconductor memory which has both the high capacity of a DRAM and the usability of an SRAM.

It is another object of the present invention to reduce the access time of a semiconductor memory which performs refresh operations automatically inside the chip.

It is another object of the present invention to perform reliable refresh operations in a semiconductor memory which performs the refresh operations automatically inside the chip.

It is another object of the present invention to evaluate the internal state of the chip for the sake of performing reliable refresh operations.

According to a first aspect of the semiconductor memory of the present invention, a memory core has a plurality of memory cells. A command control circuit outputs an access signal for accessing the memory cells in response to an access request supplied through a command terminal. A refresh timer generates a refresh request at predetermined cycles in order to refresh the memory cells. A refresh control circuit outputs a first refresh signal in response to the refresh request in order to start a refresh operation. The output of the first refresh signal is stopped when a conflict occurs between the access request and the refresh request. Consequently, an access operation corresponding to the access request can be started earlier. That is, it is possible to reduce the access time. The refresh control circuit outputs a second refresh signal in response to the refresh request after the access operation corresponding to the access request. A core control circuit performs the access operation in response to the access signal, and performs first and second refresh operations in response to the first and second refresh signals, respectively. The second refresh operation is always performed after the first refresh operation. Thus, even if the first refresh operation only rewrites the memory cells insufficiently, sufficient signal quantities of data are rewritten to the memory cells by the subsequent second refresh operation. Consequently, even when a conflict occurs between the access request and the refresh request and precedence is given to the access request, it is possible to retain the data in the memory cells with reliability.

According to a preferred example of the first aspect of the semiconductor memory of the present invention, an external address input circuit receives an external address signal through an address terminal. A refresh counter generates a refresh address signal indicating a memory cell to refresh out of the memory cells. A switch circuit selects the refresh address in response to the output of the first and second refresh signals, selects the external address signal when neither of the first and second refresh signals is output, and outputs the selected address signal to the memory core. Since the switch circuit is operated by the first and second refresh signals, it is possible to simplify the switching control on the address signals. Consequently, the switch circuit can be configured simply.

According to a preferred example of the first aspect of the semiconductor memory of the present invention, the execution time of the first refresh operation is shorter than the execution time of the second refresh operation. The execution time of the first refresh operation can be minimized to start the access operation even earlier.

According to a preferred example of the first aspect of the semiconductor memory of the present invention, the execution time of the first refresh operation is the time in which data to be rewritten to the memory cells by the first refresh operation is amplified to a signal quantity capable of being retained without loss until the second refresh operation is performed. That is, the execution time of the first refresh operation is set to its minimum. Since the execution time of the first refresh operation is minimized, the access operation can be started even earlier.

According to a preferred example of the first aspect of the semiconductor memory of the present invention, the memory core includes a plurality of word lines connected to the memory cells, respectively, a bit line connected to the memory cells, and a sense amplifier connected to the bit line. The first and second refresh operations include a read stage, an amplifying stage, and a precharging stage. In the read stage, data is read to the bit line from a memory cell accessed in response to the selection of any one of the word lines. In the amplifying stage, the sense amplifier is activated after the data is read to the bit line, and the data on the bit line is amplified. The amplified data is rewritten to the accessed memory cell. In the precharging stage, the word lines are deselected, and the bit line is precharged to a predetermined voltage.

The read stages of the first and second refresh operations are identical to each other in time. The precharging stages of the first and second refresh operations are identical to each other in time. The time of the amplifying stage of the first refresh operation is shorter than the time of the amplifying stage of the second refresh operation. The execution time of the first refresh operation can be minimized easily by adjusting the time of the amplifying stage alone in accordance with the operation. That is, such circuits as the core control circuit can be configured simply.

According to a preferred example of the first aspect of the semiconductor memory of the present invention, the refresh control circuit masks the output of the first refresh signal and outputs the second refresh signal alone when no conflict occurs between the access request and the refresh request. Since the first refresh operation is performed only when needed, it is possible to reduce the power consumption during operation.

According to a preferred example of the first aspect of the semiconductor memory of the present invention, the sum of the execution times of the first and second refresh operations and the execution time twice that of the access operation is smaller than twice the minimum interval of supply of the access request, or an external access cycle time. In other words, the first and second refresh operations and two access operations can be performed within two external access cycle times. In the present invention, the execution time of the first refresh operation is short as described above. It is therefore possible to reduce the external access cycle as compared to heretofore.

According to a preferred example of the first aspect of the semiconductor memory of the present invention, the execution time of the second refresh operation is the same as the execution time of the access operation. This makes it possible to share the control circuits for performing the second refresh operation and the access operation. As a result, the core control circuit and the like can be reduced in circuit scale.

According to a preferred example of the first aspect of the semiconductor memory of the present invention, the execution time of the second refresh operation is shorter than the execution time of the access operation. This produces a timing margin between the execution of the second refresh operation and the execution of the next access operation. Consequently, the core control circuit and the like can be improved in operation margin, whereby the timing design of these circuits is facilitated.

According to a preferred example of the first aspect of the semiconductor memory of the present invention, a test control circuit generates first and second refresh signals from a test refresh request signal supplied through an external testing probe in a test mode. Consequently, a second refresh operation to be performed after a first refresh operation can be started at desired timing. The data to be retained in the memory cells by the first refresh is rewritten to the memory cells again by the second refresh operation. The operation margin of the first refresh operation can thus be evaluated easily.

According to a preferred example of the first aspect of the semiconductor memory of the present invention, the test control circuit sets the interval of generation of the first and second refresh signals in accordance with the pulse width of the test refresh request signal. Consequently, the interval of generation of the first and second refresh signals can be set freely from the one single external testing probe.

According to a second aspect of the semiconductor memory of the present invention, a memory core has a plurality of memory cells, a bit line connected to the memory cells, and a sense amplifier connected to the bit line. A command control circuit outputs an access control signal for accessing the memory cells in response to an access request supplied through a command terminal. An operation control circuit makes the memory core perform an access operation in response to the access control signal.

A refresh timer generates an internal refresh request at predetermined cycles. A refresh control circuit outputs either one of a first refresh control signal and a second refresh control signal in accordance with the timing of occurrence of the access request and the internal refresh request. That is, the refresh control circuit switches between the outputs of the first and second refresh control signals in accordance with the timing of occurrence of the access request and the internal refresh request. The sense amplifier is activated by the first refresh control signal for a first period, and is activated by the second refresh control signal for a second period longer than the first period. An operation control circuit makes the memory core perform first and second refresh operations in response to the first and second refresh control signals. In this way, the semiconductor memory performs two types of refresh operations automatically in accordance with the refresh requests it generates, without being recognized from exterior.

A detecting circuit operates in a test mode and outputs a detecting signal when it detects the first refresh control signal.

Consequently, the timing of switch between the first and second refresh control signals by the refresh control circuit can be detected from the output of the detecting signal. That is, even if the semiconductor memory has the two types of refresh operation facilities, it is possible to evaluate the timing conditions under which the respective refresh operations are performed. Besides, for example, when the first refresh control signal can occur consecutively to cause an operation failure, it is possible to evaluate the timing of occurrence of the failure from the detecting signal with reliability.

Since the two types of refresh operations performed automatically inside the semiconductor memory can be detected easily, it is possible to evaluate the semiconductor memory for operation characteristics pertaining to these refresh operations accurately by simple techniques. As a result, it is possible to reduce the evaluation time with a reduction in the development period of the semiconductor memory. That is, the development cost can be reduced. In another respect, when failures occur from variations of the manufacturing conditions or the like of mass-produced semiconductor memories, it is possible to conduct a failure analysis promptly and minimize the period of dropped yields.

According to a preferred example of the second aspect of the semiconductor memory of the present invention, the detecting signal detected by the detecting circuit is output to exterior of the semiconductor memory through an external terminal. Consequently, it is possible to evaluate the semiconductor memory for operation characteristics pertaining to the refresh operations accurately, for example, by detecting the detecting signal with an evaluation apparatus for evaluating the refresh characteristics of the semiconductor memory.

According to a preferred example of the second aspect of the semiconductor memory of the present invention, a tristate output buffer outputs read data from the memory cells to the data terminal. An output mask circuit controls the tristate output buffer in the test mode, thereby prohibiting the output of the read data to the data terminal in response to the detecting signal and setting the data terminal to a high impedance state. Thus, the evaluation apparatus connected to the semiconductor memory can detect the detecting signal by measuring the data signal for the high impedance state. For example, the occurrence of the detecting signal can be detected easily by using an LSI tester as the evaluation apparatus and conducting a pass/fail evaluation through the use of a program for evaluating the access time. That is, the semiconductor memory can be easily evaluated for operation characteristics pertaining to the refresh operations. Moreover, the use of the data terminal as the external terminal can eliminate the need for the formation of a new terminal, thereby avoiding an increase in chip size.

According to a preferred example of the second aspect of the semiconductor memory of the present invention, a refresh selection circuit outputs a test refresh request supplied through an external testing probe, instead of the internal refresh request, to the refresh control circuit in the test mode. Here, the internal refresh request output from the refresh timer is masked. It is therefore possible to supply refresh requests of desired timing from exterior of the semiconductor memory. Since the refresh request and the access request can be supplied from a single evaluation apparatus, it is possible to control the deviation (time difference) between the access request and the refresh request with high precision. As a result, the semiconductor memory can be evaluated for operation characteristics pertaining to the refresh operations in detail.

According to a preferred example of the second aspect of the semiconductor memory of the present invention, the refresh timer receives a refresh adjustment signal for changing the cycle of generation of the refresh request in the test mode. It is therefore possible to generate refresh requests of desired timing inside the semiconductor memory by using circuits that operate in a normal operation. The refresh characteristics can thus be evaluated under the same condition as in actual circuit operations of the semiconductor memory.

According to a preferred example of the second aspect of the semiconductor memory of the present invention, an arbiter in the refresh control circuit decides precedence between an access operation corresponding to the access request and a refresh operation corresponding to the refresh request when a conflict occurs between the access request and the internal refresh request. The arbiter outputs the access control signal and then the second refresh control signal when the access request has precedence over the internal refresh request. Besides, the arbiter outputs the first refresh control signal, the access control signal, and the second refresh control signal in succession when the internal refresh request has precedence over the access request.

The refresh operation corresponding to the first refresh control signal ends in a short time. Thus, even when the internal refresh request has precedence over the access request, the access operation corresponding to the access request can be started early. That is, it is possible to reduce the access time. The refresh operation corresponding to the second refresh control signal is always performed after the refresh operation corresponding to the first refresh control signal (the first refresh operation). Thus, even if the first refresh operation only rewrites the memory cells insufficiently, sufficient signal quantities of data are rewritten to the memory cells by the subsequent refresh operation. Consequently, even when a conflict occurs between an access request and the refresh request and precedence is given to the access request, it is possible to retain the data in the memory cells with reliability.

According to a preferred example of the second aspect of the semiconductor memory of the present invention, the execution time of the first refresh operation is the time in which data to be rewritten to the memory cells by the first refresh operation is amplified to a signal quantity capable of being retained without loss until the second refresh operation is performed. That is, the execution time of the first refresh operation is set to its minimum. Since the execution time of the first refresh operation is minimized, the access operation can be started even earlier.

According to a third aspect of the semiconductor memory of the present invention, a memory core has a plurality of memory cells. An external terminal receives an access request for accessing the memory cells. A refresh timer generates a refresh request at predetermined cycles. A core control circuit sets the end time of a refresh operation corresponding to the refresh request to between a first time and a second time later than the first time in accordance with the timing of supply of the access request when a conflict occurs between the access request and the refresh request and precedence is given to the refresh request. For example, the core control circuit sets the end time to an earlier time if a difference between the time of reception of the access request and the time of occurrence of the refresh request is small. Moreover, the core control circuit sets the end time to a later time if the difference between the time of reception of the access request and the time of occurrence of the refresh request is large. The end time of the refresh operation is not fixed but variable depending on the timing of supply of the access request. Consequently, when a conflict occurs between the refresh request and the access request, it is possible to start the access request even earlier after the refresh operation. That is, the access time can be reduced further.

Since the end time of the refresh operation varies in accordance with the timing of supply of the access request, the access time remains unchanged even if the access request gradually deviates from the refresh request. It is therefore possible to prevent the access time from varying with the time difference between the refresh request and the access request. Since the access time makes no variation, it is possible to make the maximum value (worst value) of the access time smaller.

According to a preferred example of the third aspect of the semiconductor memory of the present invention, an arbiter decides precedence between an access operation corresponding to the access request and a refresh operation corresponding to the refresh request when a conflict occurs between the access request and the internal refresh request. The arbiter outputs an access control signal for starting an access operation and then a refresh control signal for starting a refresh operation to the core control circuit when the access request has precedence over the refresh request. Moreover, the arbiter outputs the refresh control signal and then the access control signal to the core control circuit when the refresh request has precedence over the access request. The core control circuit performs the access operation and the refresh operation in accordance with the access control signal and the refresh control signal, respectively. Consequently, the access operation and the refresh operation can be performed with reliability even when a conflict occurs between the access request and the refresh request.

According to a preferred example of the third aspect of the semiconductor memory of the present invention, the memory core has a plurality of word lines connected to the memory cells, respectively. The end time of the refresh operation corresponds to the time of inactivation of the word lines. That is, the core control circuit ends the refresh operation by inactivating the word lines in accordance with the timing of supply of the access request.

According to a preferred example of the third aspect of the semiconductor memory of the present invention, the memory core has a bit line connected to the memory cells and a sense amplifier connected to the bit line. The end time of the refresh operation corresponds to the time of inactivation of the sense amplifier. That is, the core control circuit ends the refresh operation by inactivating the sense amplifier as well as inactivating the word lines in accordance with the timing of supply of the access request.

According to a preferred example of the third aspect of the semiconductor memory of the present invention, the core control circuit has a timing generator for generating a first time signal for notifying of the first time and a second time signal for notifying of the second time. The core control circuit sets the end time in accordance with the timing of supply of the access request with respect to the timing of generation of the first and second time signals. Consequently, the refresh operation can be ended in accordance with the timing of supply of the access request by using a simple logic circuit.

According to a preferred example of the third aspect of the semiconductor memory of the present invention, the end time is set to the first time and a first short refresh operation is performed when the access request is supplied before the first time. The end time is set to the time of supply of the access request and a second short refresh operation is performed when the access time is supplied between the first time and the second time. The end time is set to the second time and a normal short refresh operation is performed when the access request is supplied after the second time.

The refresh operation always ends at or after the first time. Since the minimum refresh operation period is secured (the first short refresh operation), it is possible to prevent the data in the memory cells from being corrupted by the refresh operation. Besides, the refresh operation always ends at or before the second time. Even when no access request is supplied, the refresh operation is always terminated at the second time. The memory core can thus be prevented from unnecessary operations. As a result, it is possible to avoid unnecessary consumption of the core operation current. In addition, when the refresh operation is set to end between the first time and the second time, it is possible to complete the refresh operation in synchronization with the timing of supply of the access request. Here, the memory cells are written with maximum charges capable of being rewritten without deterioration in access time. This allows a margin for the data retention characteristics as compared to the case of the first short refresh operation.

According to a preferred example of the third aspect of the semiconductor memory of the present invention, the memory core has a plurality of word lines connected to the memory cells. The semiconductor memory has a first operation mode in which the interval of generation of the refresh request to be output from the refresh timer is longer, and a second operation mode in which the interval of generation of the refresh request is shorter. One of the word lines is selected in response to the refresh request.

In the first operation mode, when the first or second short refresh operation is performed in response to the refresh request, the semiconductor memory attempts the normal refresh operation on the selected word line after this first or second refresh operation. The semiconductor memory enters the second operation mode when the access request has precedence and the normal refresh operation on the selected word line cannot be performed before the next refresh request occurs. Since the decision on the entry to the second operation mode is postponed for a predetermined period, whether the frequency of supply of the access request is temporarily high or remains high can be decided with reliability. It is therefore possible to enter an optimum operation mode in accordance with the access frequency. As a result, the period of being in the second operation mode can be minimized to make the power consumption of the refresh operation the bare minimum. That is, the semiconductor memory can be reduced in power consumption.

According to a preferred example of the third aspect of the semiconductor memory of the present invention, a refresh counter makes a count operation in response to the refresh request in order to select the word lines in succession. The semiconductor memory enters the first operation mode when the normal refresh operation alone is performed and the refresh counter goes through a single round in the second operation mode. When the frequency of the access request falls for a predetermined period, the first operation mode is entered to lower the frequency of the refresh request. This allows a reduction in power consumption.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
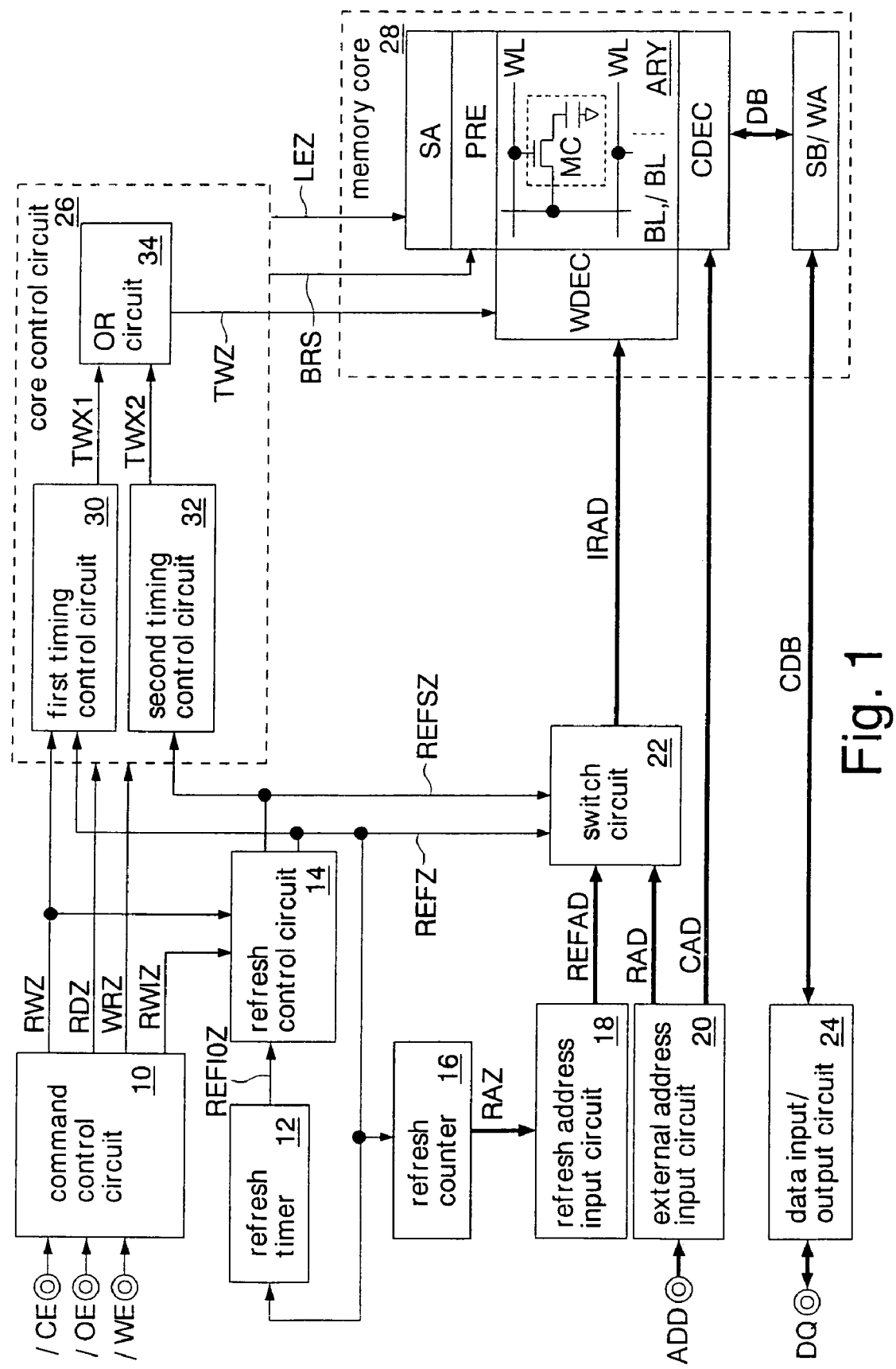
FIG. 1 is a block diagram showing a first embodiment of the semiconductor memory of the present invention.

Hereinafter, embodiments of the present invention will be described with reference to the drawings. In the drawings, thick lines represent signal lines each consisting of a plurality of bits. Double circles in the drawings represent external terminals. Signals with a leading "/" and signals ending in "X" show negative logic. Signals ending in "Z" show positive logic.

FIG. 1 shows a first embodiment of the semiconductor memory of the present invention. This semiconductor memory is formed as a pseudo SRAM which has DRAM memory cells and an SRAM interface. The pseudo SRAM performs periodic refresh operations inside the chip without receiving refresh commands from exterior, thereby retaining data written in its memory cells. This pseudo SRAM is used, for example, as a work memory to be mounted on a cellular phone.

The pseudo SRAM has a command control circuit 10, a refresh timer 12, a refresh control circuit 14, a refresh counter 16, a refresh address input circuit 18, an external address input circuit 20, a switch circuit 22, a data input/output circuit 24, a core control circuit 26, and a memory core 28.

The command control circuit 10 receives command signals (a chip enable signal /CE, an output enable signal /OE, and a write enable signal /WE) from exterior through command terminals, decodes the received commands, and outputs a read control signal RDZ, a write control signal WRZ (access signal), and read/write control signals RWZ and RWIZ (access signals). The read control signal RDZ and the write control signal WRZ (high level) are output when a read command and a write command are supplied, respectively. The read/write control signals RWZ and RWIZ (high level) are output when the read command and the write command are supplied. The read/write control signal RWIZ is output earlier than the read/write control signal RWZ.

The refresh timer 12 outputs a refresh request signal REFI0Z (refresh command) at predetermined cycles. The refresh request signal REFI0Z is generated at cycles such that memory cells MC can be refreshed in succession without losing the data retained in the memory cells MC. For example, the cycle of generation of the refresh request signal REFI0Z is set so that all the memory cells MC are refreshed once within 64 ms. Specifically, when there are arranged 2048 word lines WL to be selected in succession by respective refresh requests, the refresh request signal REFI0Z is generated at every 31 µs.

The refresh control circuit 14 outputs a refresh signal REFSZ (first refresh signal) and a refresh signal REFZ (second refresh signal) in accordance with the read/write control signals RWZ and RWIZ and the refresh request signal REFI0Z. The refresh counter 16 makes a count operation a certain period after the rising edge of the refresh signal REFZ, and outputs a refresh address signal RAZ successively.

The refresh address input circuit 18 outputs the refresh address signal RAZ as a refresh address signal REFAD. The external address input circuit 20 receives an address signal ADD through an address terminal, and outputs the received signal as a row address signal RAD (upper address) and a column address signal CAD (lower address). Note that the pseudo SRAM is a memory of address non-multiplex type which receives the upper address and the lower address simultaneously.

The switch circuit 22 outputs the refresh address signal REFAD as an internal row address signal IRAD when the refresh signal REFZ or REFSZ is at high level. The switch circuit 22 outputs the row address signal RAD as the row address signal IRAD when the refresh signals REFZ and REFSZ both are at low level.

The data input/output circuit 24 receives read data through a common data bus CDB, and outputs the received data to a data terminal DQ. The data input/output circuit 24 receives write data through the data terminal DQ, and outputs the received data to the common data bus CDB. The number of bits of the data terminal DQ is 16 bits, for example.

The core control circuit 26 has first and second timing control circuits 30 and 32, and an OR circuit 34.

The first timing control circuit 30 outputs a first word timing signal TWX1 in synchronization with the read/write control signal RWZ and the refresh signal REFZ. The second timing control circuit 32 outputs a second word timing signal TWX2 in synchronization with the refresh signal REFSZ. The OR circuit 34 outputs the first or second word timing signal TWX1 or TWX2 as a word timing signal TWZ.

Incidentally, the core control circuit 26 has a sense amplifier control circuit and a precharge control circuit which are not shown. When the sense amplifier control circuit receives any of the read/write control signal RWZ and the refresh signals REFZ and REFSZ, it outputs a sense amplifier activation signal LEZ for activating the sense amplifiers of a sense amplifier part SA to be described later. The precharge control circuit outputs a bit line reset signal BRS when bit lines BL and /BL are not in use.

The memory core 28 has a memory cell array ARY, a word decoder part WDEC, the sense amplifier part SA, a column decoder part CDEC, a sense buffer part SB, and a write amplifier part WA. The memory cell array ARY has a plurality of volatile memory cells MC (dynamic memory cells), and a plurality of word lines WL and a plurality of bit lines BL and /BL which are connected to the memory cells MC. The memory cells MC are the same as typical DRAM memory cells, each having a capacitor for retaining data in the form of a charge and a transfer transistor arranged between this capacitor and a bit line BL (or /BL). The gate of the transfer transistor is connected to a word line WL. Through the selection of the word lines WL, any one of a read operation, a write operation, and a refresh operation is performed. The memory cell array ARY performs any one of the read operation, write operation, and refresh operation before performing a precharge operation for precharging the bit lines BL and /BL to a predetermined voltage in response to the bit line reset signal BRS.

When the word decoder part WDEC receives the word line control signal TWZ of high level, it selects any one of the word lines WL in accordance with the internal row address signal IRAD, and changes the selected word line WL to high level. The column decoder part CDEC outputs a column line signal for turning on column switches which connect respective bit lines BL and /BL and a data bus DB, in accordance with the column address signal CAD.

The sense amplifier part SA has a plurality of sense amplifiers. The sense amplifiers operate in response to the sense amplifier activation signal LEZ, and amplify data on the respective bit lines BL and /BL in signal quantity. The data amplified by the sense amplifiers is transmitted to the data bus DB through the column switches in a read operation. In a write operation, the data amplified by the sense amplifiers is written to the memory cells MC through the bit lines.

The sense buffer part SB amplifies the read data on the data bus DB in signal quantity, and outputs it to the common data bus CDB. The write amplifier part WA amplifies the write data on the common data bus CDB in signal quantity, and outputs it the data bus DB.

Figure 2:
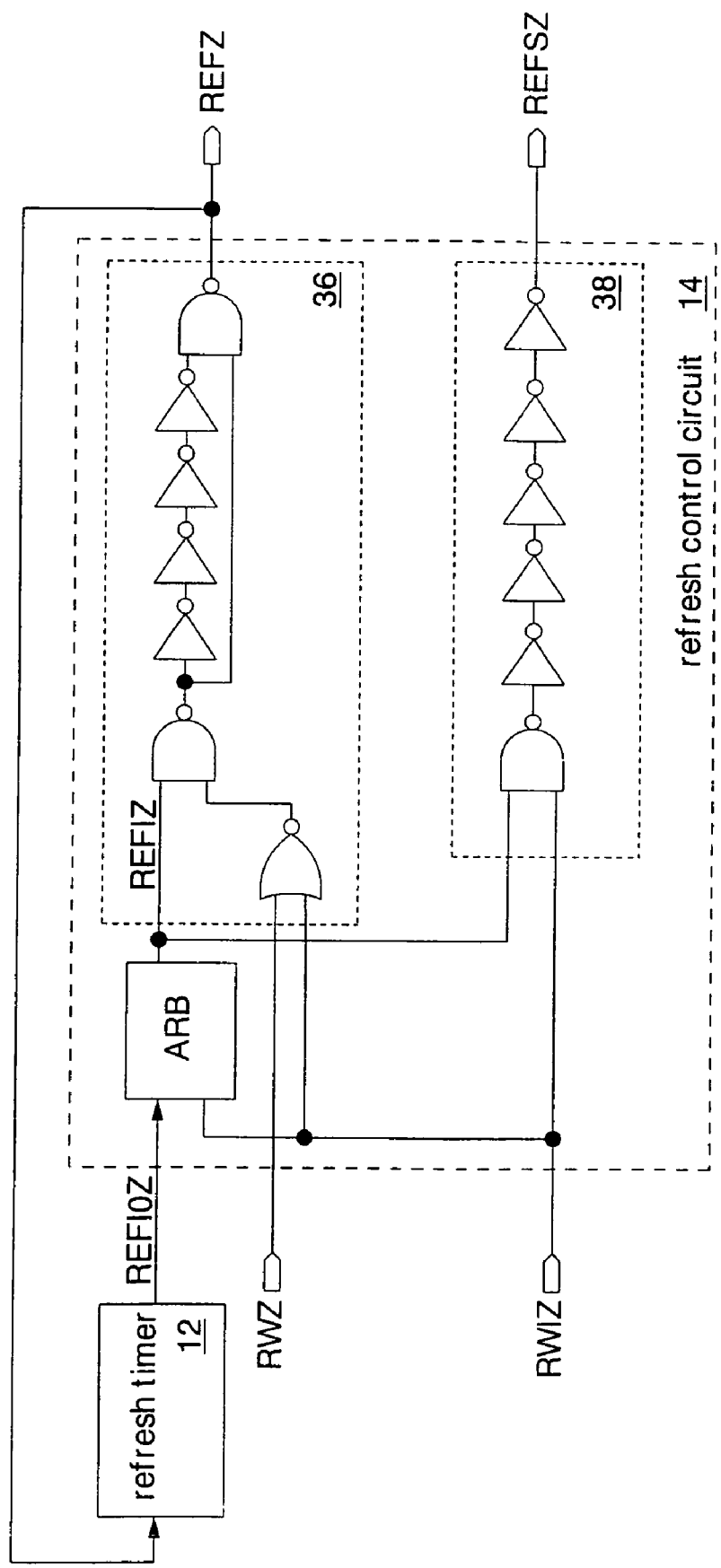
FIG. 2 is a block diagram showing the details of the refresh control circuit shown in FIG. 1.

FIG. 2 shows the details of the refresh control circuit 14 shown in FIG. 1.

The refresh control circuit 14 has an arbiter ARB for receiving the refresh request signal REFI0Z and the read/write control signal RWIZ and outputting a refresh request signal REFIZ, a first refresh generator 36 for generating the refresh signal REFZ, and a second refresh generator 38 for generating the refresh signal REFSZ.

When the arbiter ARB receives the refresh request signal REFI0Z with a predetermined time of delay after the read/write control signal RWIZ, it holds the refresh request signal REFI0Z temporarily, and outputs the refresh request signal REFI0Z as the refresh request signal REFIZ after the output of the read/write control signal RWIZ.

The first refresh generator 36 outputs the refresh signal REFZ of high level in response to the refresh request signal REFIZ of high level when the read/write control signals RWZ and RWIZ both are at low level. The second refresh generator 38 outputs the refresh signal REFSZ of high level in response to the refresh request signal REFIZ of high level when the read/write control signal RWIZ is at high level.

Figure 3:
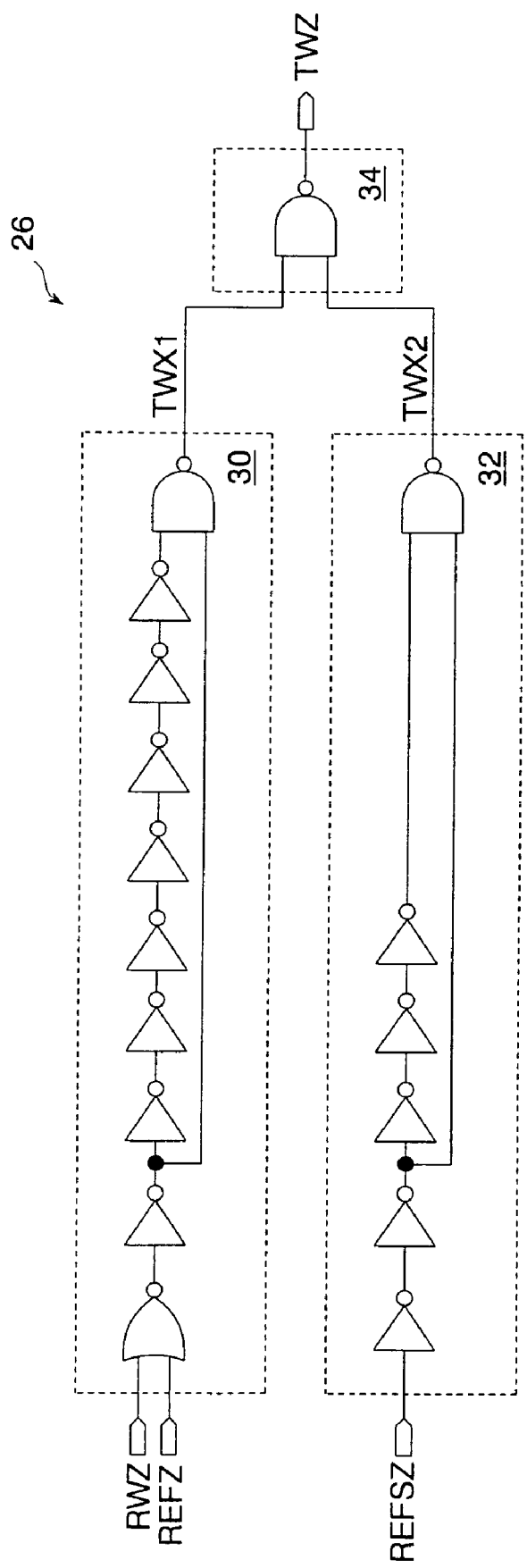
FIG. 3 is a circuit diagram showing the details of essential parts of the core control circuit shown in FIG. 1.

FIG. 3 shows the details of essential parts of the core control circuit 26 shown in FIG. 1.

The first timing control circuit 30 outputs the first word timing signal TWX1 having a predetermined pulse width (a pulse of low level) in synchronization with the rising edge of the read/write control signal RWZ or the refresh signal REFZ. The second timing control circuit 32 outputs the second word timing signal TWX2 having a predetermined pulse width (a pulse of low level) in synchronization with the rising edge of the refresh signal REFSZ. The OR circuit 34, as mentioned above, outputs the first or second word timing signal TWX1 or TWX2 as the word timing signal TWZ.

Figure 4:
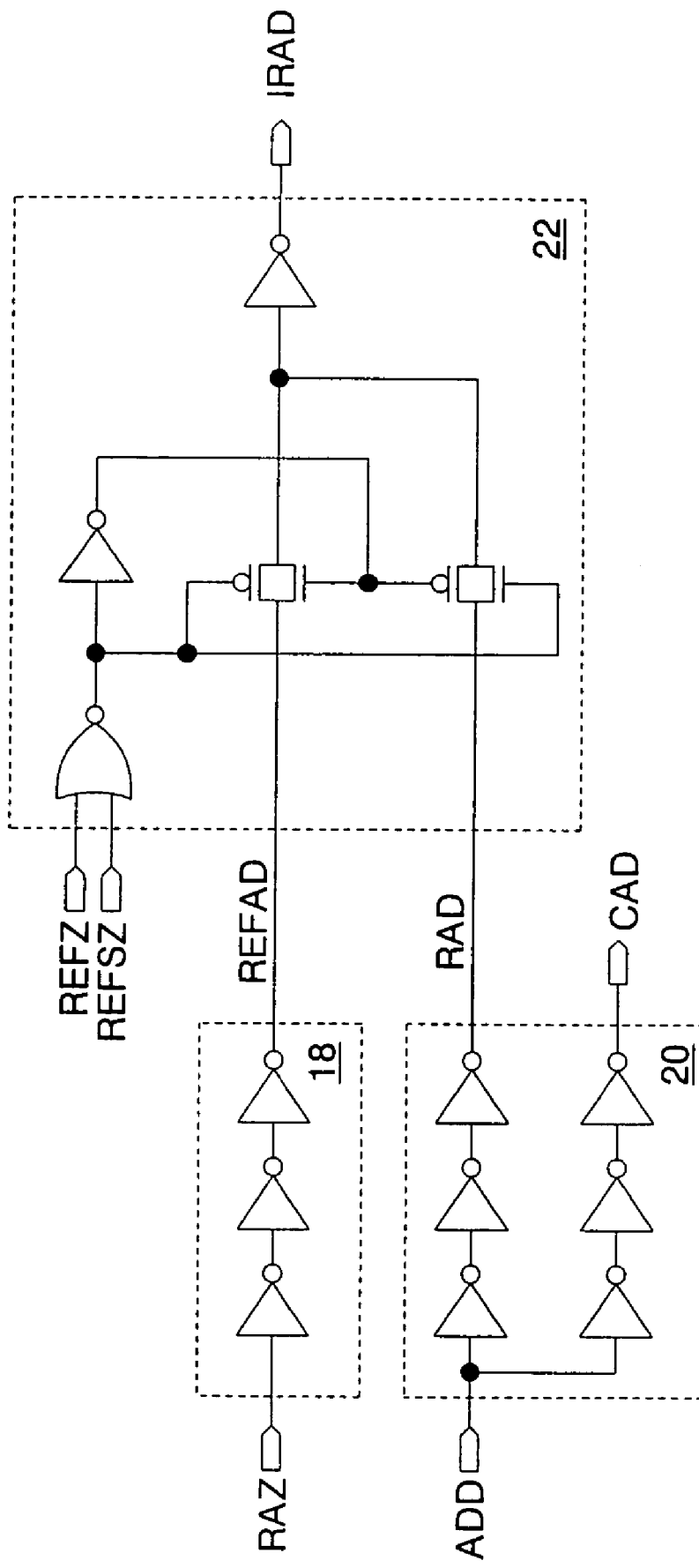
FIG. 4 is a circuit diagram showing the details of the refresh address input circuit, the external address input circuit, and the switch circuit shown in FIG. 1.

FIG. 4 shows the details of the refresh address input circuit 18, the external address input circuit 20, and the switch circuit 22 shown in FIG. 1. Incidentally, the circuits shown in FIG. 4 are ones corresponding to 1-bit address signals. In fact, there are a number of circuits corresponding to the numbers of bits of the address signals.

The refresh address input circuit 18 is composed of an odd number of stages of inverters. The refresh address input circuit 18 inverts the refresh address signal RAZ and outputs it as the refresh address signal REFAD. The external address input circuit 20 has two buffer circuits each composed of an odd number of stages of inverters. The buffer circuits output the address signal ADD as the row address signal RAD and the column address signal CAD, respectively.

The switch circuit 22 outputs the inverted logic of the refresh address signal REFAD as the internal row address signal IRAD when the refresh signal REFZ or REFSZ is at high level. The switch circuit 22 outputs the inverted logic of the row address signal RAD as the row address signal IRAD when the refresh signal REFZ or REFZ is at low level.

Figure 5:
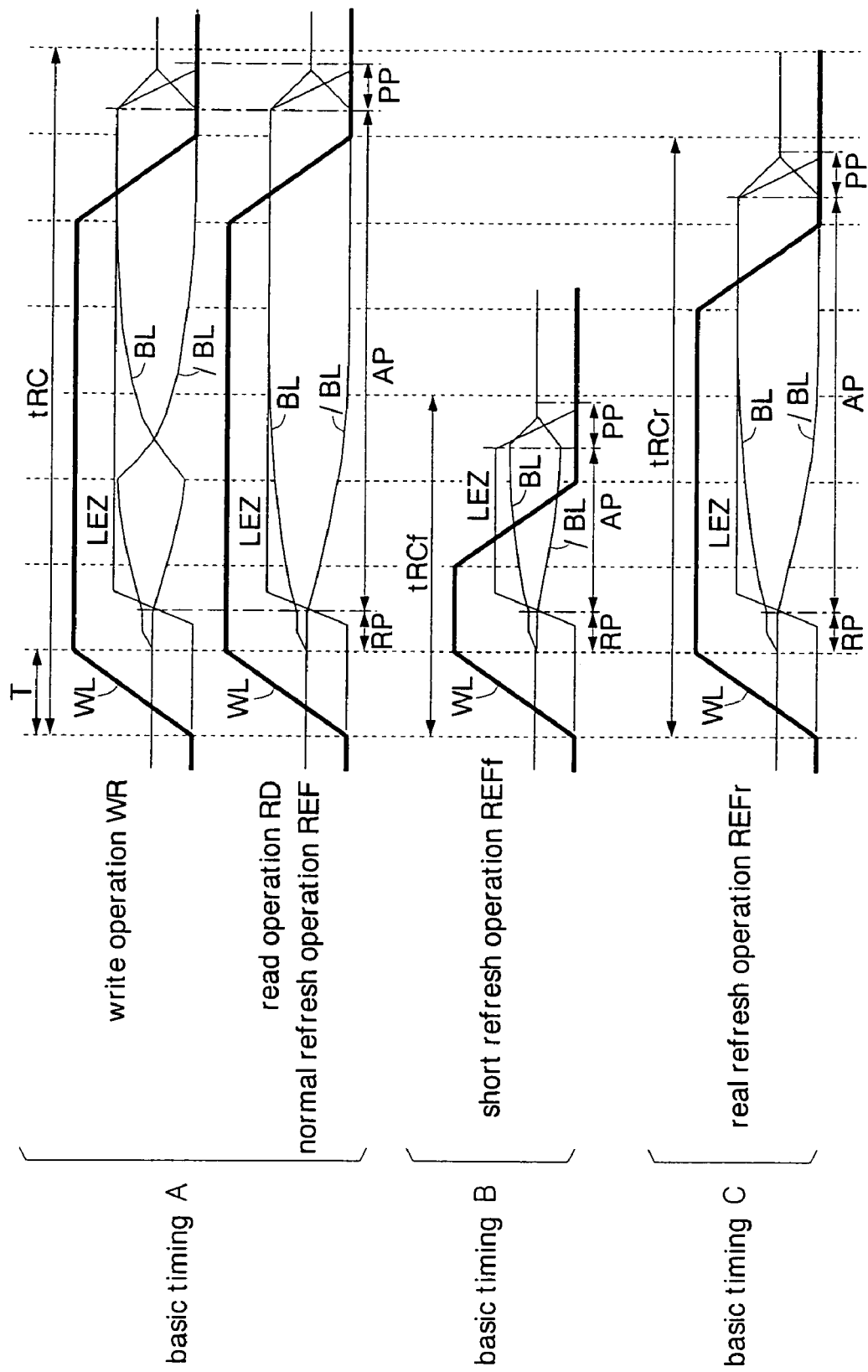
FIG. 5 is a timing chart showing the basic operation of the memory cell array according to the first embodiment.

FIG. 5 shows the basic operation of the memory cell array ARY according to the first embodiment.

In this embodiment, the memory cell array ARY operates in accordance with either one of two basic timings A and B. The basic timings A and B both consist of a read stage RP, an amplifying stage AP, and a precharging stage PP. The read stage RP is a period in which data is read to the bit lines BL (or /BL) from memory cells MC that are selected in response to the activation (selection) of a word line WL.

The amplifying stage AP is a period in which, after the data is read to the bit lines BL (or /BL), the sense amplifiers are activated in response to the sense amplifier activation signal LEZ to amplify the voltage differences (data) between the bit lines BL and /BL, and the amplified voltages of the bit lines BL and /BL are rewritten to the memory cells MC from which the data is read. The precharging stage PP is a period in which the word lines WL are inactivated (deselected) and the bit lines BL and /BL are precharged to a predetermined voltage.

A write operation WR, a read operation RD, and a normal refresh operation REF (second refresh operation) are performed by using the basic timing A. That is, the execution time of the normal refresh operation REF is the same as the execution time of the write operation WR and the read operation RD. The word lines WL are activated for a period (7T) seven times as long as a basic time T. Here, the cycle time tRC is as long as a period of 8T. In the write operation WR, the data that is read from the memory cells MC and amplified on the bit lines BL and /BL must be inverted by write data. The cycle time tRC in the write operation WR is thus the longest. For the read operation RD, the same basic timing as that of the write operation WR is used in view of user convenience.

In the normal refresh operation REF, the bit lines BL and /BL need not be connected with the data bus DB, nor need the data be inverted on the bit lines BL and /BL. For this reason, the data retained in the memory cells MC can be fully written to the memory cells MC again even if the activation period of the word lines WL is set to a period of 6T (a real refresh operation REFr shown by the basic timing C of FIG. 5). Nevertheless, in this embodiment, the same basic timing as that of the write operation WR is used for the normal refresh operation REF for the sake of simplifying the configuration of the core control circuit 26. The refresh operation REF is performed when the refresh signal REFZ is output.

Since the data is fully written to the memory cells MC by the refresh operation REF, each memory cell MC has a data retention time (pause time) of 64 ms or more.

Incidentally, the cycle time tRC of the refresh operation REFr using the basic timing C is the same as the cycle time of the refresh operation described in the conventional technique, or the period of 7T.

A short refresh operation REFf (first refresh operation) is performed by using the basic timing B. Here, the short refresh operation REFf is used to perform a refresh operation for a minimum period when a conflict occurs between an access request (the read command or the write command) and a refresh request. After the short refresh operation REFf, the access operation (the read operation RD or the write operation WR) can be performed immediately to reduce the access time. In the short refresh operation REFf, the activation period of the word lines WL is set to a period of 3T. The cycle time tRCf of the short refresh operation REFf is as long as a period of 4T.

The short refresh operation REFf will not amplify the voltage differences between the bit lines BL and /BL sufficiently because the activation period of the sense amplifiers (the high level period of the LEZ signal) is short. Since the data rewritten to the memory cells MC is small in signal quantity (restore level), a normal refresh operation REF using the basic timing A must be performed again within, e.g., 200 ns after the short refresh operation REFf. In other words, when it is possible to perform a normal refresh operation REF within 200 ns, the short refresh operation REFf can be temporarily performed to avoid loss of data in the memory cells MC. As above, the execution time of the short refresh operation REFf (the time for amplifying and rewriting data) is such a time that the data in the memory cells MC can be retained without loss during the period from the execution of the short refresh operation REFf to the execution of the normal refresh operation REF.

The difference between the cycle times of the basic timings A and B occurs from a time difference between the amplifying stages AP which correspond to the activation times of the sense amplifiers. The times of the read stages RP and the precharging stages PP in the basic timings A and B are identical.

Figure 6:
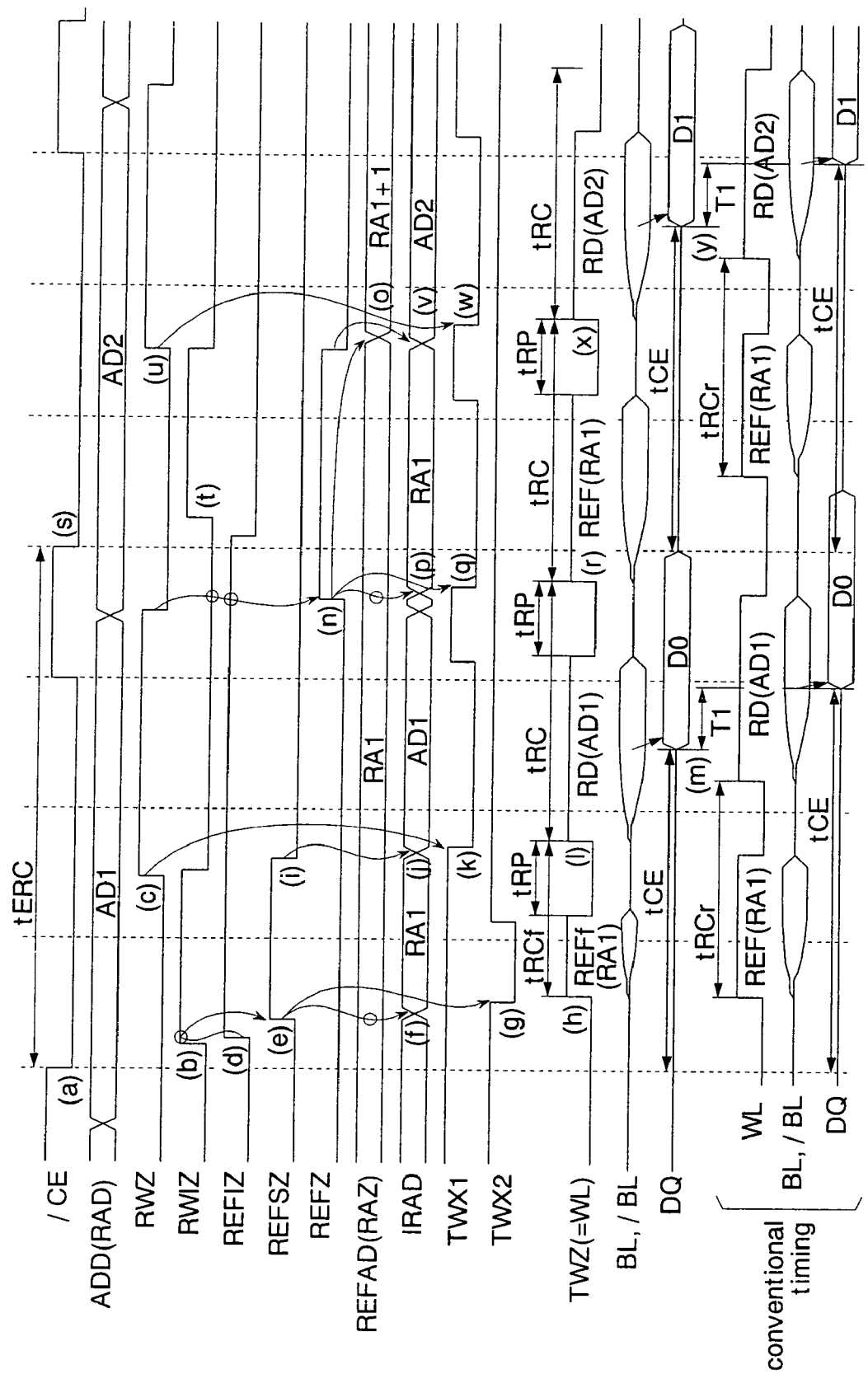
FIG. 6 is a timing chart showing an example of operation of the first embodiment.

FIG. 6 shows the operation of the pseudo SRAM according to the first embodiment.

In this example, two read operations RD are performed in succession, and the first read command and the refresh request signal REFI0Z occur almost at the same time.

Initially, the command control circuit 10 shown in FIG. 1 receives the chip enable signal /CE of low level, and the output enable signal /OE of low level and the write enable signal /WE of high level which are not shown, and detects that a read command (read access request) is supplied (FIG. 6(a)). In response to the read command, the command control circuit 10 outputs the read/write control signal RWIZ and the read/write control signal RWZ (FIG. 6(b, c)). The read/write control signal RWZ is output before the read/write control signal RWIZ changes to low level.

The refresh timer 12 shown in FIG. 2 outputs the refresh request signal REFI0Z almost at the same time as the supply of the read command. The arbiter ARB of the refresh control circuit 14 outputs the refresh request signal REFIZ in response to the refresh request signal REFI0Z (FIG. 6(d)).

Since the refresh request signal REFIZ is generated during the high level period of the read/write control signal RWIZ, the second refresh generator 38 of the refresh control circuit 14 outputs the refresh signal REFSZ of high level (FIG. 6(e)). In response to the refresh signal REFSZ of high level, the switch circuit 22 shown in FIG. 4 outputs the refresh address signal RAZ (RA1) as the row address signal IRAD (FIG. 6(f)).

The second timing control circuit 32 shown in FIG. 3 outputs the second word timing signal TWX2 in synchronization with the refresh signal REFSZ (FIG. 6(g)). Due to the output of the second word timing signal TWX2, the word timing signal TWZ is output (FIG. 6(h)), and the short refresh operation REFf (first refresh operation) shown in FIG. 5 is performed.

Next, in response to the change of the read/write control signal RWIZ to low level, the second refresh generator 38 stops outputting the refresh signal REFSZ (FIG. 6(i)). In response to the refresh signal REFSZ of low level, the switch circuit 22 outputs the external address signal ADD (AD1) corresponding to the first read command as the row address signal IRAD (FIG. 6(j)).

The first timing control circuit 30 shown in FIG. 3 outputs the first word timing signal TWX1 in synchronization with the rising edge of the read/write control signal RWZ (FIG. 6(k)). Due to the output of the first word timing signal TWX1, the word timing signal TWZ is output (FIG. 6(l)), and the read operation RD shown in FIG. 5 is performed. Incidentally, the interval of output of the word timing signal TWZ is set to the precharge operation time tRP so that the precharge operation on the bit lines BL and /BL is performed properly. The read data D0 amplified on the bit lines BL and /BL by the read operation RD is output to the data terminal DQ through the common data bus CDB (FIG. 6(m)).

Since the short refresh operation REFf is performed in response to the refresh operation conflicting with the read request, the chip enable access time tCE from the falling edge of the chip enable signal /CE to the output of data from the data terminal DQ is reduced by time T1 as compared to heretofore.

Next, the first refresh generator 36 of the refresh control circuit 14 shown in FIG. 2 detects the low level of the read/write control signals RWZ and RWIZ, and outputs the refresh signal REFZ (FIG. 6(n)). The refresh counter 16 shown in FIG. 1 counts up to increment the refresh address signal RAZ by "1" a predetermined time after the rising edge of the refresh signal REFZ (FIG. 6(o)). In response to the refresh signal REFZ of high level, the switch circuit 22 outputs the same refresh address RAZ (RA1) as when performing the short refresh operation REFf, as the row address signal IRAD (FIG. 6(p)).

The first timing control circuit 30 outputs the first word timing signal TWX1 in synchronization with the refresh signal REFZ (FIG. 6(q)). Due to the output of the first word timing signal TWX1, the word timing signal TWZ is output (FIG. 6(r)), and the normal refresh operation REF (second refresh operation) shown in FIG. 5 is performed.

Incidentally, the read operation RD corresponding to the address AD1 is performed earlier than heretofore. Consequently, the normal refresh operation REF is also performed earlier than heretofore.

Next, the chip enable signal /CE of low level, and the output enable signal /OE of low level and the write enable signal /WE of high level which are not shown, are supplied again (FIG. 6(s)). In response to the read command, the command control circuit 10 outputs the read/write control signal RWIZ and the read/write control signal RWZ (FIG. 6(t, u)).

In synchronization with the falling edge of the refresh signal REFSZ, the switch circuit 22 outputs the external address signal ADD (AD2) corresponding to the second read command as the row address signal IRAD (FIG. 6(v)). The first timing control circuit 30 outputs the first word timing signal TWX1 in synchronization with the rising edge of the read/write control signal RWZ (FIG. 6(w)).

Due to the output of the first word timing signal TWX1, the word timing signal TWZ is output (FIG. 6(x)), and the read operation RD shown in FIG. 5 is performed. The read data D0 amplified on the bit lines BL and /BL by the read operation RD is output to the data terminal DQ through the common data bus CDB (FIG. 6(y)).

Because of the effect of the short refresh operation REFf, the read operation RD and the normal refresh operation REF are performed earlier than heretofore. Consequently, the read operation RD corresponding to the address AD2 is also performed earlier. As mentioned previously, the chip enable access time tCE is reduced by time T1 as compared to heretofore.

Incidentally, as shown in FIG. 6, this pseudo SRAM is designed so that the sum of the execution times of the short refresh operation REFf and the normal refresh operation REF and the execution times of two read operations RD is smaller than twice the minimum interval of supply of access requests, or the external access cycle time tERC. Consequently, the short refresh operation REFf, the normal refresh operation REF, and the two read operations RD can be performed during the two external access cycle times tERC. In the present invention, as described above, the short refresh operation REFf has a shorter execution time. It is therefore possible to reduce the external access cycle tERC as compared to heretofore.

Figure 7:
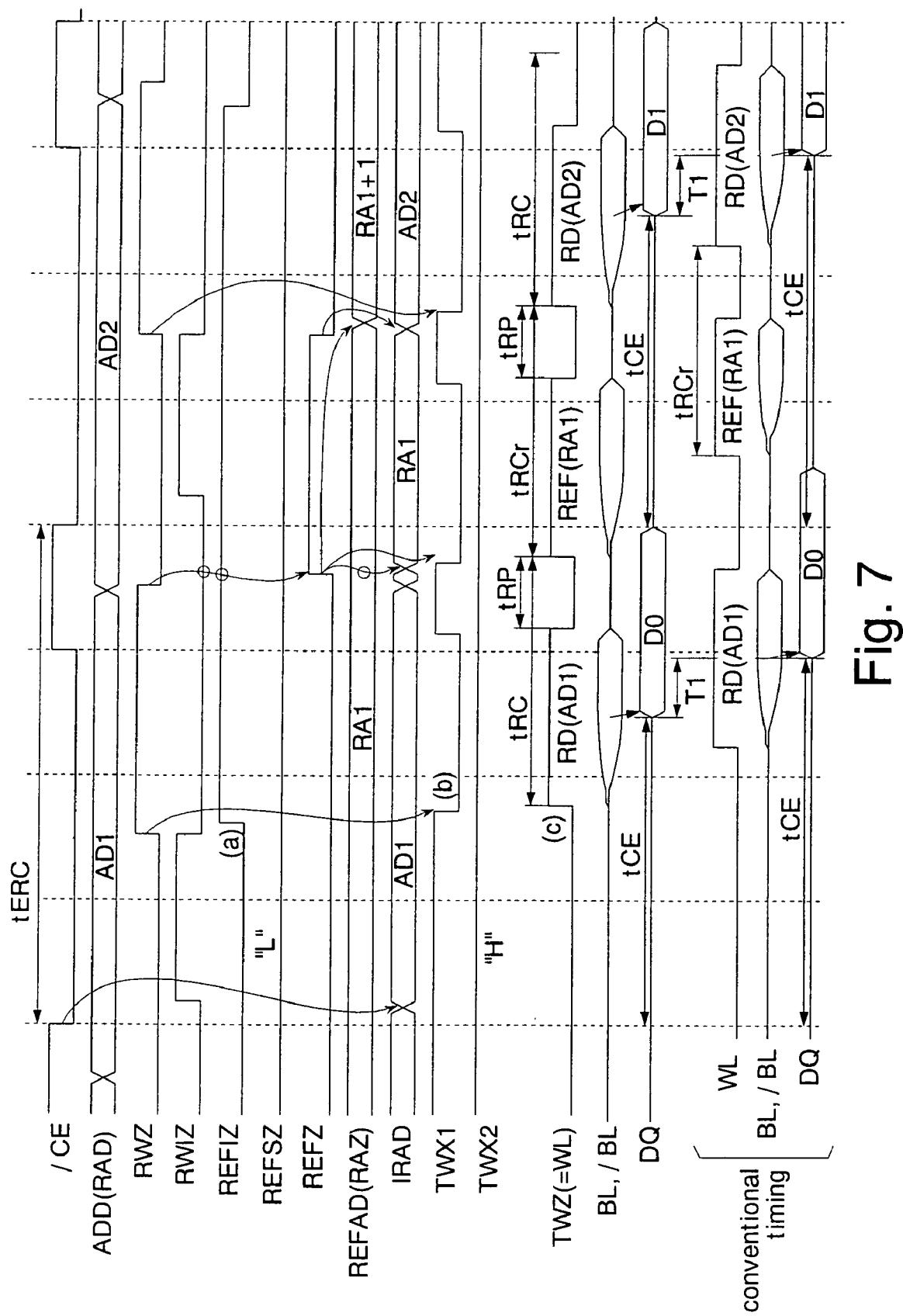
FIG. 7 is a timing chart showing another example of operation of the first embodiment.

FIG. 7 shows another operation of the pseudo SRAM according to the first embodiment. Detailed description will be omitted of the same operations as in FIG. 6.

In this example, two read operations RD are performed in succession, and the refresh request signal REFI0Z occurs after the supply of the first read command.

The arbiter ARB of the refresh control circuit 14 shown in FIG. 2 holds the refresh request signal REFI0Z temporarily, and outputs the refresh request signal REFI0Z as the refresh request signal REFIZ after the output of the read/write control signal RWIZ (FIG. 7(a)). The arbiter ARB delays the output of the refresh request signal REFIZ, thereby precluding the output of the refresh signal REFSZ from the second refresh generator 38. Since the refresh signal REFSZ is not output, no short refresh operation REFf is performed before the read operation. In this way, the output of the refresh signal REFSZ is masked when no conflict occurs between the access request and the refresh request. The short refresh operation REFf can thus be performed only when needed. As a result, it is possible to reduce the power consumption during operation.

Subsequently, as in FIG. 6, the first word timing signal TWX1 is output in synchronization with the rising edge of the read/write control signal RWZ (FIG. 7(b)), the word timing signal TWZ is output (FIG. 7(c)), and the read operation RD is performed. The timing after the read operation RD is the same as in FIG. 6. As in FIG. 6, the chip enable access time tCE in the read operation RD is reduced by time T1 as compared to heretofore.

Figure 8:
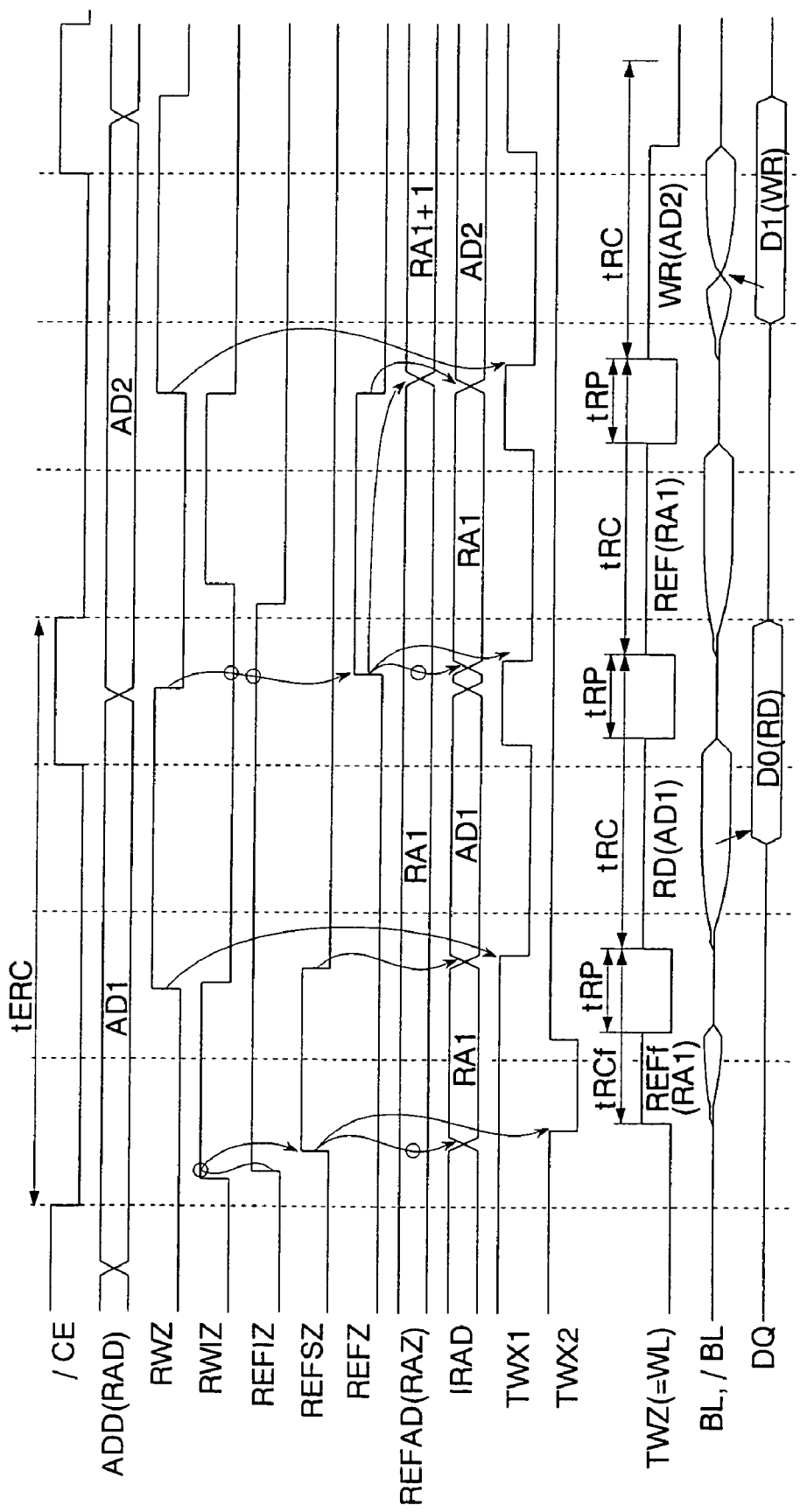
FIG. 8 is a timing chart showing another example of operation of the first embodiment.

FIG. 8 shows another operation of the pseudo SRAM according to the first embodiment. Detailed description will be omitted of the same operations as in FIG. 6.

In this example, a read operation RD and a write operation WR are performed in succession, and the read command and the refresh request signal REFI0Z occur almost at the same time. The timing shown in FIG. 8 is the same as in FIG. 6 except that the read operation RD corresponding to the address AD2 of FIG. 6 is replaced with the write operation WR. That is, even when read operations RD and write operations WR are performed repeatedly, the cycle time can be reduced as in FIG. 6.

As above, according to the present embodiment, the output of the refresh signal REFSZ is stopped to interrupt the short refresh operation REFf when a conflict occurs between an access request and the refresh request. The access operation corresponding to the access request can thus be started earlier. That is, it is possible to reduce the access time.

A normal refresh operation REF is always performed after a short refresh operation REFf. Thus, even if the short refresh operation REFf only rewrites the memory cells MC insufficiently, sufficient signal quantities of data are rewritten to the memory cells MC by the subsequent refresh operation REF.

Consequently, even if a conflict occurs between the access request and the refresh request and precedence is given to the access request, it is possible to retain the data in the memory cells MC with reliability. In particular, in the present embodiment, the access operation can be started even earlier because the execution time of the short refresh operation REFf is minimized.

Since the external address signal ADD (RAD) and the refresh address signal REFAD are switched by the refresh signals REFSZ and REFZ, the switch circuit 22 can be configured simply.

The execution times of the short refresh operation REFf and the normal refresh operation REF are adjusted solely by changing the time of the amplifying stage AP. The execution time of the short refresh operation REFf can thus be adjusted to a desired time easily. In addition, since the execution times of the refresh operations REFf and REF are adjusted by the amplifying stage AP alone, the operation control on the memory core 28 is simplified. This allows simple circuit configuration of the core control circuit 26.

When no conflict occurs between the access request and the refresh request, the short refresh operation REFf can be omitted to reduce the power consumption during operation.

Since the execution time of the short refresh operation REFf to be performed before the read operation RD and the write operations WR is set to a minimum, it is possible to reduce the external access cycle time tERC as compared to heretofore.

Since the execution time of the normal refresh operation REF is the same as the execution times of the read operation RD and the write operation WR, it is possible to share the control circuits for performing these operations. Specifically, the first timing control circuit 30 can be shared with a reduction in the circuit scale of the pseudo SRAM.

Figure 9:
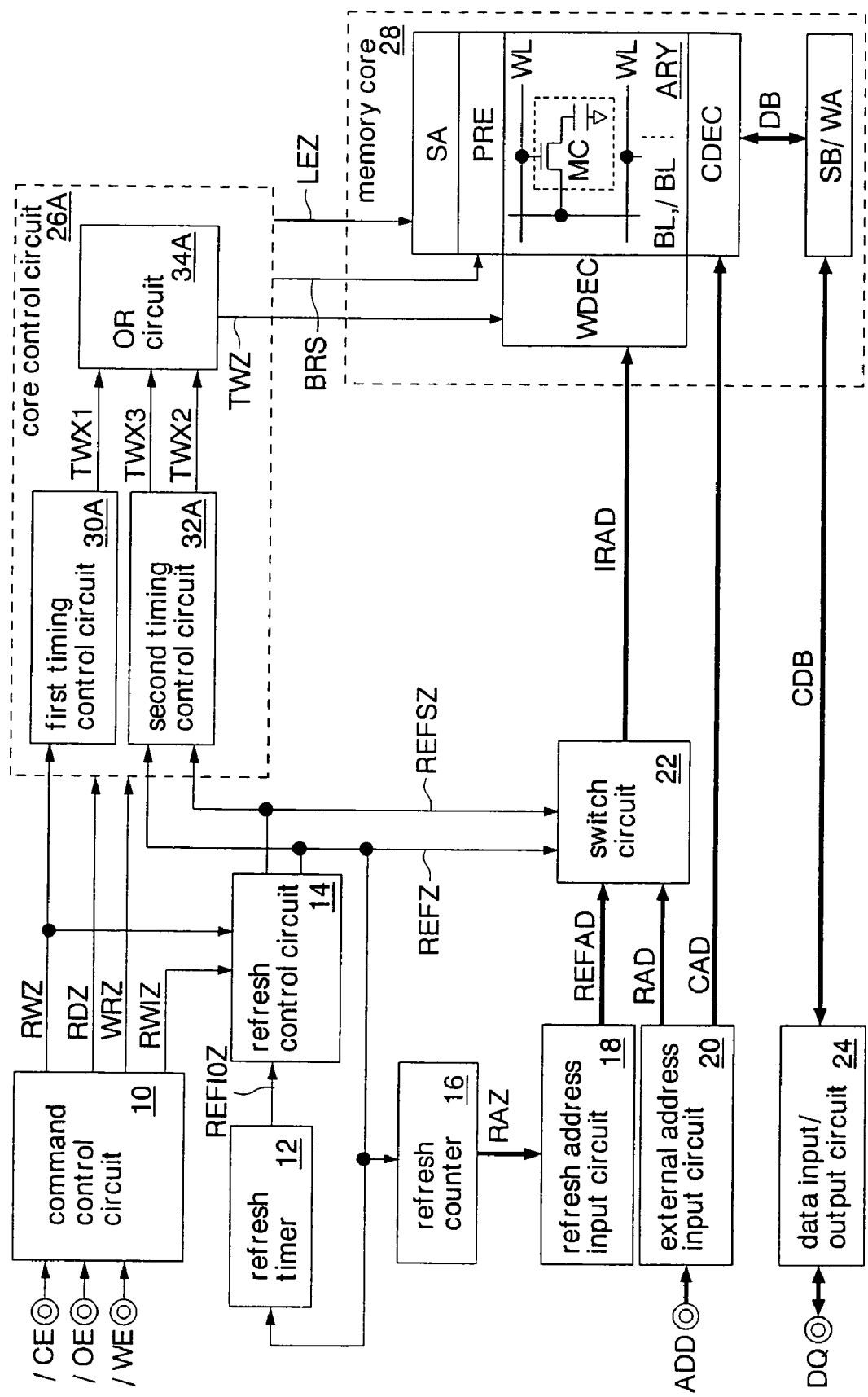
FIG. 9 is a block diagram showing a second embodiment of the semiconductor memory of the present invention.

FIG. 9 shows a second embodiment of the semiconductor memory of the present invention. The same elements as those described in the first embodiment will be designated by identical reference numbers or symbols. Detailed description thereof will be omitted.

In this embodiment, a core control circuit 26A is formed instead of the core control circuit 26 of the first embodiment. The rest of the configuration is the same as in the first embodiment. The core control circuit 26A has first and second timing control circuits 30A and 32A, and an OR circuit 34A.

The first timing control circuit 30A outputs a first word timing signal TWX1 in synchronization with the read/write control signal RWZ. The second timing control circuit 32A outputs a third word timing signal TWX3 and a second word timing signal TWX2 in synchronization with the refresh signals REFZ and REFSZ, respectively. The OR circuit 34A outputs the first, second, or third word timing signal TWX1, TWX2, or TWX3 as the word timing signal TWZ.

Incidentally, as in the first embodiment, the core control circuit 26A has a sense amplifier control circuit for outputting the sense amplifier activation signal LEZ and a precharge control circuit for outputting the bit line reset signal BRS.

Figure 10:
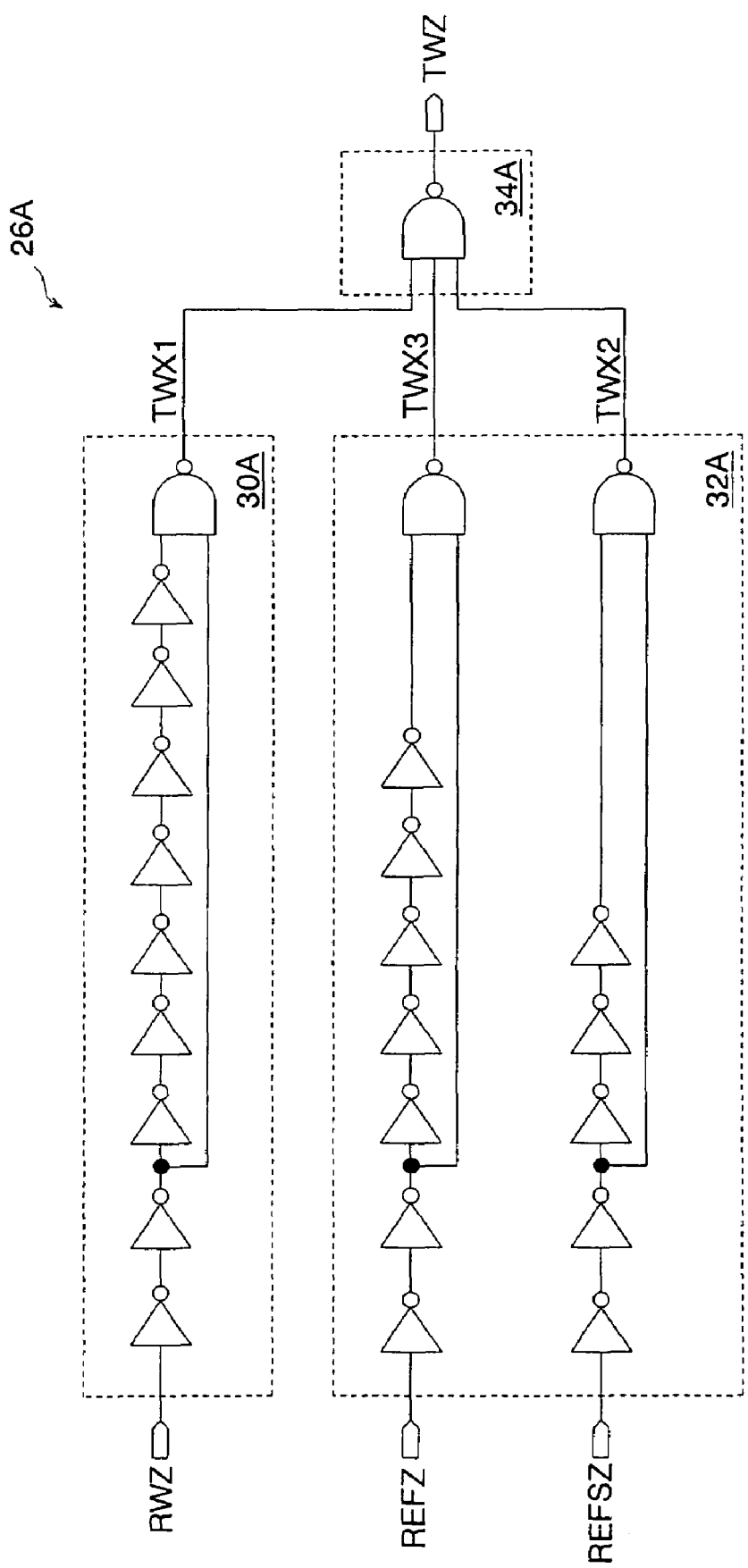
FIG. 10 is a circuit diagram showing the details of essential parts of the core control circuit shown in FIG. 9.

FIG. 10 shows the details of essential parts of the core control circuit 26A shown in FIG. 9.

The first timing control circuit 30A outputs the first word timing signal TWX1 having a predetermined pulse width (a pulse of low level) in synchronization with the rising edge of the read/write control signal RWZ. The second timing control circuit 32A outputs the third word timing signal TWX3 having a predetermined pulse width (a pulse of low level) in synchronization with the rising edge of the refresh signal REFZ. The second timing control circuit 32A also outputs the second word timing signal TWX2 having a predetermined pulse width (a pulse of low level) in synchronization with the rising edge of the refresh signal REFSZ. The pulse widths of the timing signals TWX1-3 are set in accordance with the numbers of stages of the inverter rows connected to the NAND gates. That is, in this embodiment, the descending order of the selection periods of the word lines WL is: the read operation RD and the write operation WR; the normal refresh operation REF; and the short refresh operation REFf. The OR circuit 34A outputs the timing signals TWX1, TWX2, and TWX3 as the word timing signal TWZ.

Figure 11:
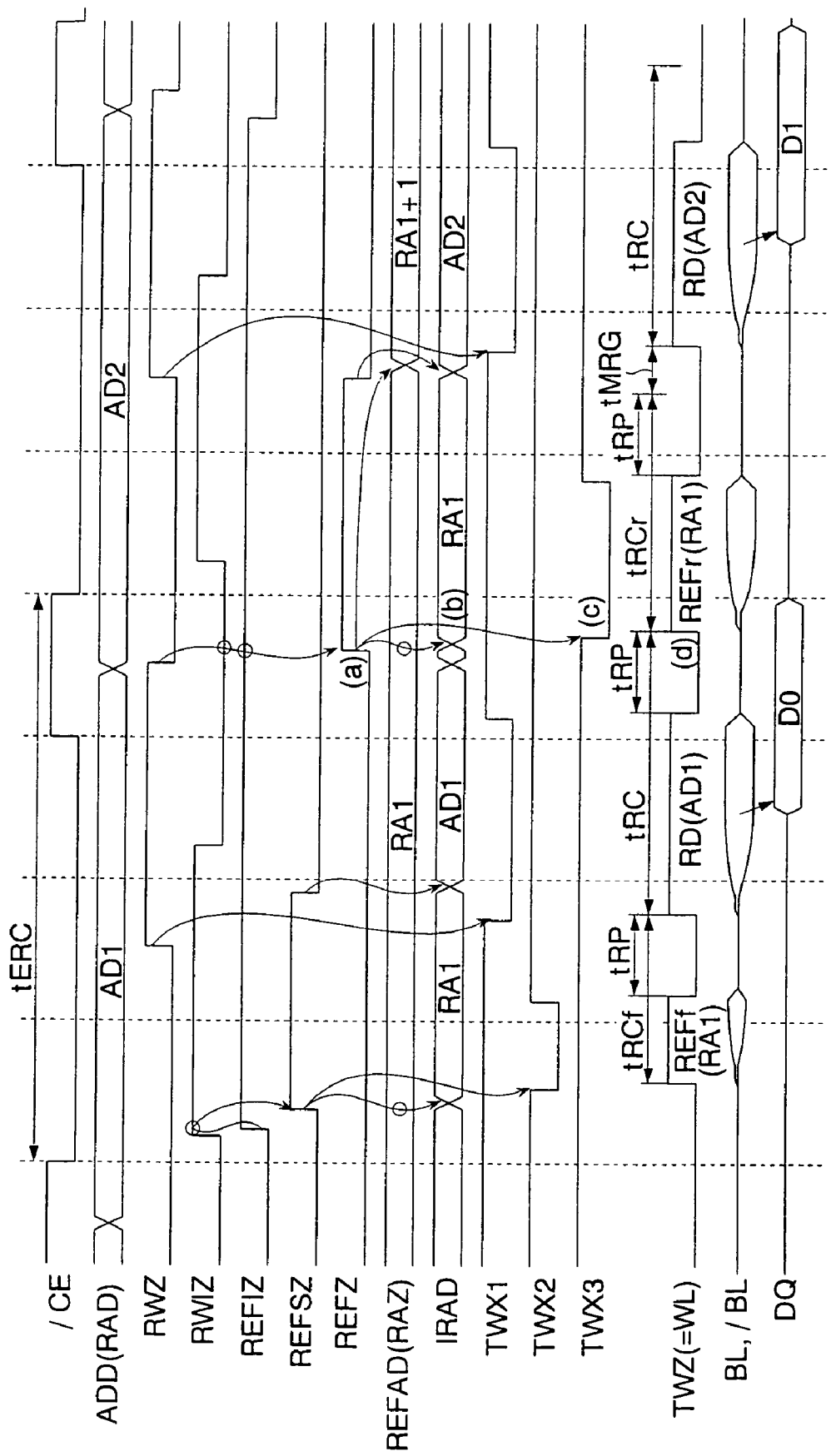
FIG. 11 is a timing chart showing an example of operation of the second embodiment.

FIG. 11 shows the operation of the pseudo SRAM according to the second embodiment. Detailed description will be omitted of the same operations as in the first embodiment (FIG. 6).

In this example, as in FIG. 6 of the first embodiment, two read operations RD are performed in succession and the first read command and the refresh request signal REFI0Z occur almost at the same time. The timing of the short refresh operation REFf and the first and second read operations RD is the same as in the first embodiment.

After the first read operation RD, the first refresh generator 36 of the refresh control circuit 14 (FIG. 2) detects the low level of the read/write control signals RWZ and RWIZ, and outputs the refresh signal REFZ (FIG. 11(a)). In response to the refresh signal REFZ of high level, the switch circuit 22 outputs the same refresh address RAZ (RA1) as when performing the short refresh operation REFf, as the row address signal IRAD (FIG. 11(b)).

The second timing control circuit 32A shown in FIG. 10 outputs the third word timing signal TWX3 in synchronization with the refresh signal REFZ (FIG. 11(c)). The pulse width of the third word timing signal TWX3 is smaller than that of the first word timing signal TWX1. The timing thereof corresponds to the basic timing C shown in FIG. 5. Due to the output of the third word timing signal TWX3, the word timing signal TWZ is output (FIG. 11(d)), and the real refresh operation REFr corresponding to the basic timing C is performed.

The real refresh operation REFr is performed in a cycle time tRCr which is shorter than the cycle time tRC of the first embodiment. Consequently, there arises a margin time tMRG in the period from the completion of the real refresh operation REFr to the start of the second read operation RD. The margin time tMRG allows an improvement to the operation margin of the internal circuits of the pseudo SRAM such as the core control circuit 26A. In other words, the timing design of the pseudo SRAM is facilitated.

Figure 12:
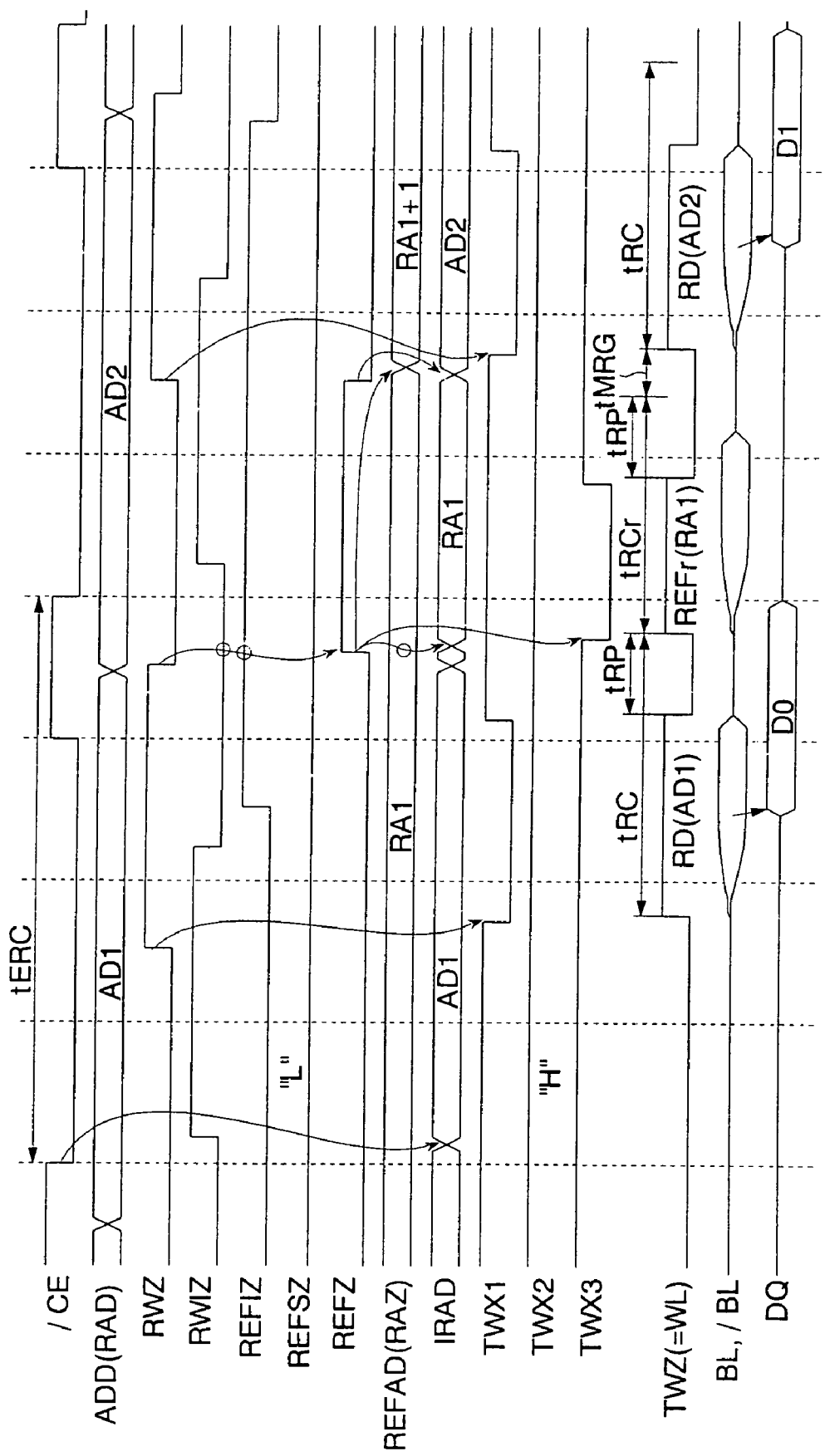
FIG. 12 is a timing chart showing another example of operation of the second embodiment.

FIG. 12 shows another operation of the pseudo SRAM according to the second embodiment. Detailed description will be omitted of the same operations as in FIGS. 6, 7, and 11 seen above.

In this example, two read operations RD are performed in succession, and the refresh request signal REFI0Z occurs after the supply of the first read command. The operations are the same as in the first embodiment (FIG. 7) except that the real refresh operation REFr is performed between the read operations RD.

As above, the second embodiment can provide the same effects as those of the first embodiment described above. Moreover, in this embodiment, the execution time of the normal refresh operation REF is shorter than the execution times of the write operation WR and the read operation RD. This produces a timing margin between the execution of the normal refresh operation and the execution of the next access operation RD or WR. Consequently, the core control circuit 26A and the like can be improved in operation margin, whereby the timing design of these circuits is facilitated.

Figure 13:
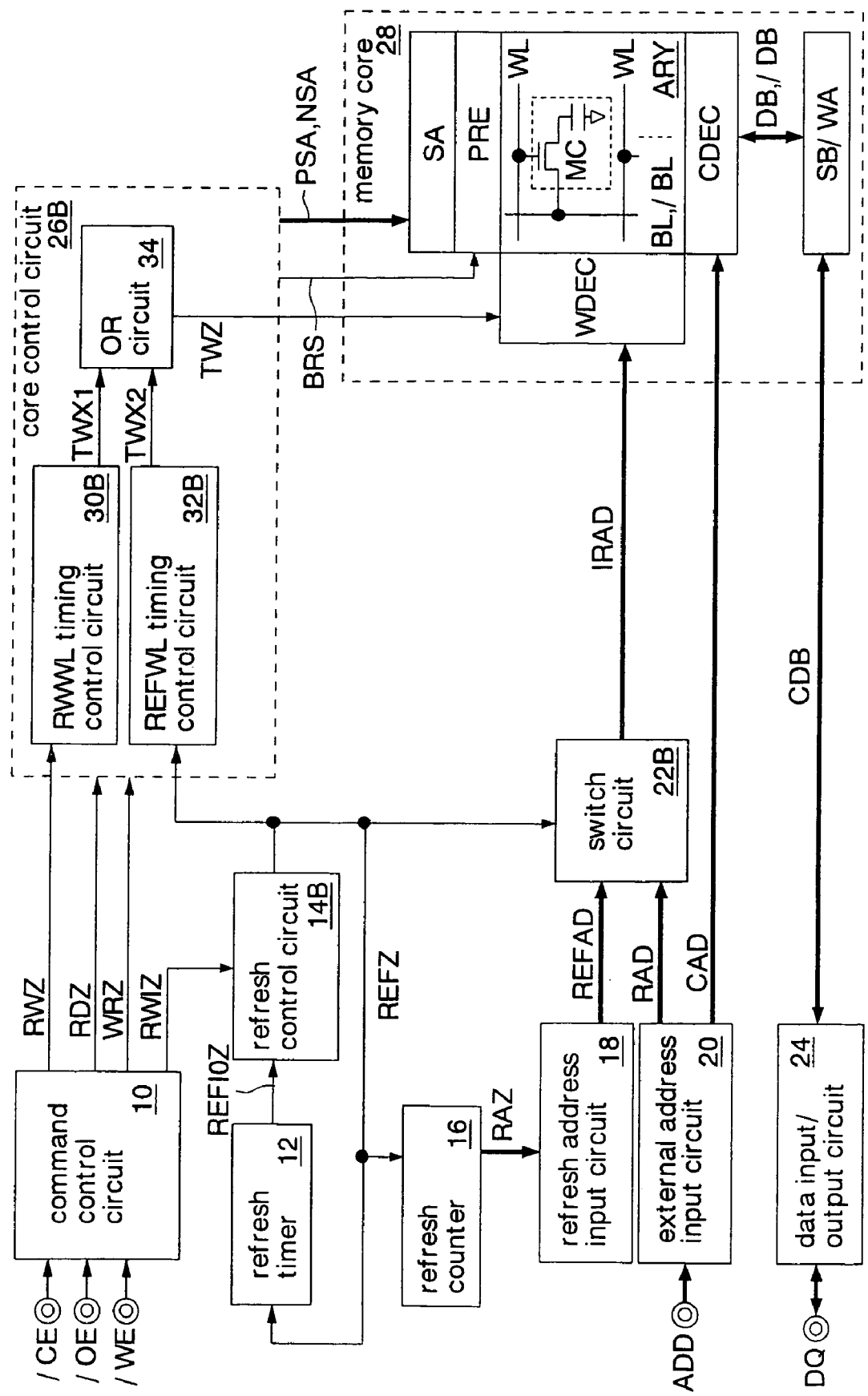
FIG. 13 is a block diagram showing a third embodiment of the semiconductor memory of the present invention.

FIG. 13 shows a third embodiment of the semiconductor memory of the present invention. The same elements as those described in the first embodiment will be designated by identical reference numbers or symbols. Detailed description thereof will be omitted.

In this embodiment, a refresh control part 14B, a switch circuit 22B, and a core control circuit 26B are formed instead of the refresh control part 14, the switch circuit 22, and the core control circuit 26 of the first embodiment. The rest of the configuration is the same as in the first embodiment.

The refresh control circuit 14B outputs the refresh signal REFZ (high level) in response to the read/write control signal RWIZ and the refresh request signal REFI0Z. The switch circuit 22B outputs the refresh address signal REFAD as the internal row address signal IRAD when the refresh signal REFZ is at high level. The switch circuit 22B outputs the row address signal RAD as the row address signal IRAD when the refresh signal REFZ is at low level. As will be described, the refresh signal REFZ is output not only in the normal refresh operation REF but also in the short refresh operation REFf.

The core control circuit 26B has first and second timing control circuits 30B and 32B, and an OR circuit 34. The first timing control circuit 30B outputs a first word timing signal TWX1 in synchronization with the read/write control signal RWZ. The second timing control circuit 32B outputs a second word timing signal TWX2 in synchronization with the refresh signal REFZ. The OR circuit 34 outputs the first or second word timing signal TWX1 or TWX2 as the word timing signal TWZ.

Figure 14:
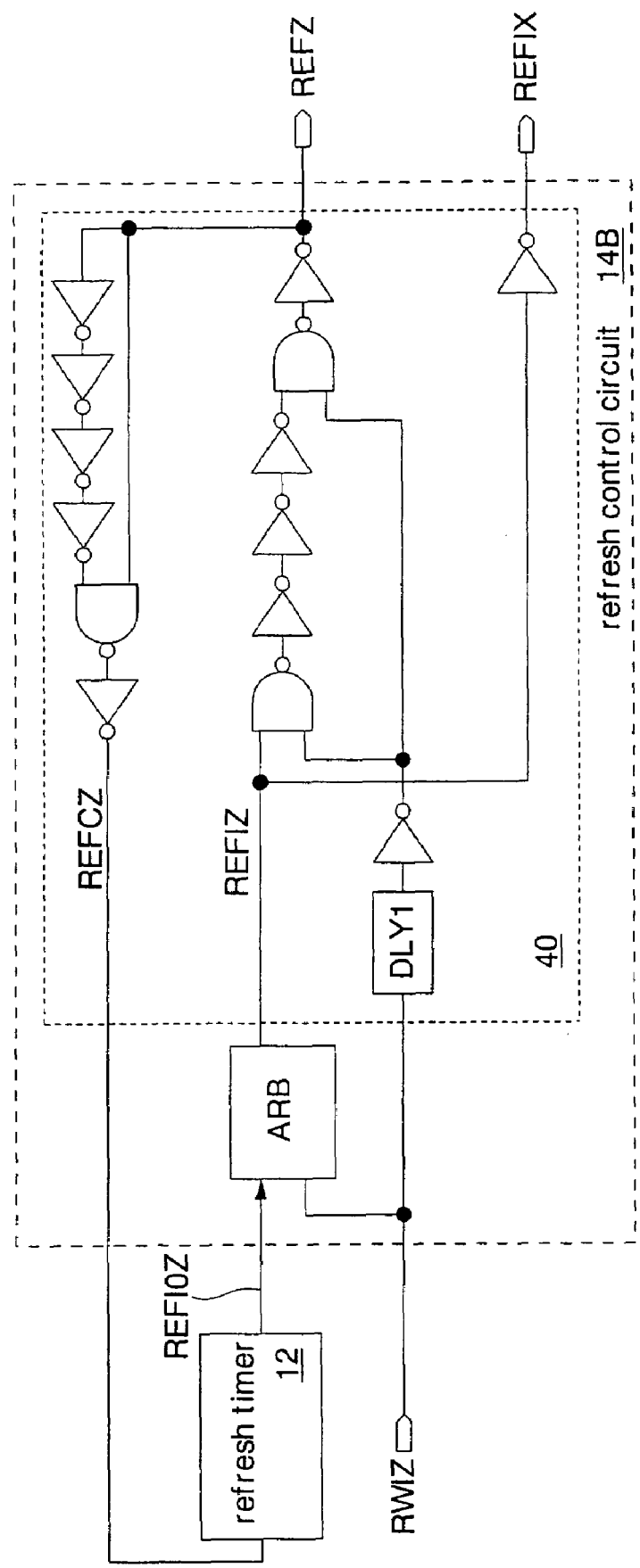
FIG. 14 is a block diagram showing the details of the refresh control circuit shown in FIG. 13.

FIG. 14 shows the details of the refresh control circuit 14B shown in FIG. 13.

The refresh control circuit 14B has a refresh generator 40 for generating the refresh signals REFZ and REFIX, and the same arbiter ARB as that of the first embodiment.

When the refresh request signal REFIZ is at high level, the refresh generator 40 changes the refresh signal REFZ to low level a first predetermined time after the rising edge of the read/write control signal RWIZ. The refresh generator 40 changes the refresh signal REFZ to high level a second predetermined time after the falling edge of the read/write control signal RWIZ. The first predetermined time is shorter than the second predetermined time. The first and second predetermined times are set by a delay circuit DLY1. For example, the delay circuit DLY1 is constituted by connecting an even number of inverters in series.

The refresh generator 40 also outputs a refresh count signal REFCZ when the pulse width of the refresh signal REFZ (a pulse of high level) is greater than or equal to a predetermined time. The refresh count signal REFCZ is fed back to the refresh timer 12.

Figure 15:
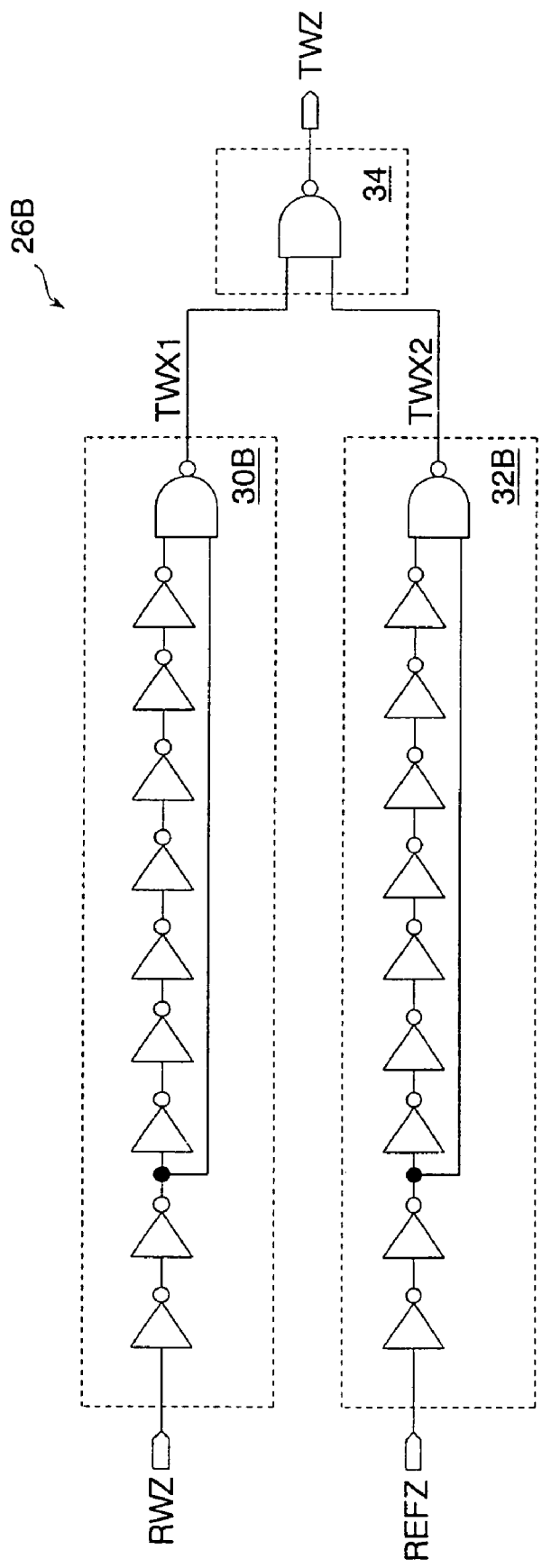
FIG. 15 is a circuit diagram showing the details of the core control circuit shown in FIG. 3.

FIG. 15 shows the details of essential parts of the core control circuit 26B shown in FIG. 13.

The first timing control circuit 30B outputs the first word timing signal TWX1 having a predetermined pulse width (a pulse of low level) in synchronization with the rising edge of the read/write control signal RWZ. The second timing control circuit 32B outputs the second word timing signal TWX2 having a predetermined pulse width (a pulse of low level) in synchronization with the rising edge of the refresh signal REFZ.

The pulse widths of the timing signals TWX1 and TWX2 are set in accordance with the numbers of stages of the inverter rows connected to the NAND gates. Here, the pulse width of the timing signal TWX2 coincides with the pulse width of the refresh signal REFZ when the refresh signal REFZ changes to low level in synchronization with the rising edge of the read/write control signal RWIZ (in a short refresh operation REFf). The OR circuit 34 outputs the timing signals TWX1 and TWX2 as the word timing signal TWZ.

In this embodiment, as in the first embodiment, the selection period of the word lines WL is unchanged in a read operation RD, a write operation WR, and a normal refresh operation, and is shorter in a short refresh operation REFf.

Figure 16:
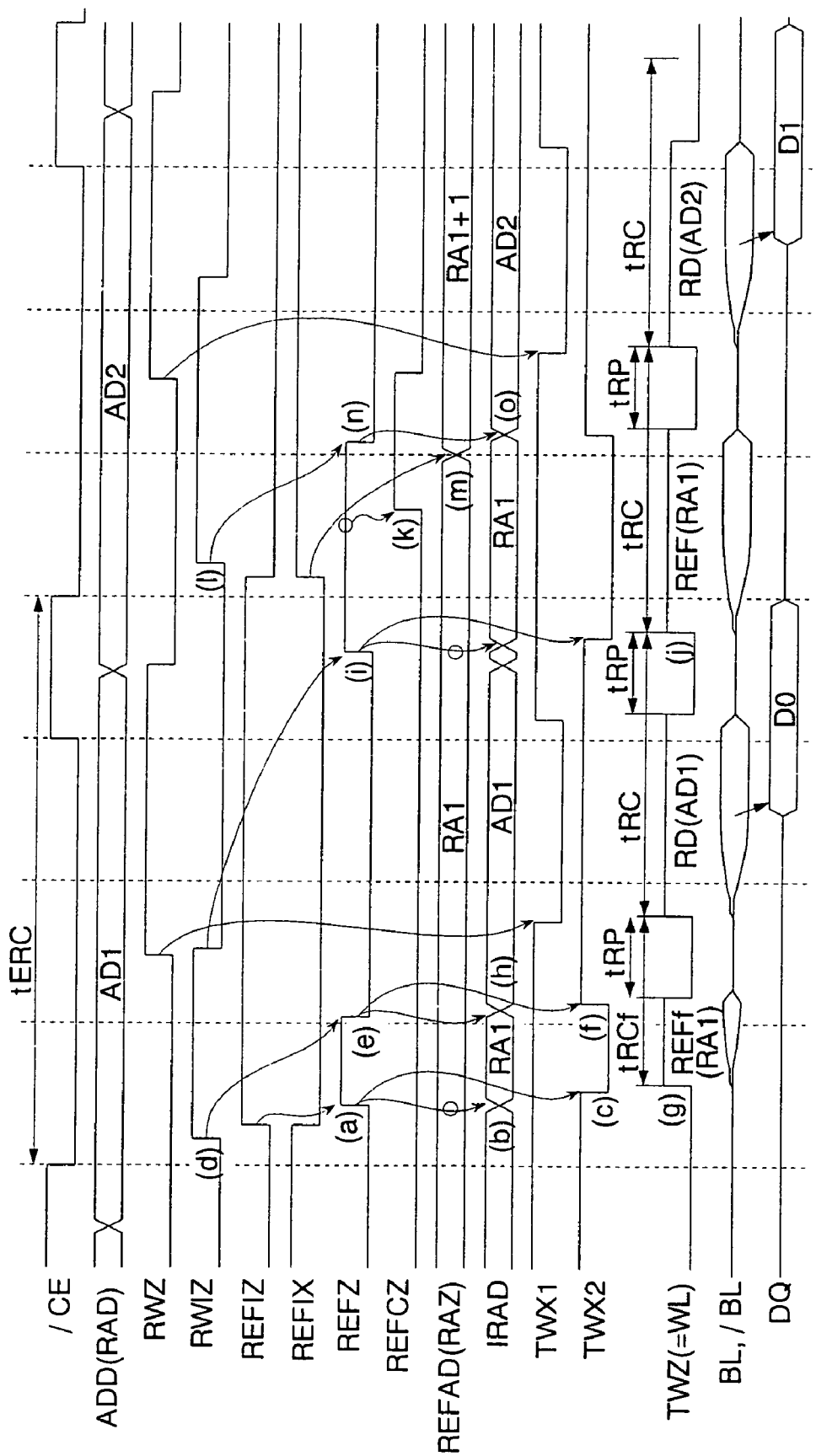
FIG. 16 is a timing chart showing an example of operation of the third embodiment.

FIG. 16 shows the operation of the pseudo SRAM according to the third embodiment. Detailed description will be omitted of the same operations as in the first embodiment (FIG. 6).

In this example, as in FIG. 6 of the first embodiment, two read operations RD are performed in succession, and the first read command and the refresh request signal REFI0Z occur almost at the same time. The timing of the short refresh operation REFf and the first and second read operations RD is the same as in the first embodiment. A difference lies in the circuit operation alone.

Initially, the refresh generator 40 of the refresh control circuit 14B shown in FIG. 14 changes the refresh signal REFZ to high level in synchronization with the rising edge of the refresh request signal REFIZ (FIG. 16(a)). In response to the refresh signal REFZ of high level, the switch circuit 22B outputs the refresh address signal RAZ (RA1) as the row address signal IRAD (FIG. 16(b)). The second timing control circuit 32B outputs the second word timing signal TWX2 in synchronization with the refresh signal REFZ (FIG. 16(c)).

In response to the supply of the read command, the read/write control signal RWIZ changes to high level (FIG. 16(d)). The refresh generator 40 changes the refresh signal REFZ to low level the first predetermined time after the rising edge of the read/write control signal RWIZ (FIG. 16(e)). In response to the change of the refresh signal REFZ to low level, the second timing control circuit 32B changes the second word timing signal TWX2 to high level (FIG. 16(f)). That is, the second word timing signal TWX2 having a pulse width corresponding to the short refresh operation REFf is generated.

The OR circuit 34 inverts the logical level of the second word timing signal TWX2, and outputs it as the word timing signal TWZ (FIG. 16(g)). Then, the short refresh operation REFf is performed. In response to the change of the refresh signal REFSZ to low level, the switch circuit 22B outputs the external address signal ADD (AD1) corresponding to the first read command as the row address signal IRAD (FIG. 16(h)).

Subsequently, the first read operation RD is performed as in the first embodiment (FIG. 6).

Next, the refresh generator 40 changes the refresh signal REFZ to high level the second predetermined time after the falling edge of the read/write control signal RWIZ that is generated in response to the first read command (FIG. 16(i)). Then, as in the first embodiment (FIG. 6), a normal refresh operation REF is started (FIG. 16(j)).

When the high level period of the refresh signal REFZ exceeds the predetermined period, the refresh generator 40 changes the refresh count signal REFCZ to high level in response (FIG. 16(k)). The refresh count signal REFCZ is fed back to the refresh timer 12.

In response to the change of the refresh request signal REFI0Z (REFIZ) to low level, the refresh generator 40 changes the refresh request signal REFIX to high level (FIG. 16(l)). The refresh counter 16 counts up to increment the refresh address signal RAZ by "1" a predetermined time after the rising edge of the refresh request signal REFIX (FIG. 16(m)).

The refresh generator 40 changes the refresh signal REFZ to low level the first predetermined time after the rising edge of the read/write control signal RWIZ that is generated in response to the second read command (FIG. 16(n)). Then, the normal refresh operation REF is completed. In response to the change of the refresh signal REFZ to low level, the switch circuit 22B outputs the external address signal ADD (AD2) corresponding to the second read command as the row address signal IRAD (FIG. 16(o)).

Subsequently, the second read operation RD is performed as in the first embodiment (FIG. 6).

Figure 17:
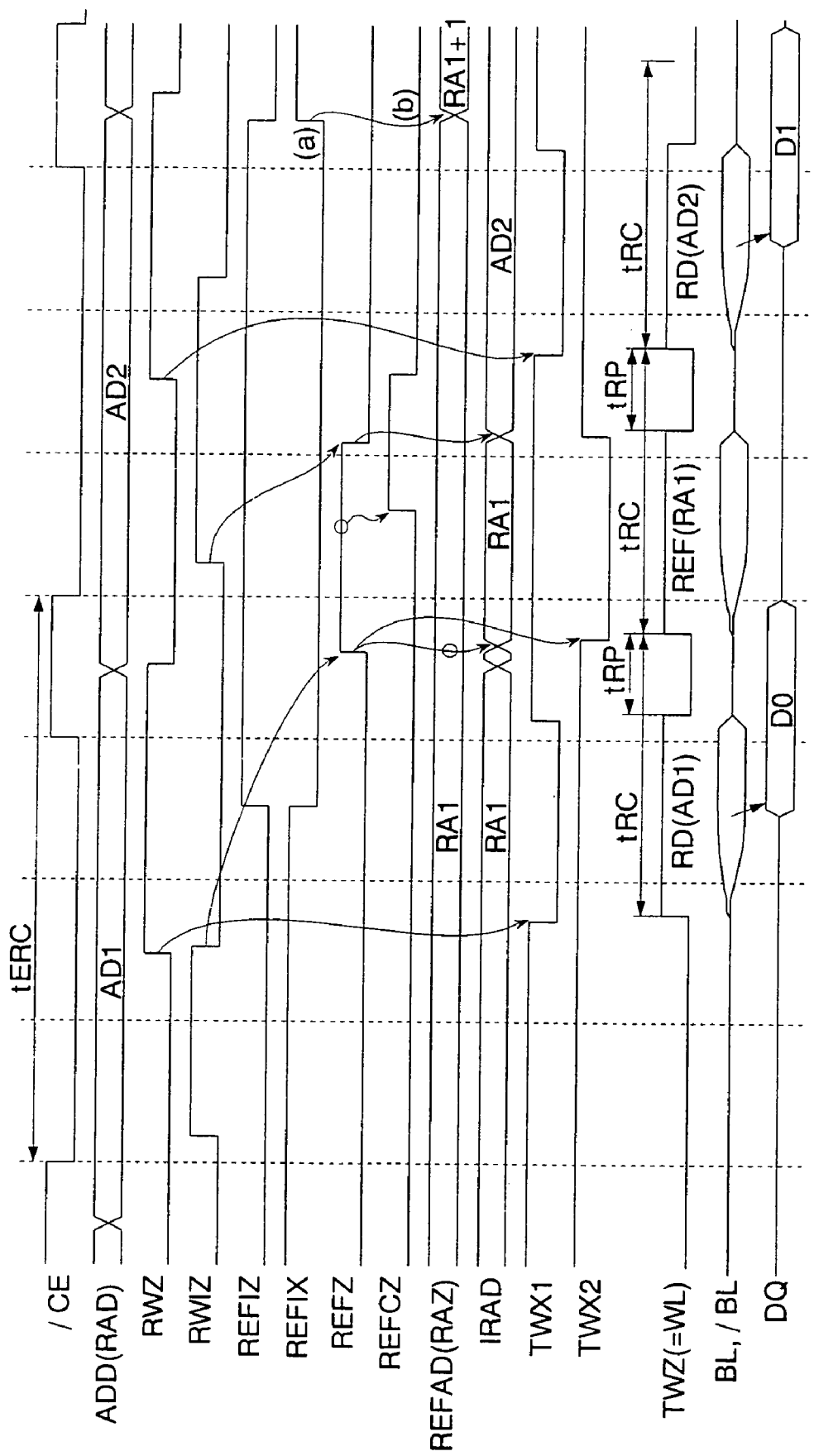
FIG. 17 is a timing chart showing another example of operation of the third embodiment.

FIG. 17 shows another operation of the pseudo SRAM according to the third embodiment. Detailed description will be omitted of the same operations as in FIGS. 6 and 7 seen above.

In this example, as in the first embodiment (FIG. 7), two read operations RD are performed in succession, and the refresh request signal REFI0Z occurs after the supply of the first read command. Thus, the short refresh operation REF will not be performed. The late occurrence of the refresh request signal REFI0Z also delays the rising edge of the refresh request signal REFIX (FIG. 17(a)). Consequently, the refresh counter 16 counts up after the second read operation RD (FIG. 17(b)). The rest of the operations are the same as in FIG. 16 seen above.

The third embodiment can provide the same effects as those of the first embodiment described above.

Figure 18:
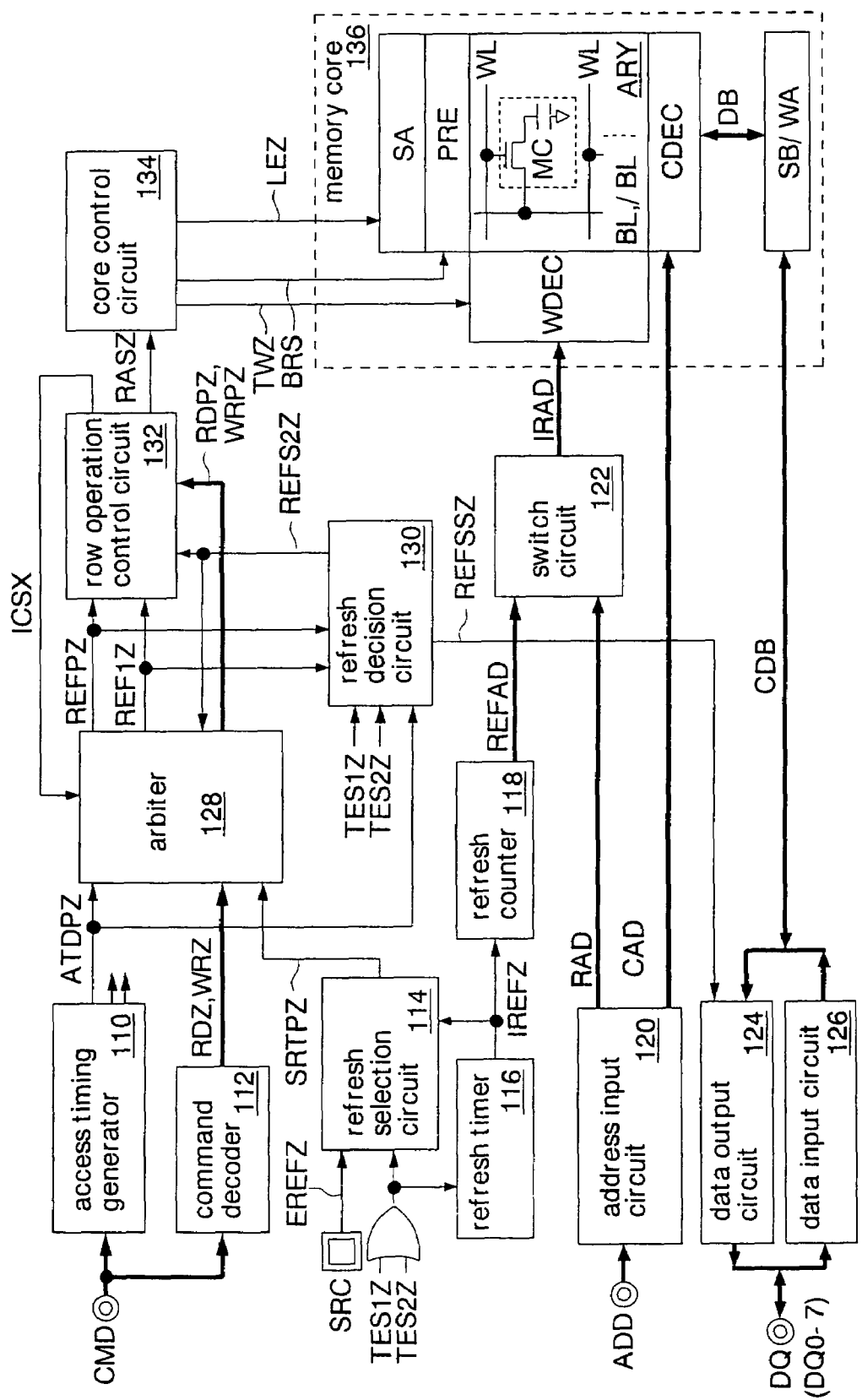
FIG. 18 is a block diagram showing a fourth embodiment of the semiconductor memory of the present invention.

FIG. 18 shows a fourth embodiment of the semiconductor memory of the present invention. The double square in the diagram represents a test pad. The test pad is not connected to any of the external terminals (lead frame etc.) of the product to be shipped. For example, the test pad is connected with a prober in a probing test, and receives test patterns. This semiconductor memory is formed as a pseudo SRAM which has DRAM memory cells (dynamic memory cells) and an SRAM interface. The pseudo SRAM performs periodic refresh operations inside the chip without receiving refresh commands from exterior, thereby retaining data written in its memory cells. This pseudo SRAM is used, for example, as a work memory to be mounted on a cellular phone.

The pseudo SRAM has an access timing generator 110, a command decoder 112, a refresh selection circuit 114, a refresh timer 116, a refresh counter 118, an address input circuit 120, a switch circuit 122, a data output circuit 124, a data input circuit 126, an arbiter 128, a refresh decision circuit 130, a row operation control circuit 132, a core control circuit 134, and a memory core 136.

The access timing generator 110 receives command signals CMD (including a chip enable signal /CE, an output enable signal /OE, and a write enable signal /WE) from exterior through a command terminal CMD, and outputs an access timing signal ATDPZ and the like for performing a read operation or a write operation.

The command decoder 112 decodes the command signals CMD, and outputs a read control signal RDZ for performing a read operation or a write control signal WRZ for performing a write operation.

The refresh selection circuit 114 outputs an internal refresh request IREFZ, which is output from the refresh timer 116, as a refresh timing signal SRTPZ in a normal operation mode. The refresh selection circuit 114 outputs a test refresh signal EREFZ, which is supplied from exterior of the pseudo SRAM through an external testing probe SRC, as the refresh timing signal SRTPZ in test modes. That is, in the test modes, the internal refresh request signal IREFZ output from the refresh timer 116 is masked. Instead of the internal refresh request signal IREFZ, the test refresh request signal EREFZ is output as the refresh timing signal SRTPZ.

Incidentally, the pseudo SRAM shifts from the normal operation mode to a test mode (first test mode or second test mode) when it receives a plurality of command signals CMD in a combination that is unused in normal operations. The state of the pseudo SRAM is set to the first test mode or the second test mode in accordance with the logical values of the command signals CMD. The pseudo SRAM maintains a test signal TES1Z at high level when in the first test mode, and maintains a test signal TES2Z at high level when in the second test mode.

The refresh timer 116 outputs the internal refresh request signal IREFZ at predetermined cycles. The internal refresh request signal IREFZ is generated at cycles such that memory cells MC can be refreshed in succession without losing the data retained in the memory cells MC. For example, the cycle of generation of the internal refresh request signal IREFZ is set so that all the memory cells MC are refreshed once within 300 ms. More specifically, when there are arranged 8 k word lines WL to be selected in succession by respective refresh requests, the internal refresh request signal IREFZ is generated at every 36 to 37 μs. The refresh timer 116 is composed of, for example, a ring oscillator having an oscillation cycle of 1 μs and a frequency divider for generating the internal refresh request signal IREFZ from the output of the ring oscillator.

The refresh counter 118 makes a count operation in response to the internal refresh request signal IREFZ, thereby generating a refresh address signal REFAD successively.

The address input circuit 120 receives an address signal ADD through an address terminal ADD, and outputs the received signal as a row address signal RAD (upper address) and a column address signal CAD (lower address). Note that the pseudo SRAM is a memory of address non-multiplex type which receives the upper address and the lower address simultaneously.

The switch circuit 122 outputs the refresh address signal REFAD as an internal row address signal IRAD when a refresh operation is performed. The switch circuit 122 outputs the row address signal RAD as the internal row address signal IRAD when a read operation or a write operation is performed.

The data output circuit 124 receives read data from the memory cells MC through a common data bus CDB, and outputs the received data to data terminals DQ (DQ0-7). Moreover, in the test modes, the data output circuit 124 sets the data terminals DQ0-7 to a high impedance state when the data output circuit 124 receives a short refresh detection signal REFSSZ (detecting signal) output from the refresh decision circuit 128.

The data input circuit 126 receives write data through the data terminals DQ (DQ0-7), and outputs the received data to the common data bus CDB.

The arbiter 128 compares the transition edges of the access timing signal ATDPZ (access request) and the refresh timing signal SRTPZ (refresh request) to make a determination on the conflict between these requests, and decides which to give precedence to, an access operation or a refresh operation. When the access operation has precedence, the arbiter 128 holds the refresh timing signal SRTPZ temporarily, and outputs a read timing signal RDPZ or a write timing signal WRPZ in response to the read control signal RDZ or the write control signal WRZ. Subsequently, the arbiter 128 detects the completion of the access operation from the inactivation of a core cycle state signal ICSX (a change to high level), and outputs a refresh start signal REFPZ and a refresh state signal REF1Z (second refresh control signal) in accordance with the held refresh timing signal SRTPZ. The refresh state signal REF1Z is a signal for indicating that a refresh operation is in execution.

When the refresh operation has precedence, the arbiter 128 holds the access timing signal ATDPZ temporarily, and outputs the refresh start signal REFPZ and the refresh state signal REF1Z (first refresh control signal) in response to the refresh timing signal SRTPZ. Subsequently, the arbiter 128 detects the completion of the refresh operation from the inactivation of the core cycle state signal ICSX (a change to high level), and outputs the read timing signal RDPZ or the write timing signal WRPZ in accordance with the held access timing signal ATDPZ.

Incidentally, when a short refresh signal REFS2Z is output from the refresh decision circuit 130, the arbiter 128 outputs the refresh start signal REFPZ and the refresh state signal REF1Z, and holds the refresh timing signal SRTPZ temporarily even after the refresh operation is performed. Then, it detects the completion of the access operation from the inactivation of the core cycle state signal ICSX, before outputting the refresh start signal REFPZ and the refresh state signal REF1Z (second refresh control signal) again to perform a refresh operation. That is, when the short refresh signal REFS2Z is output, two refresh operations are performed in response to a single refresh request.

When the short refresh signal REFS2Z is output, the arbiter 128 outputs the refresh state signal REF1Z (first refresh control signal) corresponding to the first refresh operation for a period shorter than in a normal refresh operation (corresponding to a first period to be described later). The arbiter 128 outputs the refresh state signal REF1Z (second refresh control signal) corresponding to the second refresh operation for the same period same as in a normal refresh operation (corresponding to a second period to be described later).

The refresh decision circuit 130 outputs the short refresh signal REFS2Z when the interval between the transition edges of the access timing signal ATDPZ and the refresh state signal REF1Z is shorter than a predetermined period. Besides, when in the first test mode (TES1Z=high level), the refresh decision circuit 130 outputs the short refresh signal REFS2Z as the short refresh detection signal REFSSZ (detecting signal). When in the second test mode (TES2Z=high level), the refresh decision circuit 130 outputs the short refresh detection signal REFSSZ when the short refresh signal REFS2Z is output twice in succession.

The access timing generator 110, the command decoder 112, and the arbiter 128 operate as a command control circuit. The command control circuit outputs an access control circuit (the read timing signal RDPZ or the write timing signal WRPZ) for accessing the memory cells MC to be described later in response to an access control signal (a read command or a write command) supplied through the command terminal CMD.

The arbiter 128 and the refresh decision circuit 130 operate as a refresh control circuit. The refresh control circuit outputs the first refresh control signal (REF1Z) for activating sense amplifiers for the first period or the second refresh control signal (REF1Z) for activating the sense amplifiers for the second period longer than the first period in accordance with the timing of occurrence of the access request and the internal refresh request.

The row operation control circuit 132 outputs a row control signal RASZ, or a basic timing signal for operating the memory core 136, when it receives the read timing signal RDPZ, the write timing signal WRPZ, or the refresh timing signal SRTPZ. It also maintains the core cycle state signal ICSX at low level when the memory core 136 is in operation. Incidentally, the row operation control circuit 132 performs a normal refresh operation (second refresh operation) when it receives the refresh timing signal SRTPZ without receiving the short refresh signal REFS2Z. It performs a short refresh operation (first refresh operation) shorter than the normal refresh operation when it receives the short refresh signal REFS2Z and the refresh timing signal SRTPZ as well.

The core control circuit 134 has a word line control circuit, a sense amplifier control circuit, and a precharge control circuit which are not shown. The word line control circuit outputs a word line control signal TWZ for selecting word lines WL to be described later, in response to the row control signal RASZ. The sense amplifier control circuit outputs a sense amplifier activation signal LEZ for activating the sense amplifiers of a sense amplifier part SA to be described later, in response to the row control signal RASZ. The precharge control circuit outputs a bit line reset signal BRS when bit lines BL and /BL are not in use.

The row operation control circuit 132 and the core control circuit 134 operate as an operation control circuit. The operation control circuit makes the memory core 136 perform an access operation in response to the read timing signal RDPZ (access control signal) or the write timing signal WRPZ (access control signal), and makes the memory core 136 perform first and second refresh operations in response to first and second refresh control signals REF1Z.

The memory core 136 has a memory cell array ARY, a word decoder part WDEC, the sense amplifier part SA, a column decoder part CDEC, a sense buffer part SB, and a write amplifier part WA. The memory cell array ARY has a plurality of volatile memory cells MC (dynamic memory cells), and a plurality of word lines WL and a plurality of bit lines BL and /BL (complementary bit lines) which are connected to the memory cells MC. The memory cells MC are the same as typical DRAM memory cells, each having a capacitor for retaining data in the form of a charge and a transfer transistor arranged between this capacitor and a bit line BL (or /BL). The gate of the transfer transistor is connected to a word line WL. Through the selection of the word lines WL, any one of a read operation, a write operation, and a refresh operation is performed. The memory cell array ARY performs any one of the read operation, write operation, and refresh operation before performing a precharge operation for precharging the bit lines BL and /BL to a predetermined voltage in response to the bit line reset signal BRS.

When the word decoder part WDEC receives the word line control signal TWZ of high level, it selects any one of the word lines WL in accordance with the internal row address signal IRAD, and changes the selected word line WL to high level. The column decoder part CDEC outputs a column line signal for turning on column switches which connect the bit lines BL and /BL and a data bus DB, respectively, in accordance with the column address signal CAD.

The sense amplifier part SA has a plurality of sense amplifiers. The sense amplifiers operate in response to the sense amplifier activation signal LEZ, and amplify data on the respective bit lines BL and /BL in signal quantity. The data amplified by the sense amplifiers is transmitted to the data bus DB through the column switches in a read operation. In a write operation, the data is written to the memory cells MC through the bit lines.

The sense buffer part SB amplifies the read data on the data bus DB in signal quantity, and outputs it to the common data bus CDB. The write amplifier part WA amplifies the write data on the common data bus CDB in signal quantity, and outputs it to the data bus DB.

Figure 19:
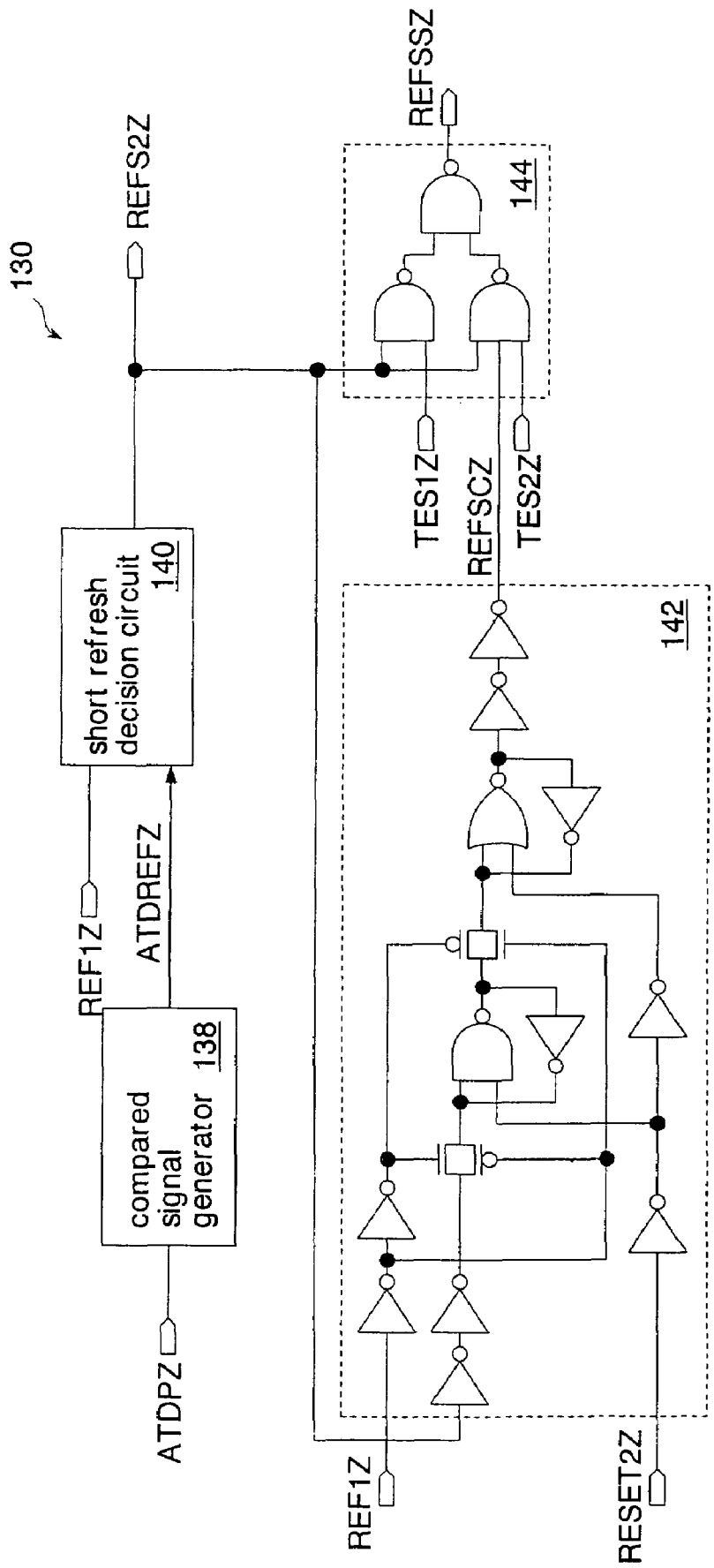
FIG. 19 is a circuit diagram showing the details of the refresh decision circuit shown in FIG. 18.

FIG. 19 shows the details of the refresh decision circuit 130 shown in FIG. 18.

The refresh decision circuit 130 has a compared signal generator 138, a short refresh decision circuit 140, a short refresh latch circuit 142, and a selector circuit 144.

The compared signal generator 138 generates a compared signal ATDREFZ in accordance with the access timing signal ATDPZ. The short refresh decision circuit 140 compares the transition edge of the refresh state signal REF1Z and the transition edge of the compared signal ATDREFZ, and decides which refresh operation for the refresh state signal REF1Z to indicate, a normal refresh operation or a short refresh operation. When the short refresh decision circuit 140 decides to perform a short refresh operation, it outputs the short refresh signal REFS2Z.

The short refresh latch circuit 142 latches the logical level of the short refresh signal REFS2Z in synchronization with the falling edge of the refresh state signal REF1Z, and outputs the latched logical level as a short refresh signal REFSCZ. Consequently, the short refresh signal REFSCZ changes to high level when a short refresh operation is performed, and changes to low level when a normal refresh operation is performed. In addition, the short refresh latch circuit 142 is reset during the high level period of a reset signal RESET2Z, and changes the short refresh detection signal REFSSZ to low level. The reset signal RESET2Z changes to high level for a predetermined period when a reset command is received as a command signal CMD in the second test mode.

The selector circuit 144 outputs the short refresh signal REFS2Z as the short refresh detection signal REFSSZ when the test signal TES1Z is at high level (the first test mode). The selector circuit 144 outputs the AND logic of the short refresh signal REFS2Z and the short refresh signal REFSCZ as the short refresh detection signal REFSSZ when the test signal TES2Z is at high level (the second test mode). As will be described, in the first test mode, the short refresh detection signal REFSSZ is output each time a short refresh operation is performed. In the second test mode, the short refresh detection signal REFSSZ is output when two short refresh operations are performed in succession. The selector circuit 144 thus operates as a detecting circuit, which operates in the test modes and outputs the short refresh detection signal REFSSZ when the refresh state signal REF1Z (first refresh control signal) for performing a short refresh operation is detected.

Figure 20:
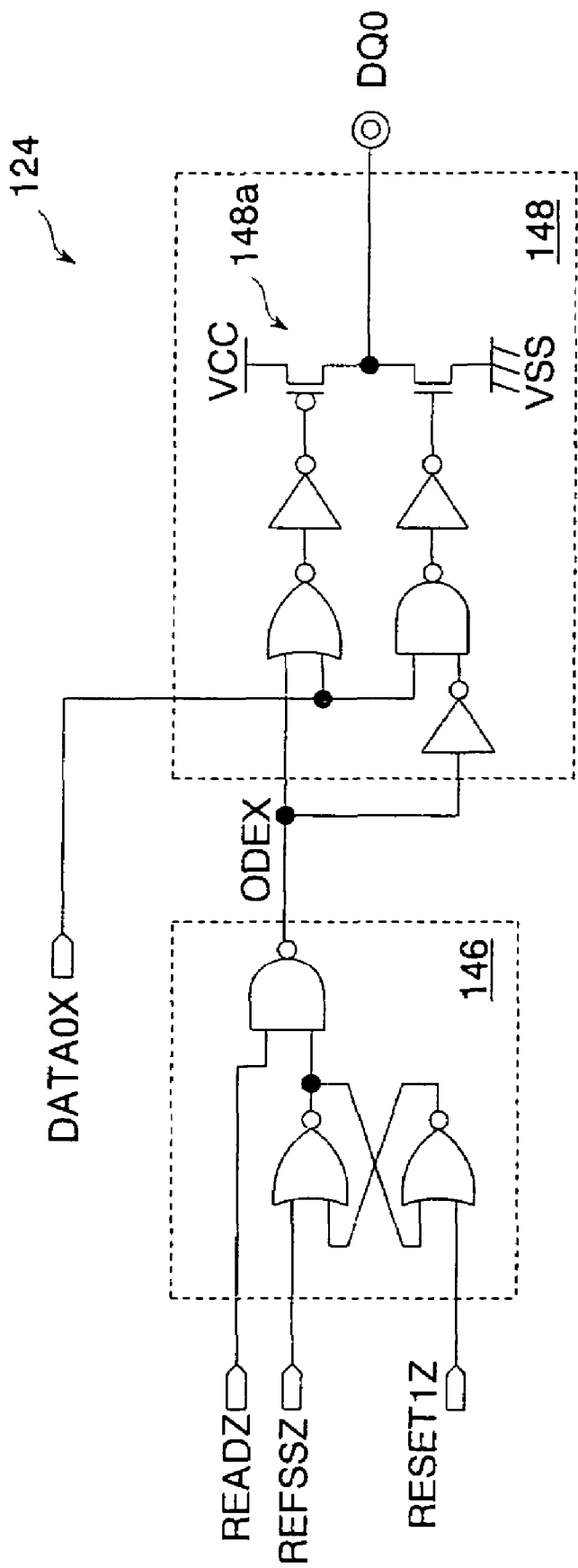
FIG. 20 is a circuit diagram showing the details of the data output circuit shown in FIG. 18.

FIG. 20 shows the details of the data output circuit 124 shown in FIG. 18.

The data output circuit 124 has an output mask circuit 146 and output buffer circuits 148. Note that FIG. 20 shows an output buffer circuit 148 that corresponds to the data terminal DQ0. The output buffer circuits corresponding to the other data terminals DQ1-7 are identical to the output buffer circuit 148. The output mask circuit 146 is common among the output buffer circuits 148 corresponding to the data terminals DQ0-7.

The output mask circuit 146 is reset by a reset signal RESET1Z of high level, and inverts and outputs a read timing signal READZ as an output enable signal ODEX. The output mask circuit 146 prohibits the output of the read timing signal READZ when it receives the short refresh detection signal REFSSZ of high level. That is, the output enable signal ODEX is kept at high level by the short refresh detection signal REFSSZ of high level.

When the output enable signal ODEX is at low level, the output buffer circuit 148 operates its tristate output buffer 148a in accordance with the logic level of read data DATA0X, thereby outputting a high level or low level to the data terminal DQ0. When the output enable signal ODEX is at high level, the output buffer circuit 148 changes the output of the tristate output buffer 148a to a high impedance state. That is, the output mask circuit 146 controls the tristate output buffer 148a in the test mode so that the output of the read data DATA0X to the data terminal DQ0 is prohibited in response to the short refresh detection signal REFSSZ and the data terminal DQ0 is set to a high impedance state.

Figure 21:
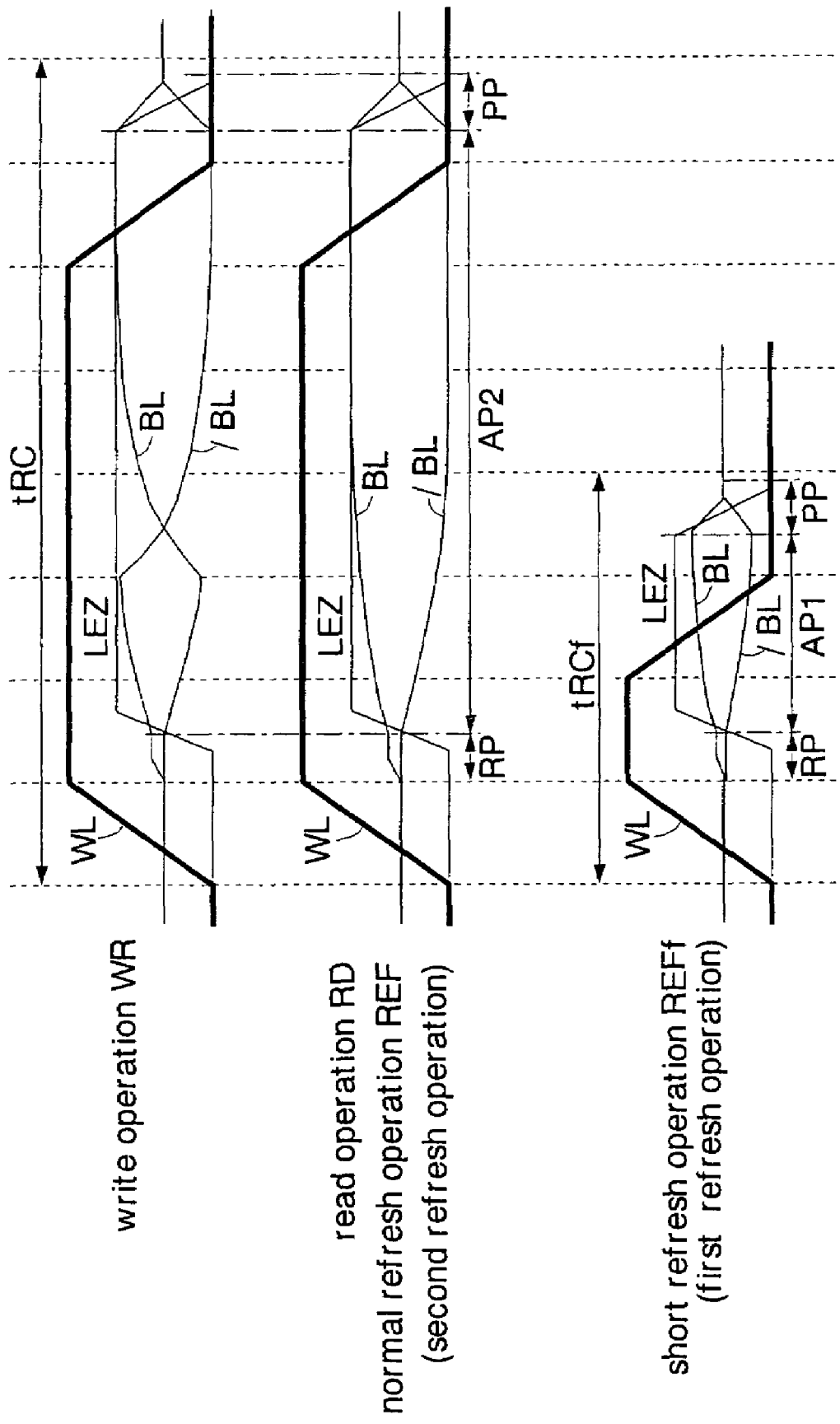
FIG. 21 is a timing chart showing the basic operation of the memory cell array according to the fourth embodiment.

FIG. 21 shows the basic operations of the memory cell array ARY according to the fourth embodiment.

In this embodiment, a write operation WR, a read operation RD, and a normal refresh operation REF (second refresh operation) are performed in the same cycle time tRC. A short refresh operation REFf (first refresh operation) is performed in a cycle time tRCf shorter than the cycle time tRC. The write operation WR, the read operation RD, the normal refresh operation REF, and the short refresh operation REFf consist of a read stage RP, an amplifying stage AP1 or AP2, and a precharging stage PP.

The read stage RP is a period in which data is read to the bit lines BL (or /BL) from memory cells MC that are selected in response to the activation (selection) of a word line WL. The amplifying stages AP1 and AP2 are periods in which, after the data is read to the bit lines BL (or /BL), the sense amplifiers are activated in response to the sense amplifier activation signal LEZ to amplify the voltage differences (data) between the bit lines BL and /BL, and the amplified voltages of the bit lines BL and /BL are rewritten to the memory cells MC from which the data is read. The period of the amplifying stage AP2 (the high level period of the sense amplifier activation signal LEZ in the normal refresh operation REF) corresponds to the second period. The amplifying stage AP1 (the high level period of the sense amplifier activation signal LEZ during the short refresh operation REFf) corresponds to the first period. The precharging stage PP is a period in which the word lines WL are inactivated (deselected) and the bit lines BL and /BL are precharged to a predetermined voltage.

In the write operation WR, the data that is read from the memory cells MC and amplified on the bit lines BL and /BL must be inverted by write data. This makes the cycle time of the write operation WR longer than those of the other operations. In this embodiment, however, the cycle time of the read operation RD is set to the same value as the cycle time of the write operation WR in view of user convenience.

Moreover, in the normal refresh operation REF, the bit lines BL and /BL need not be connected with the data bus DB, nor need the data be inverted on the bit lines BL and /BL. Thus, the data retained in the memory cells MC can be fully written to the memory cells MC again even if the cycle time is shorter than tRC. The full write gives each memory cell MC a data retention time (pause time) of 64 ms or more. In this embodiment, however, the cycle time of the normal refresh operation REF is set to the same value as the cycle time of the write operation WR in order to simplify the configuration of the row operation control circuit 132 and the core control circuit 134.

The short refresh operation REFf is used to perform a refresh operation for a minimum period when a conflict occurs between an access request (the read command or the write command) and a refresh request. After the short refresh operation REFf, the access operation (the read operation RD or the write operation WR) can be performed immediately to reduce the access time.

The short refresh operation REFf will not amplify the voltage differences between the bit lines BL and /BL sufficiently because the activation period of the sense amplifiers (the high level period of the LEZ signal) is short. Since the data rewritten to the memory cells MC is small in signal quantity (restore level), a normal refresh operation REF must be performed within, e.g., 200 ns after the short refresh operation REFf. In other words, when it is possible to perform a normal refresh operation REF within 200 ns, the short refresh operation REFf can be temporarily performed to avoid loss of data in the memory cells MC. As above, the execution time of the short refresh operation REFf (the time for amplifying and rewriting data) is such a time that the data in the memory cells MC can be retained without loss over the period from the execution of the short refresh operation REFf to the execution of the normal refresh operation REF.

Figure 22:
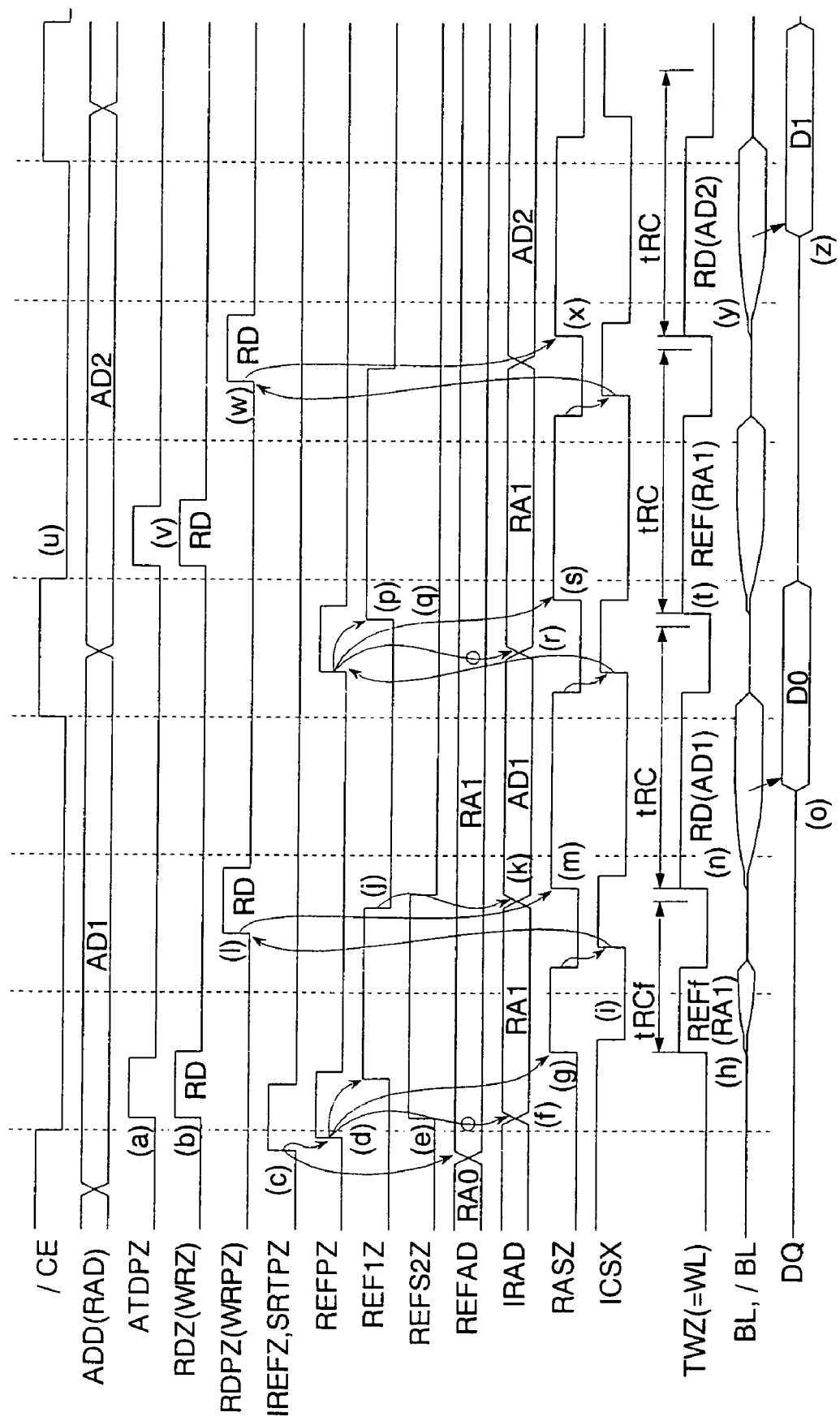
FIG. 22 is a timing chart showing an example of operation of the fourth embodiment in a normal operation mode.

FIG. 22 shows an example of operation of the fourth embodiment in the normal operation mode.

In this example, two read operations RD are performed in succession, and the first read command RD and the internal refresh request signal IREFZ occur almost at the same time.

Initially, the access timing generator 110 shown in FIG. 18 receives the chip enable signal /CE of low level and the not-shown output enable signal /OE of low level, and outputs the access timing signal ATDPZ (FIG. 22($a$)). The command decoder 112 receives the chip enable signal /CE of low level, and the output enable signal /OE of low level and the write enable signal /WE of high level which are not shown, and detects that a read command RD (read access request) is supplied. The command decoder 112 outputs the read control signal RDZ (FIG. 22($b$)).

The refresh timer 116 shown in FIG. 19 outputs the internal refresh request signal IREFZ almost at the same time as the supply of the read command RD. The refresh selection circuit 114 outputs the refresh timing signal SRTPZ in response to the internal refresh request signal IREFZ (FIG. 22($c$)).

The arbiter 128 decides to perform the refresh operation with precedence over the read operation, and outputs the refresh start signal REFPZ and the refresh state signal REF1Z (first refresh control signal) in succession (FIG. 22($d$)). The refresh decision circuit 130 detects that the access timing signal ATDPZ is generated a predetermined time earlier than the refresh state signal REF1Z, and outputs the short refresh signal REFS2Z (FIG. 22($e$)). The switch circuit 122 outputs the refresh address signal REFAD (RA1) as the row address signal IRAD (FIG. 22($f$)) in order to perform a short refresh.

The row operation control circuit 132 outputs the row control signal RASZ in synchronization with the refresh start signal REFPZ (FIG. 22($g$)). The core control circuit 134 outputs the word line control signal TWZ and the like in response to the row control signal RASZ. Then, the short refresh operation. REFf (first refresh operation) shown in FIG. 21 is performed (FIG. 22($h$)). The row operation control circuit 132 changes the core cycle state signal ICSX to low level while the short refresh operation REFf is in execution (FIG. 22($i$)).

After the execution of the short refresh operation REFf, the arbiter 128 changes the refresh state signal REF1Z to low level (FIG. 22($j$)). The switch circuit 122 outputs the address signal ADD (AD1) as the row address signal IRAD (FIG. 22($k$)) in order to perform a read operation.

The arbiter 128 outputs the read timing signal RDPZ in response to the rising edge of the core cycle state signal ICSX (FIG. 22($l$)). The row operation control circuit 132 outputs the row control signal RASZ in synchronization with the read timing signal RDPZ (FIG. 22($m$)). The core control circuit 134 outputs the word line control signal TWZ and the like in response to the row control signal RASZ. Then, the read operation RD shown in FIG. 21 is performed (FIG. 22($n$)). The read data D0 that is amplified on the bit lines BL and /BL by the read operation RD is output to the data terminals DQ through the common data bus CDB (FIG. 22($o$)).

The short refresh operation REFf ends in a short period as shown in FIG. 21. Thus, even when a conflict occurs between a refresh request and an access request and precedence is given to the refresh request, the access operation corresponding to the access request can be started earlier. That is, it is possible to reduce the chip enable access time from the falling edge of the chip enable signal /CE to the output of data to the data terminals DQ.

Next, the arbiter 128 outputs the refresh start signal REFPZ and the refresh state signal REF1Z (second refresh control signal) in succession in response to the rising edge of the core cycle state signal ICSX (FIG. 22($p$)). Since the generation of the access timing signal ATDPZ cannot be detected, the refresh decision circuit 130 will not output the short refresh signal REFS2Z (FIG. 22($q$)). The switch circuit 22 outputs the refresh address signal REFAD (RA1) as the row address signal IRAD (FIG. 22($r$)) in order to perform a normal refresh after the short refresh operation.

The row operation control circuit 132 outputs the row control signal RASZ in synchronization with the refresh start signal REFPZ (FIG. 22($s$)). The core control circuit 134 outputs the word line control signal TWZ and the like in response to the row control signal RASZ. Then, the normal refresh operation REFf (second refresh operation) shown in FIG. 21 is performed (FIG. 22($t$)). The refresh operation corresponding to the second refresh control signal is always performed after the refresh operation corresponding to the first refresh control signal (the first refresh operation). Thus, even if the first refresh operation only rewrites the memory cells insufficiently, sufficient signal quantities of data are rewritten to the memory cells by the subsequent refresh operation. Consequently, even when a conflict occurs between an access request and the refresh request and precedence is given to the access request, it is possible to retain the data in the memory cells with reliability.

The pseudo SRAM receives a read command (the chip enable signal /CE of low level, and the output enable signal /OE of low level and the write enable signal /WE of high level which are not shown) while the refresh operation REF is in execution (FIG. 22($u$)). The access timing generator 110 and the command decoder 112 output the access timing signal ATDPZ and the read control signal RDZ in response to the read command (FIG. 22($v$)).

The arbiter 128 outputs the read timing signal RDPZ in response to the rising edge of the core cycle state signal ICSX of the normal refresh operation REF (FIG. 22($w$)). The row operation control circuit 132 outputs the row control signal RASZ in synchronization with the read timing signal RDPZ (FIG. 22($x$)). The core control circuit 134 outputs the word line control signal TWZ and the like in response to the row control signal RASZ. Then, the read operation RD corresponding to the address signal AD2 is performed (FIG. 22($y$)). The read data D1 that is amplified on the bit lines BL and /BL by the read operation RD is output to the data terminals DQ through the common data bus CDB (FIG. 22($z$)).

As shown in FIG. 22, when the internal refresh request signal IREFZ has precedence over the read command RD (access request), the arbiter 128 outputs the refresh state signal REF1Z (first refresh control signal), the read timing signal RDPZ, and the refresh state signal REF1Z (second refresh control signal) in succession.

Incidentally, this pseudo SRAM is designed so that the sum of the execution times of the short refresh operation REFf and the normal refresh operation REF and the execution times of two read operations RD is smaller than twice the minimum interval of supply of access requests, or the external access cycle time. Consequently, the short refresh operation REFf, the normal refresh operation REF, and the two read operations RD (or write operations) can be performed during the two external access cycle times. That is, the pseudo SRAM can perform refresh operations without being recognized from exterior.

Figure 23:
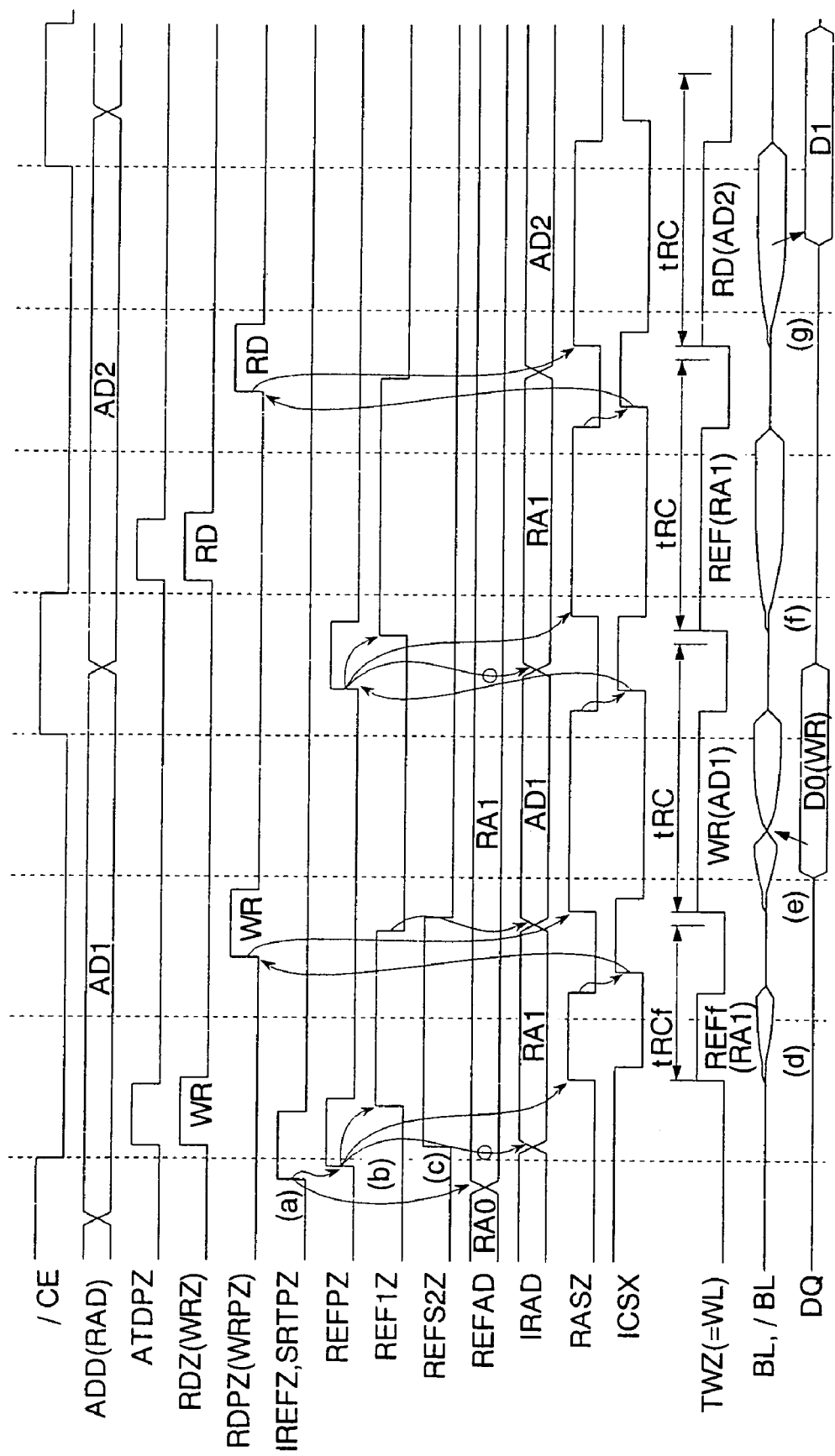
FIG. 23 is a timing chart showing another example of operation of the fourth embodiment in the normal operation mode.

FIG. 23 shows another example of operation of the fourth embodiment in the normal operation mode. Detailed description will be omitted of the same operations as in FIG. 22.

In this example, a write operation WR and a read operation RD are performed in succession, and the write command and the internal refresh request signal IREFZ occur almost at the same time.

The refresh timer 116 outputs the internal refresh request signal IREFZ almost at the same time as the supply of the write command WR (FIG. 23(a)). The arbiter 128 decides to perform the refresh operation with precedence over the write operation, and outputs the refresh start signal REFPZ and the refresh state signal REF1Z (first refresh control signal) in succession (FIG. 23(b)). The refresh decision circuit 130 detects that the access timing signal ATDPZ is generated a predetermined time earlier than the refresh state signal REF1Z, and outputs the short refresh signal REFS2Z (FIG. 23(c)).

Then, as in FIG. 22, the short refresh operation REFf (first refresh operation), the write operation WR (access operation), and the normal refresh operation REF (second refresh operation) are performed in succession (FIG. 23(d), (e), (f)). After the refresh operation is performed, the read operation corresponding to the address signal AD2 is performed (FIG. 23(g)).

As shown in FIG. 23, when the internal refresh request signal IREFZ has precedence over the write command WR (access request), the arbiter 28 outputs the refresh state signal REF1Z (first refresh control signal), the write timing signal WRPZ, and the refresh state signal REF1Z (second refresh control signal) in succession.

Figure 24:
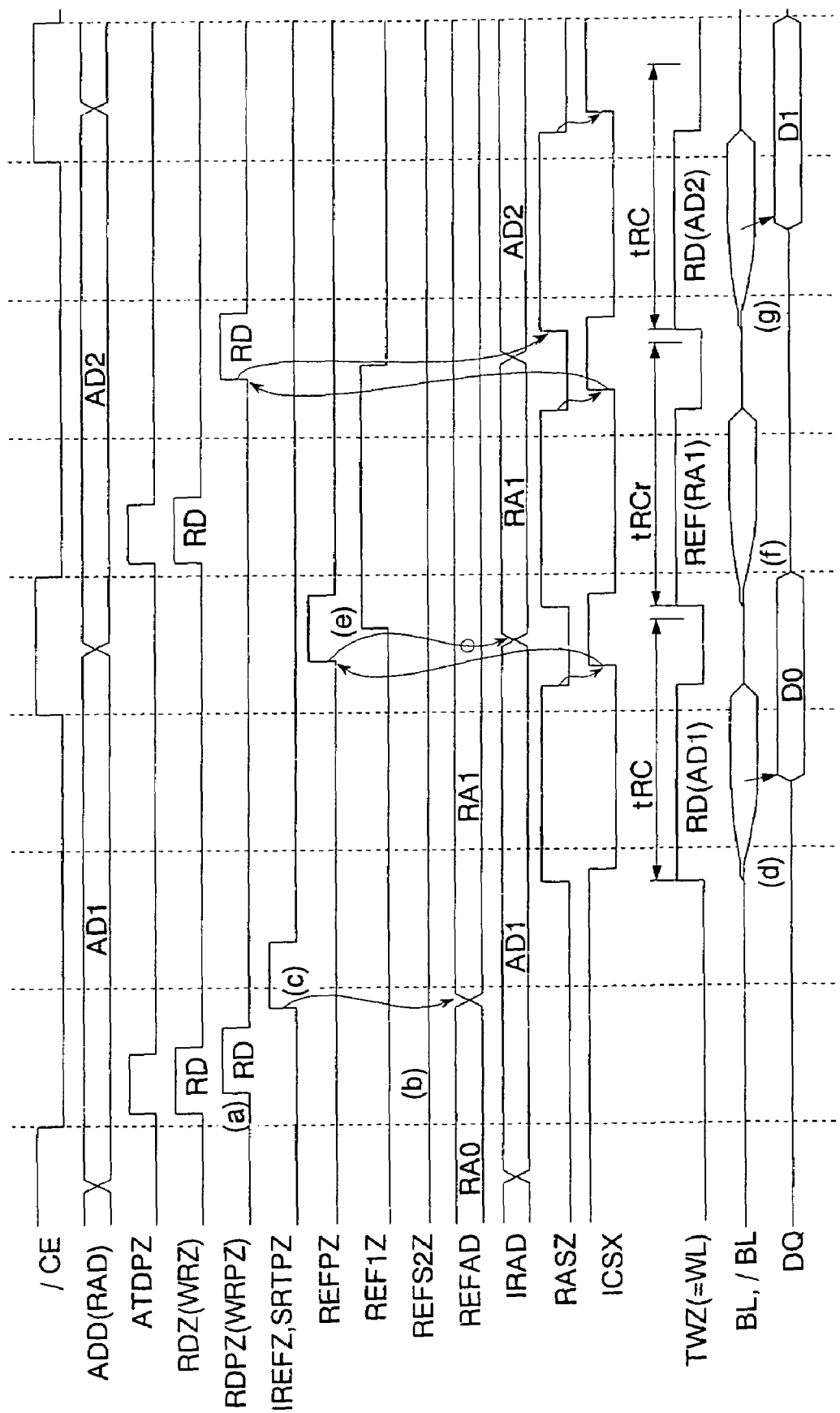
FIG. 24 is a timing chart showing another example of operation of the fourth embodiment in the normal operation mode.

FIG. 24 shows another example of operation of the fourth embodiment in the normal operation mode. Detailed description will be omitted of the same operations as in FIG. 22.

In this example, two read operations RD are performed in succession, and the internal refresh request signal IREFZ occurs after the supply of the first read command RD.

The arbiter 128 receives the access timing signal ATDPZ before it receives the refresh timing signal SRTPZ. The arbiter 128 thus decides to perform the read operation with precedence over the refresh operation. Then, the arbiter 128 outputs the read timing signal RDPZ without outputting the refresh start signal REFPZ or the refresh state signal REF1Z (FIG. 24(a)).

Since the refresh decision circuit 130 receives the access timing signal ATPDZ without receiving the refresh state signal REF1Z, it will not output the short refresh signal REFS2Z (FIG. 24(b)). In this way, no short refresh operation is performed when the read command RD (or the write command WR) has precedence over the refresh command (the internal refresh request signal IREFZ). After the supply of the read command RD, the internal refresh request signal IREFZ is generated (FIG. 24(c)). Then, the read operation RD corresponding to the address AD1 is performed with precedence over the refresh operation (FIG. 24(d)).

The arbiter 128 outputs the refresh start signal REFPZ and the refresh state signal REF1Z in synchronization with the rising edge of the core cycle state signal ICSX that results from the completion of the read operation RD (FIG. 24(e)). Then, as in FIG. 22, the normal refresh operation REF (second refresh operation) and the read operation RD corresponding to the address AD2 are performed in succession (FIG. 24(f), (g)). As above, when the read command RD (access request) has precedence over the internal refresh request signal IREFZ, the arbiter 128 outputs the read timing signal RDPZ before outputting the refresh state signal REF1Z (second refresh control signal).

Figure 25:
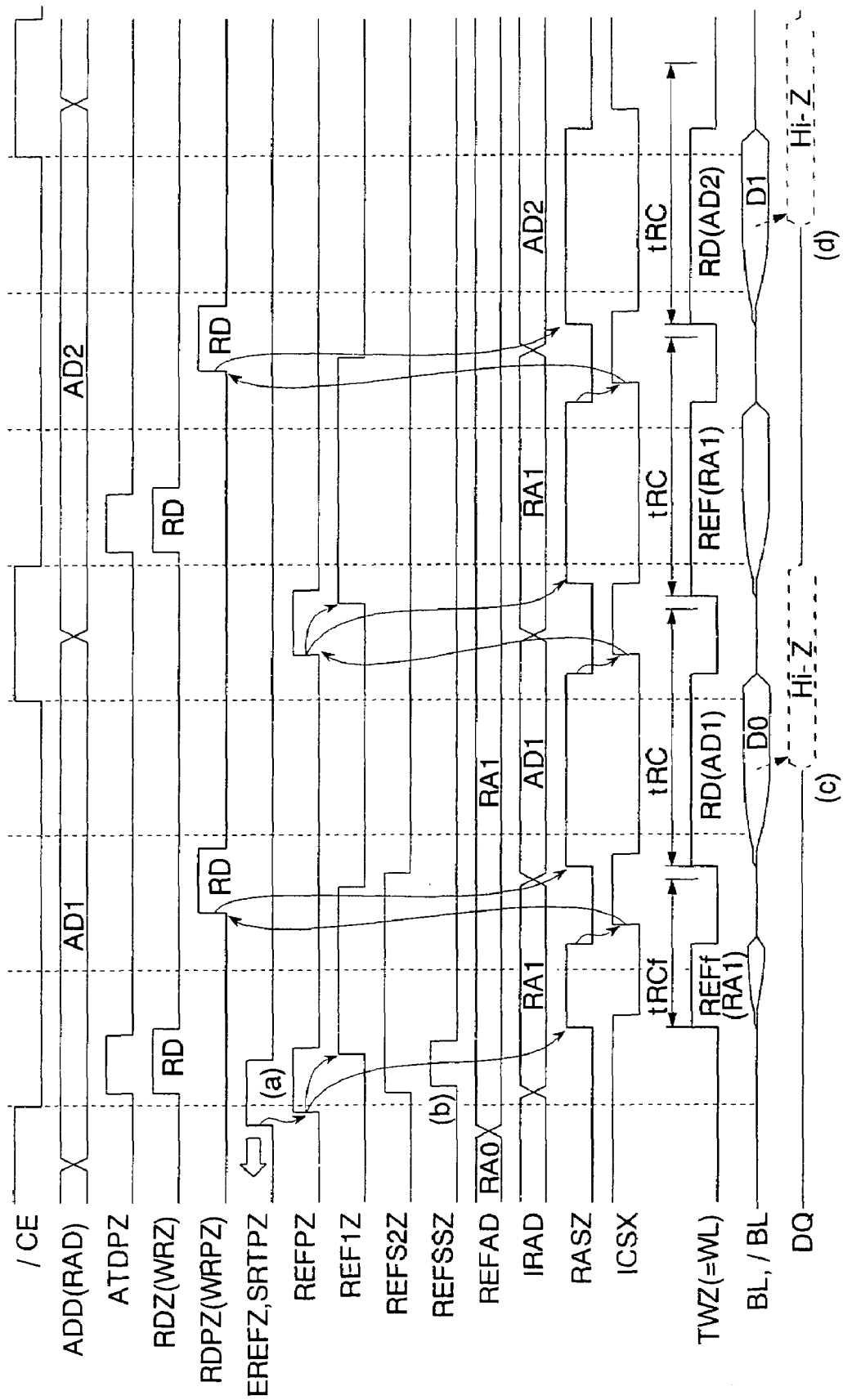
FIG. 25 is a timing chart showing an example of operation of the fourth embodiment in a first test mode.

FIG. 25 shows an example of operation of the fourth embodiment in the first test mode. Detailed description will be omitted of the same operations as in FIG. 22. The pseudo SRAM has already shifted from the normal operation mode to the first test mode. The first test mode is used, for example, for characteristic evaluations on the pseudo SRAM under development. The characteristic evaluations are conducted by connecting the pseudo SRAM in a wafer state with probers and inputting test patterns to the pseudo SRAM from the LSI tester.

This example shows the timing when the timing of supply of the test refresh request signal EREFZ with respect to the read command RD is advanced gradually until the timing of occurrence of the short refresh operation is found. That is, the timing at which a conflict occurs between a refresh request and an access request is shown. The timing immediately preceding FIG. 25 (the timing before the occurrence of the short refresh operation) is the same as in FIG. 24 seen above.

In the first test mode, the refresh selection circuit 114 shown in FIG. 18 masks the internal refresh request signal IREFZ output from the refresh timer 116. The refresh selection circuit 114 receives the test refresh request signal EREFZ supplied from the LSI tester through the testing probe SRC instead of the internal refresh request signal IREFZ, and outputs it as the refresh timing signal SRTPZ (FIG. 25(a)). Since a refresh request and an access request of desired timing can be supplied from exterior of the pseudo SRAM by using the LSI tester or the like, it is possible to control the deviation (time difference) between the access request and the refresh request with high precision.

In the first test mode, the LSI tester gradually advances, for example, the timing of supply of the test refresh request signal EREFZ with respect to an access command (e.g., read command RD). Then, the timing at which precedence is given to the refresh operation over the read operation to perform a short refresh operation is found. That is, it is possible to detect the timing at which the short refresh operation REFf and the normal refresh operation REF are switched.

In the first test mode, the selector circuit 144 of the refresh decision circuit 130 shown in FIG. 19 outputs the short refresh signal REFS2Z as the short refresh signal REFSSZ in response to the test signal TES1Z of high level (FIG. 25(b)). In response to the short refresh signal REFSSZ, the output mask circuit 146 of the data output circuit 124 shown in FIG. 20 masks the read timing signal READZ to fix the output enable signal ODEX to high level. This inactivates the output buffer circuits 148 of the data output circuit 124 shown in FIG. 20. The tristate output buffers 148a prohibit the read data D0 resulting from the read operation RD from being output to the data terminals DQ, and set the data terminals DQ to a high impedance state Hi-Z (FIG. 25(c)). That is, in the first test mode, the data terminals DQ enter the high impedance state Hi-Z when the short refresh operation REFf is performed. Then, whether or not a conflict occurs between the refresh request and the access request is decided depending on if the high impedance state Hi-Z is detected. Since the foregoing evaluation does not require the formation of any dedicated testing probe, the pseudo SRAM can be prevented from an increase in chip size.

In an actual evaluation, an evaluation board or probe card having its data terminals DQ pulled up (logic "1") is loaded into the LSI tester so that logic "0" is written to the memory cells MC corresponding to the address AD1 in advance. Then, if the logic "0" cannot be read and an error occurs in the foregoing test, it is determined that the short refresh operation REFf is performed due to a conflict between the refresh request and the access request.

The data terminals DQ remain in the high impedance state Hi-Z until a reset signal RESET1Z is supplied to the output mask circuit 146. Consequently, when the short refresh operation REFf is performed, a read error occurs even in the read operation RD corresponding to the address AD2 (FIG. 25(d)).

Note that FIG. 25 shows the case where the read operation RD corresponding to the address AD1 is performed to evaluate the conflict between the read command and the refresh request. Nevertheless, as shown in FIG. 23, a write operation WR corresponding to the address AD1 may be performed to evaluate the conflict between the write command and the refresh request.

After the timing of occurrence of the short refresh operation is evaluated in the first test mode, the pseudo SRAM enters the second test mode to make another evaluation based on the result of evaluation in the first test mode.

Figure 26:
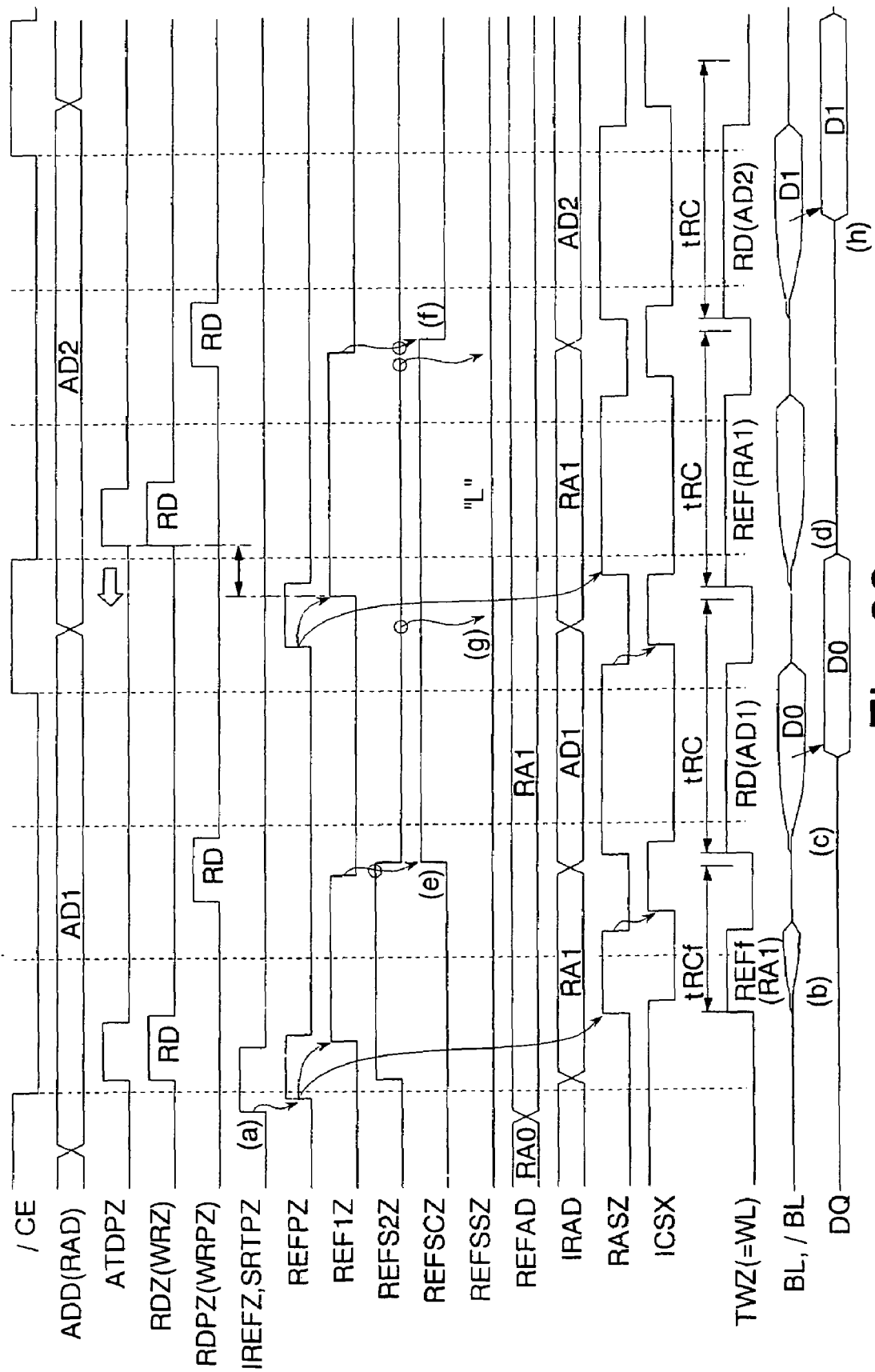
FIG. 26 is a timing chart showing an example of operation of the fourth embodiment in a second test mode.
Figure 27:
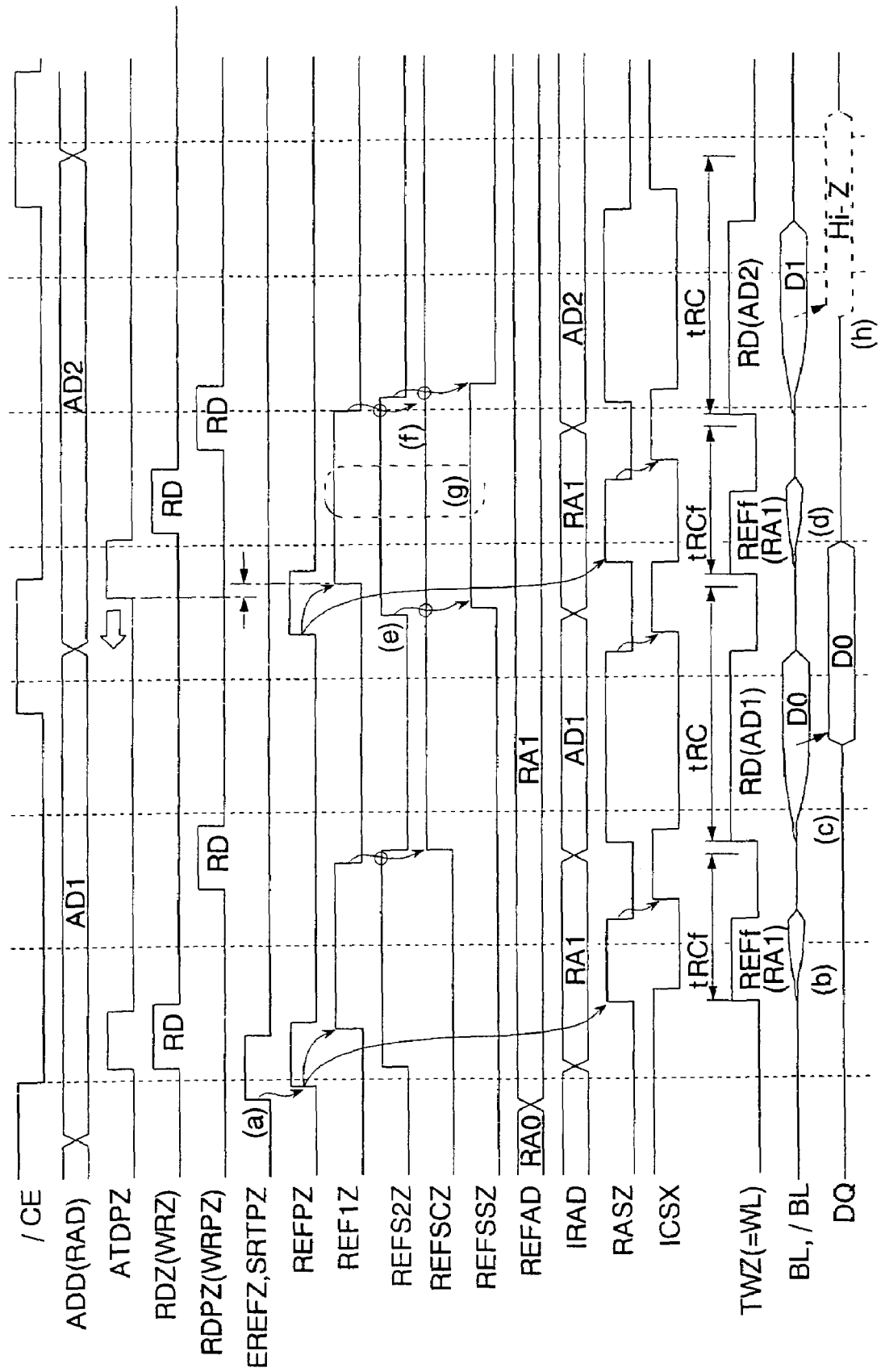
FIG. 27 is a timing chart showing an example of operation of the fourth embodiment in the second test mode.

FIGS. 26 and 27 show examples of operation of the fourth embodiment in the second test mode. Detailed description will be omitted of the same operations as in FIG. 22. The pseudo SRAM has already shifted from the normal operation mode or the first test mode to the second test mode. Like the first test mode, the second test mode is used for characteristic evaluations on the pseudo SRAM under development, for example. The characteristic evaluations are conducted by connecting the pseudo SRAM in a wafer state with probers and inputting test patterns to the pseudo SRAM from the LSI tester.

In the second test mode, the refresh selection circuit 114 shown in FIG. 18 masks the internal refresh request signal IREFZ output from the refresh timer 116. The refresh selection circuit 114 receives the test refresh request signal EREFZ supplied from the LSI tester through the testing probe SRC instead of the internal refresh request signal IREFZ, and outputs it as the refresh timing signal SRTPZ (FIG. 26(a), FIG. 27(a)).

In the second test mode, the LSI tester gradually decreases a cycle time (for example, the read cycle time) without changing the timing condition evaluated in the first test mode. Then, the timing at which the normal refresh operation REF to be performed after the short refresh operation REFf switches to a short refresh operation REFf is found. That is, an evaluation on the minimum cycle time at which the pseudo SRAM operates properly is made.

The basic timing shown in FIG. 26 is the same as in FIG. 22. Here, the pseudo SRAM is in proper operation, so that the short refresh operation REFf, the read operation RD, and the normal refresh operation REF are performed in succession (FIG. 26(b), (c), (d)). When the short refresh operation REFf is performed, the short refresh latch circuit 142 of the refresh decision circuit 130 shown in FIG. 19 latches the short refresh signal REFS2Z of high level in synchronization with the falling edge of the refresh state signal REF1Z, and outputs it as the short refresh signal REFSCZ (FIG. 26(e)).

Moreover, when the normal refresh operation REF is performed after the short refresh operation REFf, the short refresh latch circuit 142 latches the short refresh signal REFS2Z of low level in synchronization with the falling edge of the refresh state signal REF1Z, and outputs it as the short refresh signal REFSCZ (FIG. 26(f)). That is, the short refresh signal REFSCZ changes from high level to low level.

As shown in FIG. 26, the high level periods of the short refresh signals REFS2Z and REFSSZ do not overlap with each other. The short refresh signal REFSSZ thus remains at low level (FIG. 26(g)). Consequently, the output buffer circuit 148 shown in FIG. 20 is not inactivated by the short refresh signal REFSSZ. As a result, the read data D1 resulting from the read operation RD is output to exterior of the pseudo SRAM through the data terminals DQ (FIG. 26(h)). That is, if a conflict occurs between the refresh operation and the access operation, the correct data D1 is read out when the pseudo SRAM operates properly.

In contrast, FIG. 27 shows an example where the pseudo SRAM fails to operate properly due to an excessively short cycle time. Here, the short refresh operation REFf, the read operation RD, and the short refresh operation REFf are performed in succession (FIG. 27(b), (c), (d)). In FIG. 27, the short refresh operation REFf is performed instead of the normal refresh operation REF (FIG. 27(d)). Thus, the memory cells MC are not rewritten with sufficient charges, and the data retained in the memory cells MC disappears.

In this example, the short refresh signal REFS2Z is output for the short refresh operation REFf after the read operation RD corresponding to the address AD1 (FIG. 27(e)). When the short refresh operation REFf is performed, the short refresh latch circuit 142 latches the short refresh signal REFS2Z of high level again in synchronization with the falling edge of the refresh state signal REF1Z, and outputs it as the short refresh signal REFSCZ (FIG. 27(f)). The high level periods of the short refresh signals REFS2Z and REFSSZ thus overlap with each other, and the short refresh signal REFSSZ change; to high level (FIG. 27(g)).

In response to the short refresh signal REFSSZ, the output mask circuit 146 of the data output circuit 124 shown in FIG. 20 masks the read timing signal READZ to fix the output enable signal ODEX to high level. This inactivates the output buffer circuits 148 of the data output circuit 124 shown in FIG. 20. The tristate output buffers 148a prohibit the read data D1 resulting from the read operation RD corresponding to the address signal AD2 from being output to the data terminals DQ, and set the data terminals DQ to the high impedance state Hi-Z (FIG. 27(h)).

Consequently, as in FIG. 25, when the data terminals DQ are pulled up (logic "1"), the output buffer circuit 148s are determined to be inactivated due to the execution of the short refresh operation when the logic "0" previously written in the memory cells MC cannot be read and an error occurs. That is, an evaluation on the minimum cycle time at which the pseudo SRAM performs a proper refresh operation is made by detecting the occurrence of the two consecutive short refresh signals REFS2Z.

FIGS. 26 and 27 show the cases where the read operation RD corresponding to the address AD1 is performed to evaluate the conflict between the read command and the refresh request. Nevertheless, as shown in FIG. 23, the write operation WR corresponding to the address AD1 may be performed to evaluate the conflict between the write command and the refresh request.

Incidentally, whether or not the pseudo SRAM having a short refresh function performs refresh operations properly can be evaluated by checking if the data written in the memory cells MC disappears actually. To be more specific, tests for evaluating the memory cells for data retention characteristics (typically referred to as pause tests) can be conducted while gradually shifting the refresh request with respect to the access request. The data written in DRAM memory cells MC, however, is retained for several hundreds of milliseconds to several seconds. Then, checking for the proper execution of refresh operations through pause tests can require enormous amounts of test time.

As above, in the fourth embodiment, the data terminals DQ are set to a high impedance state when a conflict occurs between a refresh request and an access request, and a short refresh operation REFf is performed. Thus, the evaluation apparatus for evaluating the pseudo SRAM, such as an LSI tester, can easily and precisely evaluate the timing at which the short refresh operation REFf is inserted. That is, the timing at which the conflict occurs between the refresh request and the access request can be evaluated easily. As a result, the development period of the pseudo SRAM can be reduced with a reduction in development cost. In mass-producing the pseudo SRAM, when failures occur from variations of the manufacturing conditions and the like, failure analyses can be conducted promptly to allow the minimization of the low yield period.

Moreover, when short refresh operations REFf occur consecutively to cause an operation failure, the timing of occurrence of the failure can be surely evaluated from the detecting signal REFSSZ.

The data terminals DQ connected to the tristate output buffers 148a are used as external testing probes in the test modes. This eliminates the need for the formation of new terminals for evaluation, and can thus avoid an increase in the chip size of the pseudo SRAM.

When a conflict occurs between an access request and a refresh request, a short refresh operation REFf which ends in a short time is performed before the access operation. Thus, even when the refresh request has precedence over the access request, the access operation corresponding to the access request can be started earlier. That is, it is possible to reduce the access time.

When the short refresh operation REFf is performed, a normal refresh operation REF is always performed after the access operation. Consequently, even if a conflict occurs between an access request and a refresh request and precedence is given to the access request, it is possible to retain the data in the memory cells MC with reliability.

Figure 28:
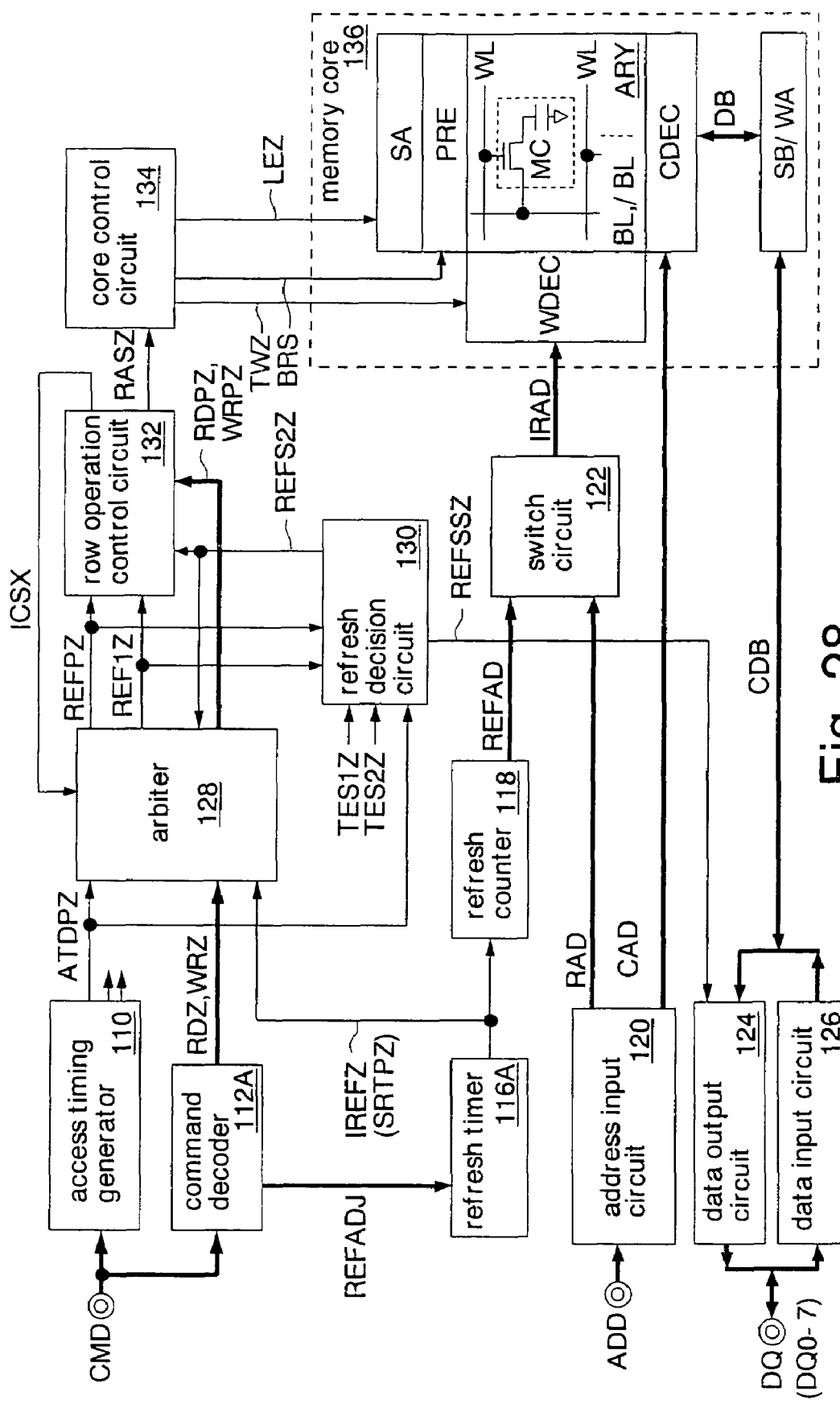
FIG. 28 is a block diagram showing a fifth embodiment of the semiconductor memory of the present invention.

FIG. 28 shows a fifth embodiment of the semiconductor memory of the present invention. The same elements as those described in the fourth embodiment will be designated by identical reference numbers or symbols. Detailed description thereof will be omitted.

In this embodiment, a command decoder 112A and a refresh timer 116A are formed instead of the command decoder 112 and the refresh timer 116 of the fourth embodiment. Moreover, neither the refresh selection circuit 114 nor the external testing probe SRC is formed in this embodiment. The rest of the configuration is almost the same as in the fourth embodiment.

The command decoder 112A decodes the command signals CMD, and outputs the read control signal RDZ for performing a read operation or the write control signal WRZ for performing a write operation. Moreover, in first and second test modes, the command decoder 112A outputs a refresh adjustment signal REFADJ for changing the cycle of the refresh timer 116A in accordance with the command signals CMD (test command) supplied to the command terminal CMD.

The refresh timer 116A outputs the internal refresh request signal IREFZ at predetermined cycles. In a normal operation mode, the internal refresh request signal IREFZ is generated at cycles such that the memory cells MC can be refreshed in succession without losing the data retained in the memory cells MC. In the first and second test modes, the internal refresh request signal IREFZ is generated at cycles corresponding to the logical value of the refresh adjustment signal REFADJ.

In this embodiment, the same evaluations as those of the fourth embodiment are conducted while the cycle of the refresh timer 116A is changed by the test command which is supplied through the command terminal CMD in the first and second test modes.

As above, the fifth embodiment can provide the same effects as those of the fourth embodiment described above. Moreover, in this embodiment, the refresh timer 116A receives the refresh adjustment signal REFADJ for changing the cycle of generation of refresh requests in the first and second test modes. It is therefore possible to generate refresh requests of desired timing inside the pseudo SRAM by using the circuits that operate in normal operations. Consequently, it is possible to evaluate the refresh characteristics under the same conditions as in the actual circuit operations of the pseudo SRAM.

Figure 29:
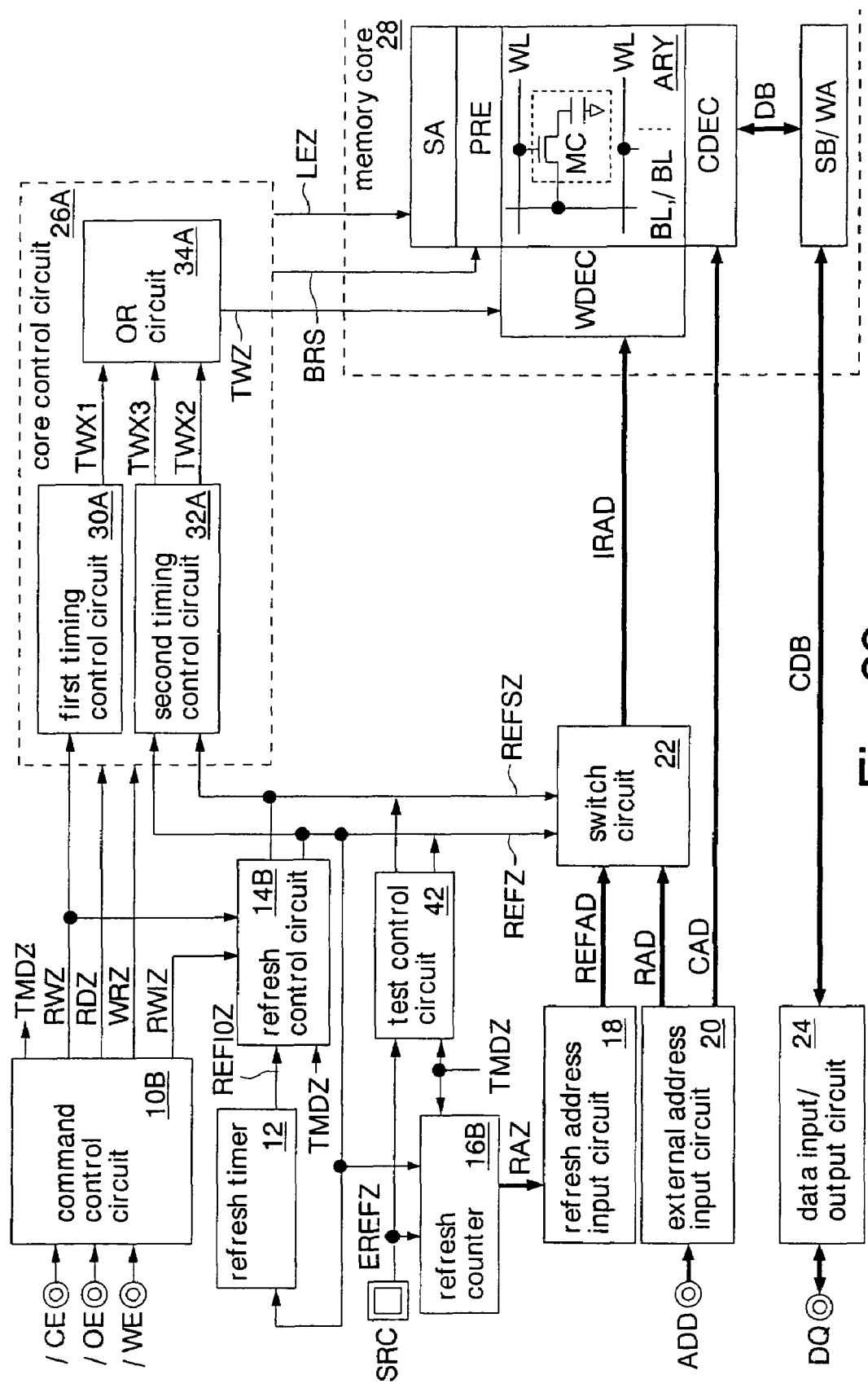
FIG. 29 is a block diagram showing a sixth embodiment of the semiconductor memory of the present invention.

FIG. 29 shows a sixth embodiment of the semiconductor memory of the present invention. The same elements as those described in the foregoing first and second embodiments will be designated by identical reference numbers or symbols. Detailed description thereof will be omitted. The double square in the diagram represents a test pad (external testing probe SRC). The test pad is not connected to any of the external terminals (lead frame etc.) of the product to be shipped. For example, the test pad is connected with a prober in a probing test, and receives test patterns. This semiconductor memory is formed as a pseudo SRAM which has DRAM memory cells (dynamic memory cells) and an SRAM interface.

In this embodiment, a command control circuit 10B, a refresh control circuit 14B, and a refresh counter 16B are formed instead of the command control circuit 10, the refresh control circuit 14, and the refresh counter 16 of the second embodiment. In addition, a test control circuit 42 is formed newly. The rest of the configuration is almost the same as in the second embodiment.

When the command control circuit 10B receives a plurality of command signals /CE, /OE, and /WD in a combination that is unused in normal operations, it outputs a test mode signal TMDZ (high level) in order to shift the pseudo SRAM from a normal operation mode to a test mode. In the test mode, the command control circuit 10B prohibits the output of the read/write control signals RWZ and RWIZ, the read control signal RDZ, and the write control signal WRZ. That is, neither a read operation nor a write operation is performed in the test mode.

The refresh control circuit 14B stops operating when it receives the test mode signal TMDZ of high level. That is, in the test mode, the refresh control circuit 14B outputs neither of the refresh signals REFZ and REFSZ.

When the refresh counter 16B receives the test mode signal TMDZ of high level, it masks the input of the refresh signal REFZ, and receives the test refresh request signal EREFZ which is supplied from exterior of the pseudo SRAM through the external testing probe SRC.

The test control circuit 42 is activated when it receives the test mode signal TMDZ of high level, and outputs the refresh signal REFSZ (first refresh signal) and the refresh signal REFZ (second refresh signal) in response to the test refresh request signal EREFZ. That is, in the test mode, refresh operations are performed by the refresh signal REFSZ (first test refresh signal) and the refresh signal REFZ (second test refresh signal) that are output from the test control circuit 42.

As will be described, the interval of generation of the refresh signals REFSZ and REFZ for the test control circuit 42 to generate in the test mode corresponds to the pulse width of the test refresh request signal EREFZ. Incidentally, the interval of generation of the refresh signals REFSZ and REFZ in the normal refresh mode is set as in the first embodiment, or at approximately 200 ns.

Figure 30:
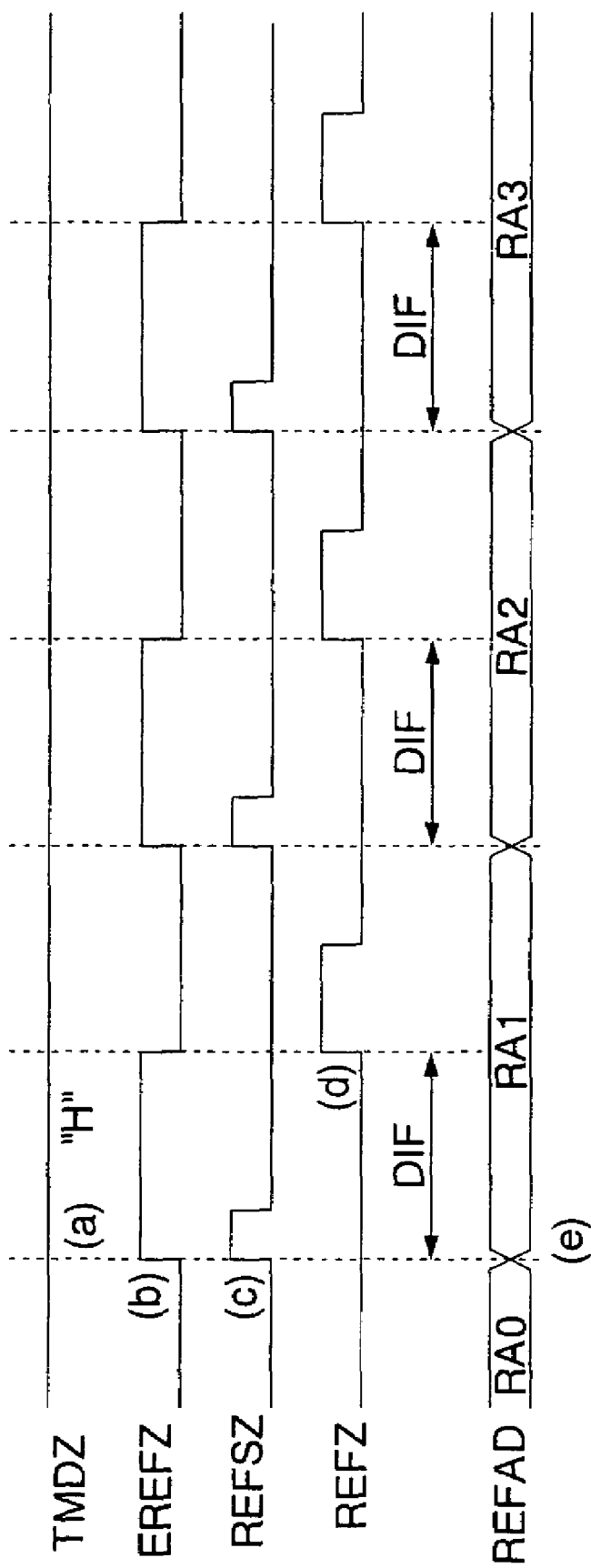
FIG. 30 is a timing chart showing an example of operation of the sixth embodiment in a test mode.

FIG. 30 shows an example of operation of the sixth embodiment in the test mode.

Initially, before a shift to the test mode, predetermined data (expected values) is written to the memory cells MC of the pseudo SRAM. Next, a test command is supplied to the pseudo SRAM, and the pseudo SRAM shifts from the normal operation mode to the test mode. The command control circuit 10B maintains the test mode signal TMDZ at high level (FIG. 30(a)).

Next, the test refresh request signal EREFZ having a pulse waveform is supplied from the external testing probe SRC (FIG. 30(b)). The test control circuit 42 outputs the refresh signal REFSZ for performing a short refresh operation in synchronization with the rising edge of the test refresh request signal EREFZ (FIG. 30(c)). The test control circuit 42 also outputs the refresh signal REFZ for performing a normal refresh operation in synchronization with the falling edge of the test refresh request signal EREFZ (FIG. 30(d)). In this way, the pulse width of the test refresh request signal EREFZ corresponds to the interval of generation of the refresh signals REFSZ and REFZ. In other words, the pulse width of the test refresh request signal EREFZ corresponds to a difference DIF between the start time of the short refresh operation and the start time of the normal refresh operation.

The refresh counter 16B counts up in synchronization with the test refresh request signal EREFZ, and outputs the refresh address signal REFAD (RADZ) (FIG. 30(e)). Then, the word lines WL are switched in succession in accordance with the refresh address signal REFAD, so that a short refresh operation and a normal refresh operation are performed on each single word line WL successively.

When the data rewritten (restored) to the memory cells MC by a short refresh operation is retained in the memory cells MC until a normal refresh operation, the correct data is rewritten to the memory cells MC by the refresh operation. On the other hand, when the data rewritten to the memory cells MC by the short refresh operation is not retained in the memory cells MC until the normal refresh operation, the data in the memory cells MC is corrupted. Here, the incorrect data is rewritten to the memory cells MC by the normal refresh operation.

The test shown in FIG. 30 is performed until the refresh counter 16B goes through a single round. The time required for a single round is set to be sufficiently shorter than the time up to which the data in the memory cells MC is retained after a normal refresh operation without loss. Subsequently, command signals are supplied to the pseudo SRAM, so that the pseudo SRAM shifts from the test mode to the normal operation mode. Then, the data is read from the memory cells MC. Whether the interval between the short refresh operation and the normal refresh operation is sufficient or not is determined depending on if the read data coincides with the expected values.

In fact, the LSI tester for testing the pseudo SRAM performs the foregoing test repeatedly while increasing the pulse width of the test refresh request signal EREFZ successively. For example, the difference DIF is changed from 100 ns to 300 ns successively. Then, the time of retention of the data rewritten to the memory cells MC by the short refresh operation is measured. In other words, the operation margin of the short refresh operation is evaluated.

As above, the sixth embodiment can provide the same effects as those of the first and second embodiments described above. Besides, this embodiment is rendered so that the refresh requests for a short refresh operation and a normal refresh operation can be input at desired timing from exterior of the pseudo SRAM in the test mode. It is therefore possible to evaluate the operation margin of the short refresh operation easily.

The interval of generation of the refresh signals REFSZ and REFZ is set in accordance with the pulse width of the test refresh request signal EREFZ. Consequently, the interval of generation of the refresh signals REFSZ and REFZ can be set freely from the single external testing probe SRC.

Figure 31:
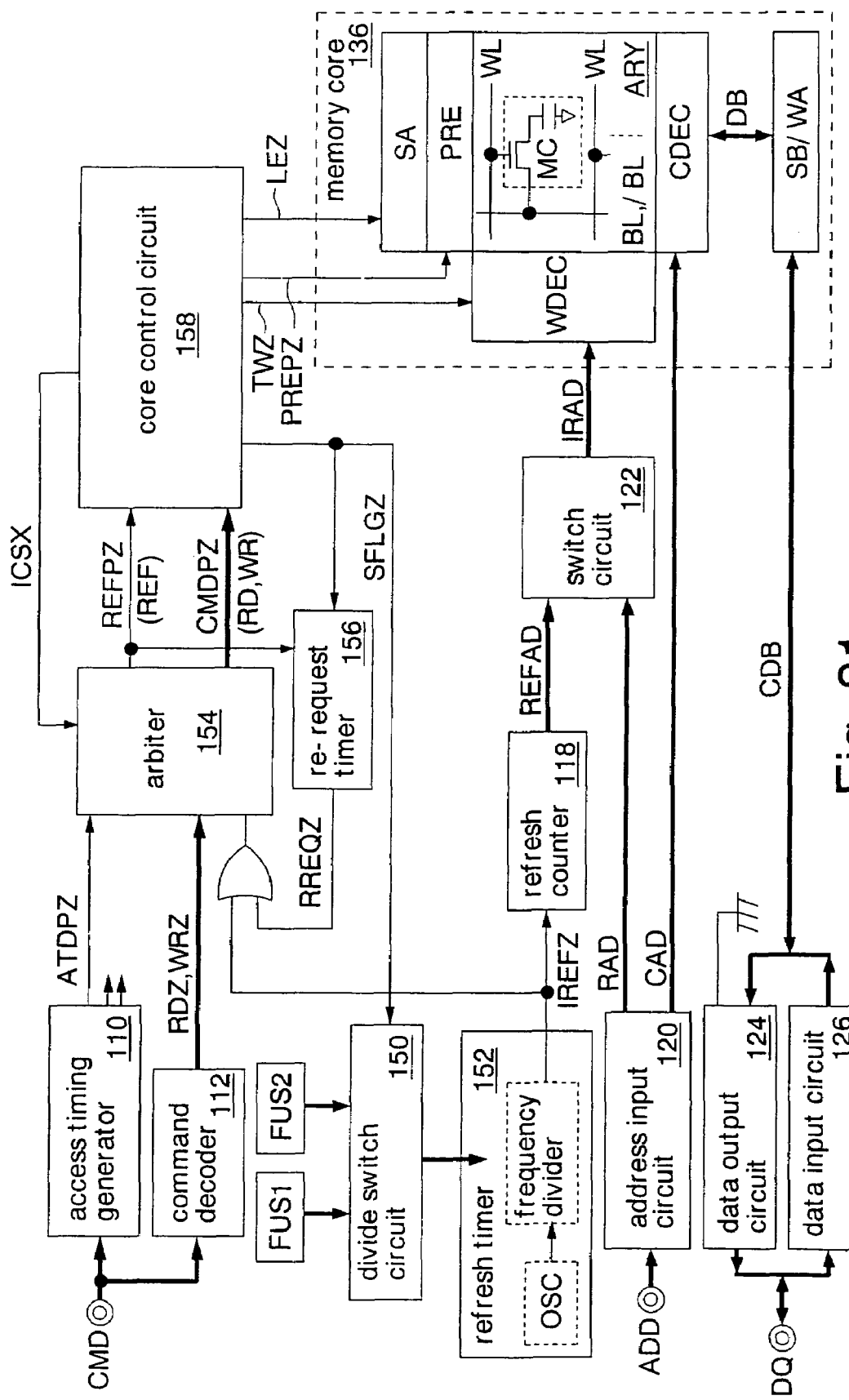
FIG. 31 is a block diagram showing a seventh embodiment of the semiconductor memory of the present invention.

FIG. 31 shows a seventh embodiment of the semiconductor memory of the present invention. The same elements as those described in the fourth embodiment will be designated by identical reference numbers or symbols. Detailed description thereof will be omitted. This semiconductor memory is formed as a pseudo SRAM which has DRAM memory cells (dynamic memory cells) and an SRAM interface. The pseudo SRAM performs periodic refresh operations inside the chip without receiving refresh commands from exterior, thereby retaining data written in its memory cells. This pseudo SRAM is used, for example, as a work memory to be mounted on a cellular phone.

The pseudo SRAM has an access timing generator 110, a command decoder 112, fuse circuits FUS1 and FUS2, a divide switch circuit 150, a refresh timer 152, a refresh counter 118, an address input circuit 120, a switch circuit 122, a data output circuit 124, a data input circuit 126, an arbiter 154, a re-request timer 156, a core control circuit 158, and a memory core 136. A command terminal CMD (external terminal) receives command signals (access requests) for accessing memory cells MC.

The fuse circuits FUS1 and FUS2 each have a fuse for adjusting the cycle of generation of an internal refresh request signal IREFZ to be output from the refresh timer 152.

The divide switch circuit 150 selects the output of the fuse circuit FUS1 when a short flag signal SFLGZ is at low level (first operation mode). The divide switch circuit 150 selects the output of the fuse circuit FUS2 when the short flag signal SFLGZ output from the core control circuit 158 is at high level (second operation mode). The divide switch circuit 150 outputs the selected signal to the frequency divider of the refresh timer 152.

When the output of the fuse circuit FUS1 is selected, the cycle of generation of the internal refresh request signal IREFZ becomes longer (approximately 73 μs).

When the output of the fuse circuit FUS2 is selected, the cycle of generation of the internal refresh request signal IREFZ becomes shorter (approximately 7.3 μs).

The refresh timer 152 has an oscillator OSC and the frequency divider. The frequency divider divides a clock signal output from the oscillator OSC in frequency in accordance with the output of the divide switch circuit 150, and outputs the divided signal as the internal refresh request signal IREFZ (refresh request).

The arbiter 154 compares the transition edges of an access timing signal ATDPZ (access request) and the internal refresh request signal IREFZ (refresh request), or the transition edges of the access timing signal ATDPZ and a re-request signal RREQZ (refresh request) of a refresh operation. The arbiter 154 thereby makes a decision on a conflict between the access request and the refresh request, and decides which to give precedence to, an access operation or a refresh operation. When the access operation has precedence, the arbiter 154 holds the refresh request temporarily, and outputs an access start signal CMDPZ (access control signal) in response to the read control signal RDZ or the write control signal WRZ. Subsequently, the arbiter 154 detects the completion of the access operation from the inactivation of a core cycle state signal ICSX (a change to high level), and outputs a refresh start signal REFPZ (refresh control signal) in accordance with the held refresh request.

Moreover, when the refresh operation has precedence, the arbiter 154 holds the access request temporarily, and outputs the refresh start signal REFPZ in response to the refresh request. Subsequently, the arbiter 154 detects the completion of the refresh operation from the inactivation of the core cycle state signal ICSX (a change to high level), and outputs the access start signal CMDPZ in accordance with the held access request.

The re-request timer 156 is activated to operate when it receives the short flag signal SFLGZ of low level (first operation mode). The activated re-request timer 156 determines from the refresh start signal REFPZ that the core control circuit 158 cannot perform a normal refresh operation, and outputs the re-request signal RREQZ to perform the normal refresh operation. As described above, the arbiter 154 receives the re-request signal RREQZ as a refresh request. That is, when a first or second short refresh operation to be described later is performed alone in response to a refresh request and it is impossible to perform a normal refresh operation, the pseudo SRAM attempts the normal refresh operation on the selected word line WL in the first operation mode which has a longer refresh cycle.

The core control circuit 158 has almost the same functions as those of the row operation control circuit 132 and the core control circuit 134 of the foregoing fourth embodiment. When the core control circuit 158 receives the refresh start signal REFPZ or the access start signal CMDPZ, it outputs a row control signal RASZ (not shown) which is a basic timing signal for operating the memory core 136. It also maintains the core cycle state signal ICSX at low level when the memory core 136 is in operation. Incidentally, the core control circuit 158 performs any one of a first short refresh operation, a second short refresh operation, and a normal refresh operation to be described later in response to a refresh request.

The core control circuit 158 also has a word line control circuit, a sense amplifier control circuit, and a precharge control circuit which are not shown. The word line control circuit outputs a word line control signal TWZ for selecting the word lines WL, in response to the row control signal RASZ. The sense amplifier control circuit outputs a sense amplifier activation signal LEZ for activating sense amplifiers of a sense amplifier part SA to be described later, in response to the row control signal RASZ. The precharge control circuit outputs a precharging signal PREPZ for precharging the bit lines BL and /BL to a predetermined voltage.

Figure 32:
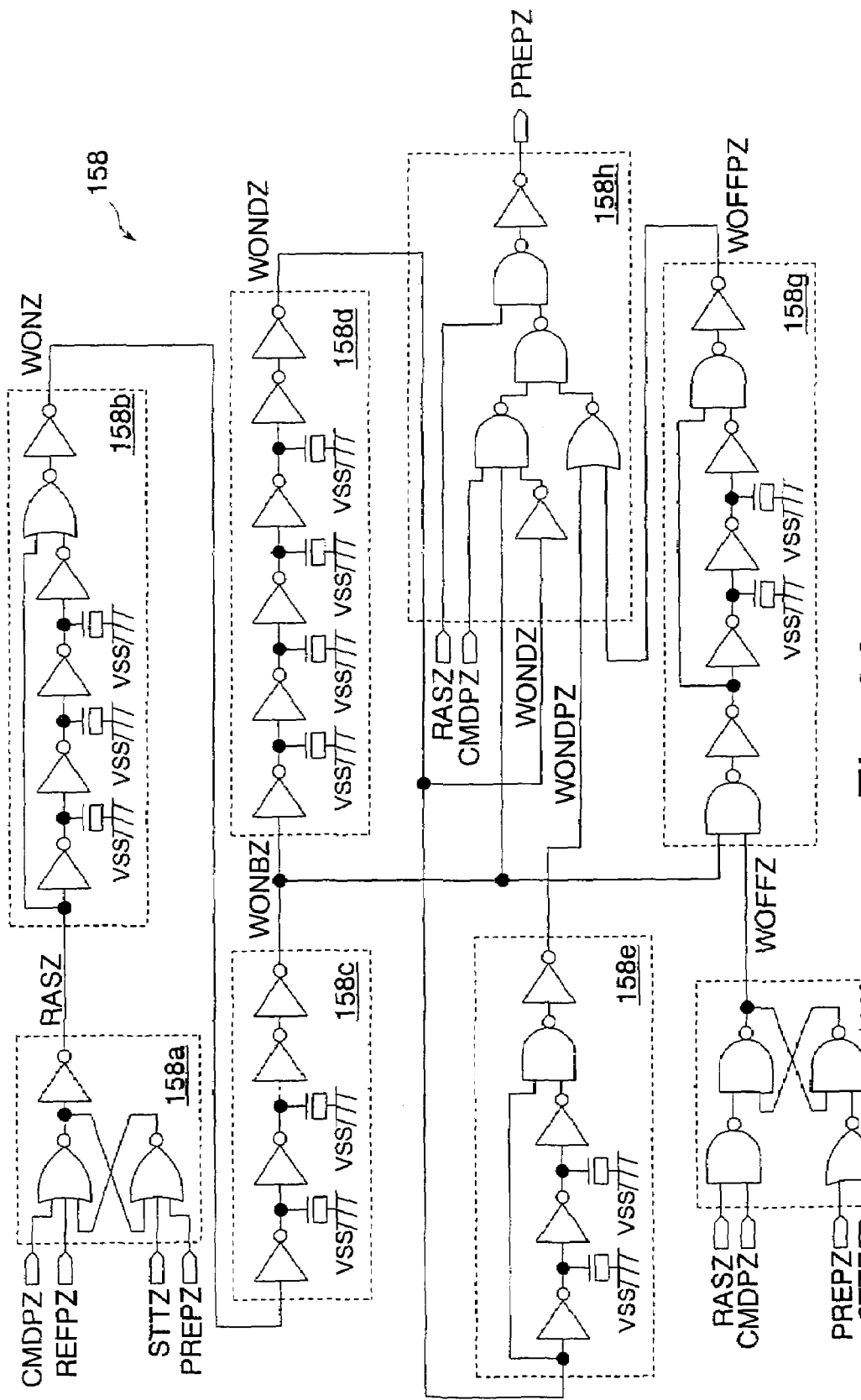
FIG. 32 is a circuit diagram showing the details of essential parts of the core control circuit shown in FIG. 31.

FIG. 32 shows the details of essential parts of the core control circuit 158 shown in FIG. 31.

The core control circuit 158 has a flip-flop 158*a*, a waveform shaping circuit 158*b*, a first delay circuit 158*c*, a second delay circuit 158*d*, a pulse generator 158*e*, a flip-flop 158*f*, a pulse generator 158*g*, and a precharge generator 158*h*.

The flip-flop 158*a* changes the row control signal RASZ to high level when it receives the access start signal CMDPZ or the refresh start signal REFPZ, and changes the row control signal RASZ to low level when it receives a starter signal STTZ or the precharging signal PREPZ. The high level period of the row control signal RASZ corresponds to the activation period of the word lines WL and the activation period of the sense amplifier SA.

The waveform shaping circuit 158*b* postpones the falling edge (inactivation edge) of the row control signal RASZ, and outputs it as a word-line-on signal WONZ. The first delay circuit 158*c* delays the word-line-on signal WONZ by a predetermined time, and outputs it as a word-line-on signal WONBZ (first time signal). The second delay circuit 158*d* delays the word-line-on signal WONBZ by a predetermined time, and outputs it as a word-line-on signal WONDZ (second time signal). The pulse generator 158*e* outputs a word-line-on-pulse signal WONDPZ which is in synchronization with the rising edge of the word-line-on signal WONDZ. The first delay circuit 158*c* and the second delay circuit 158*d* operate as timing generators for generating the first time signal and the second time signal, respectively.

The flip-flop 158*f* changes a word-line-off signal WOFFZ to high level when it receives the access start signal CMDPZ during the high level period of the row control signal RASZ. The flip-flop 158*f* changes the word-line-off signal WOFFZ to low level when it receives the precharging signal PREPZ or the starter signal STTZ. The pulse generator 158*g* outputs a word-line-off-pulse signal WOFFPZ when it detects the rising edge of the word-line-on signal WONBZ during the high level period of the word-line-off signal WOFFZ.

The precharge generator 158*h* outputs the precharging signal PREPZ when any of the following conditions holds during the high level period of the row control signal RASZ:

(1) when the word-line-off-pulse signal WOFFPZ is output;

(2) when the access start signal CMDPZ is supplied during a period in which the word-line-on signal WONBZ is at high level and the word-line-on signal WONDZ is at low level; and (3) when the word-line-on-pulse signal WONDPZ is output.

Figure 33:
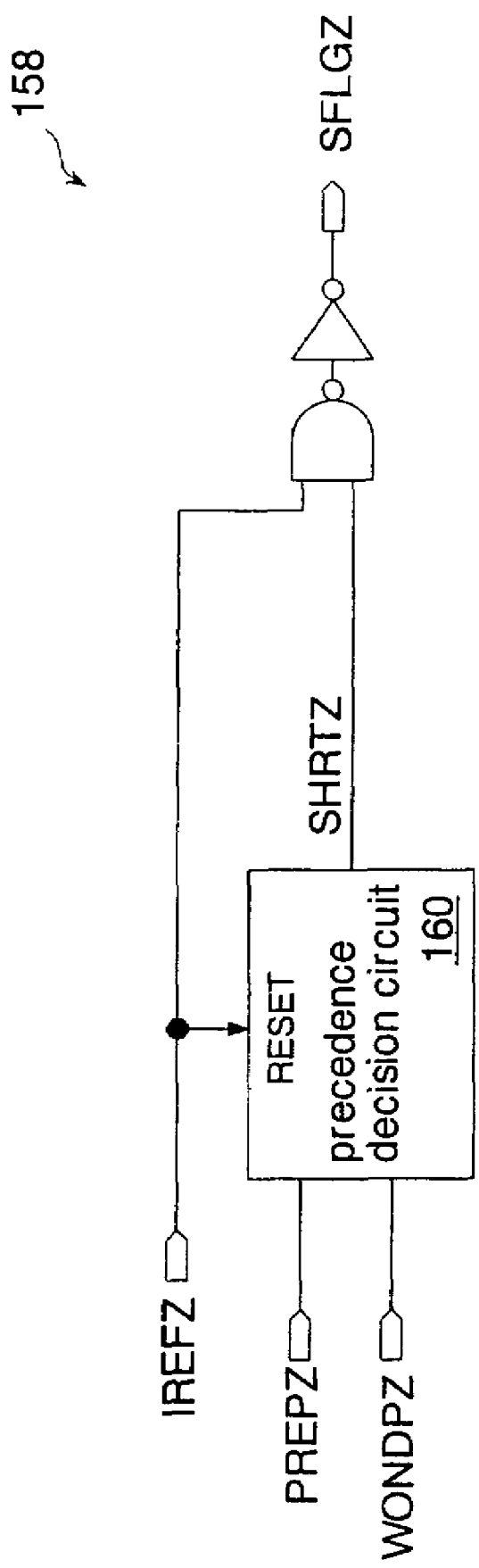
FIG. 33 is a block diagram showing a precedence decision circuit which is formed inside the core control circuit.

FIG. 33 shows a precedence decision circuit 160 which is formed inside the core control circuit 158.

The precedence decision circuit 160 is reset in response to the internal refresh request signal IREFZ, and changes a short signal SHRTZ to low level. The precedence decision circuit 160 changes the short signal SHRTZ to high level when it receives the precharging signal REFPZ before the word-line-on-pulse signal WONDPZ. The short signal SHRTZ of high level is output as the short flag signal SFLGZ in synchronization with the next internal refresh request signal IREFZ.

As will be described, when the first or second refresh operation, not the normal refresh operation, is performed in response to a refresh request, the precharging signal PREPZ for indicating the completion of the refresh operation is output before the word-line-on-pulse signal WONDPZ, so that the short signal SHRTZ is output. That is, the short flag signal SFLGZ is output when the next refresh request occurs from the refresh timer 152 without the normal refresh operation being performed.

Figure 34:
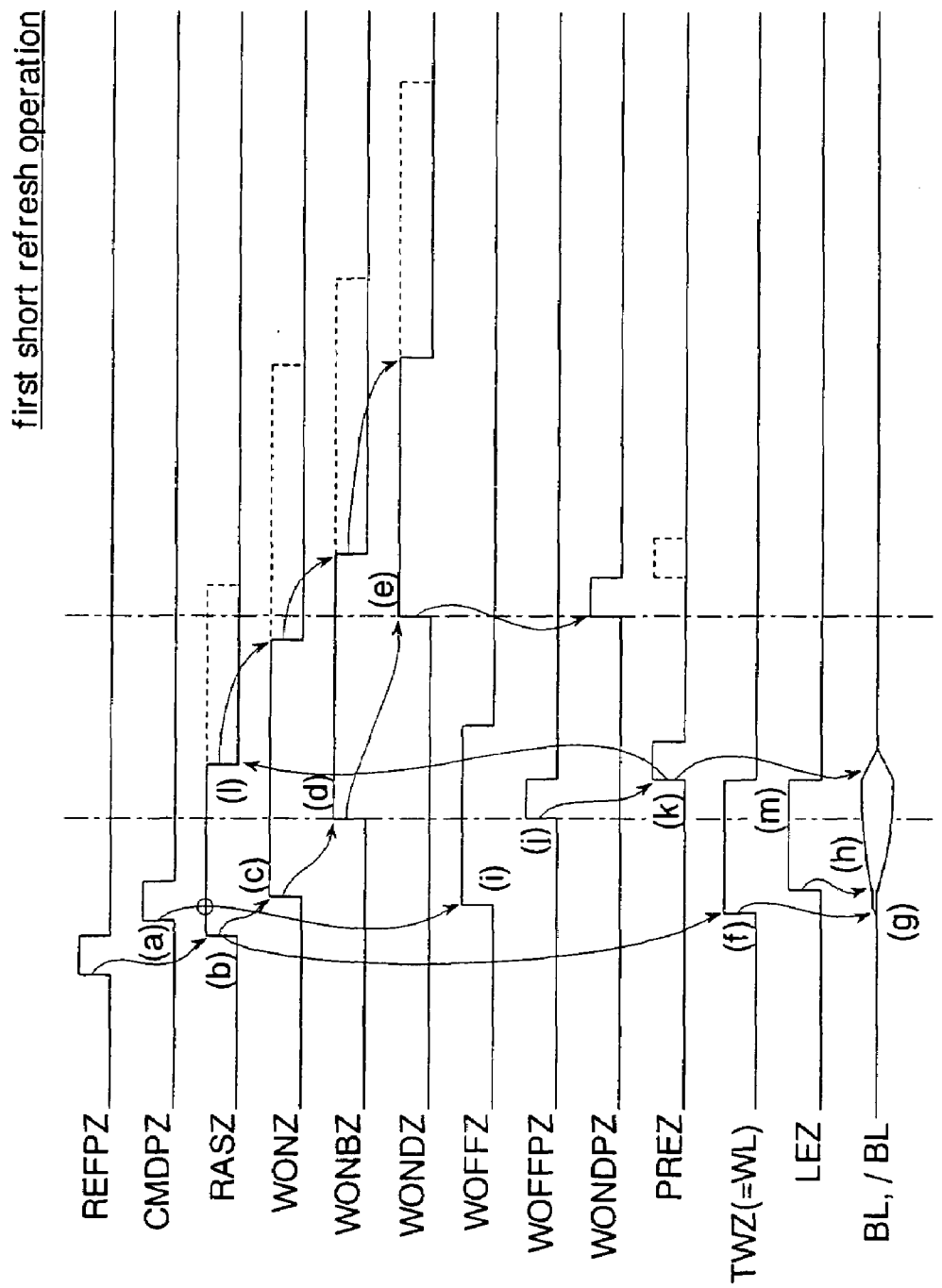
FIG. 34 is a timing chart showing an example of operation of the seventh embodiment.

FIG. 34 shows an example of operation of the seventh embodiment. In this example, an access command (access request) is supplied immediately after the refresh start signal REFPZ (FIG. 34(*a*)).

Initially, the flip-flop 158*a* shown in FIG. 32 outputs the row control signal RASZ in synchronization with the refresh start signal REFPZ (FIG. 34(*b*)). In response to the row control signal RASZ, the word-line-on signals WONZ, WONBZ, and WONDZ are output in succession (FIG. 34(*c*), (*d*), (*e*)). The word-line-on signal WONBZ (first time signal) is always output at a first time TIME1 after the output of the row control signal RASZ. The word-line-on signal WONDZ (second time signal) is always output at a second time TIME2 after the output of the row control signal RASZ.

The word line control signal TWZ is output in synchronization with the row control signal RASZ, whereby a word line WL according to the address AD is activated (FIG. 34(*f*)). Due to the activation of the word line WL, data is read from the memory cells MC to the bit lines BL and /BL (FIG. 34(*g*)).

After the activation of the word line WL, the sense amplifier activation signal LEZ is output to activate the sense amplifier SA. Due to the activation of the sense amplifier SA, the data on the bit lines BL and /BL is amplified (FIG. 34(*h*)). That is, a refresh operation for rewriting the data to the memory cells MC connected to the word line WL is started.

The flip-flop 158*f* shown in FIG. 32 outputs the word-line-off signal WOFFZ in synchronization with the access start signal CMDPZ corresponding to a command request (FIG. 34(*i*)). Since the word-line-on signal WONBZ changes to high level during the high level period of the word-line-off signal WOFFZ, the word-line-off-pulse signal WOFFPZ is output at the first time TIME1 (FIG. 34(*j*)).

The precharge generator 158*h* shown in FIG. 32 outputs the precharging signal PREPZ in synchronization with the word-line-off-pulse signal WOFFPZ (FIG. 34(*k*)). The output of the precharging signal PREPZ changes the row control signal RASZ to low level (FIG. 34(*l*)). Due to the change of the row control signal RASZ to low level, the word line WL is inactivated and the sense amplifier activation signal LEZ is inactivated (FIG. 34(*m*)). Then, the bit lines BL and /BL are precharged, and the refresh operation ends in response to the first time TIME1.

In response to the change of the row control signal RASZ to low level, the word-line-on signals WONZ, WONBZ, and WONDZ change to low level in succession. The broken lines in the chart show the waveforms for situations where the access request occurs with a delay after the refresh request (the normal refresh operation shown in FIG. 36 to be seen later).

As above, when the access start signal CMDPZ is output by the first time TIME1 from the refresh start signal REFPZ, i.e., when the access request is supplied before the first time TIME1, the refresh operation ends in response to the first time TIME1. For the refresh operation, a first short refresh operation, which is the shortest, is performed.

Figure 35:
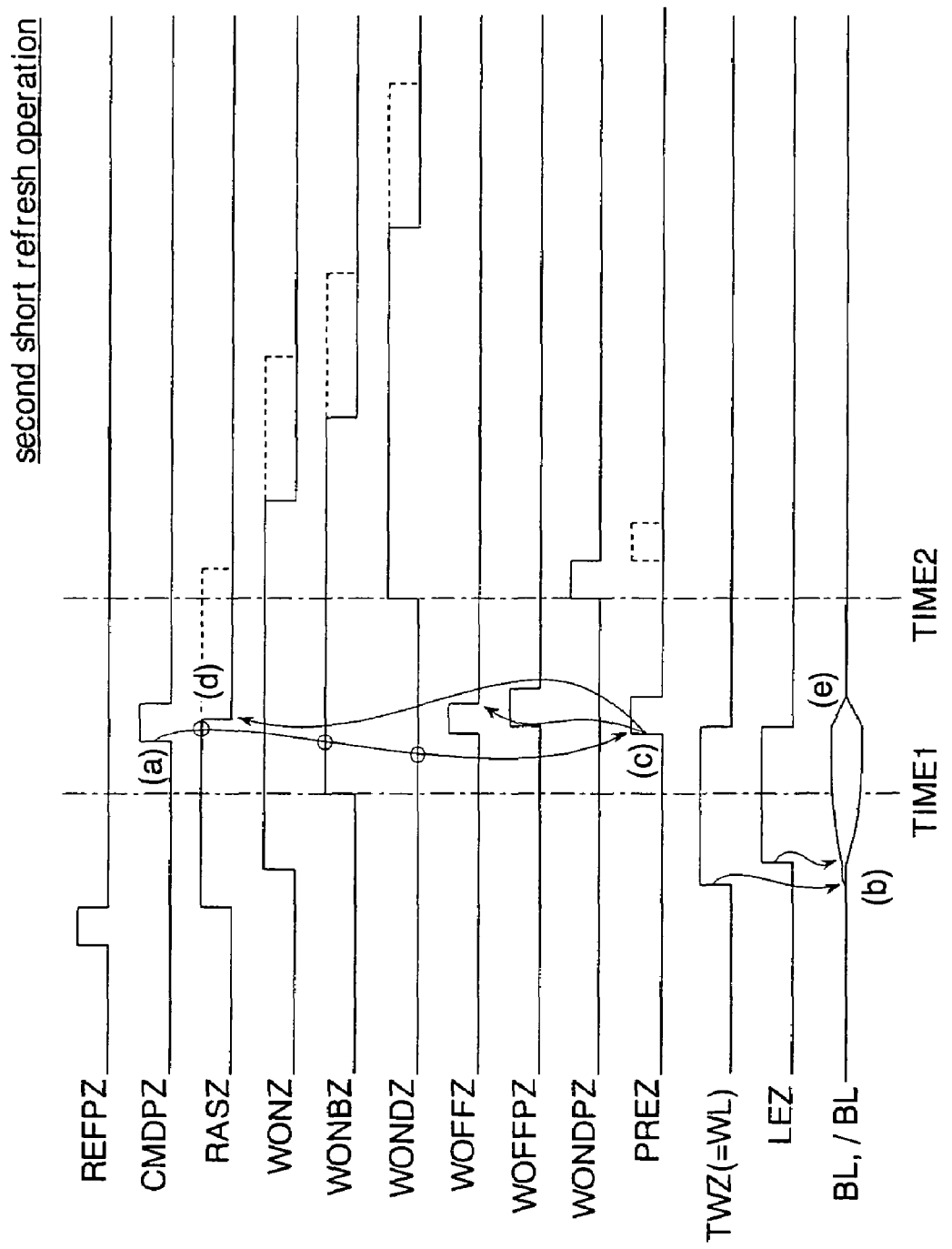
FIG. 35 is a timing chart showing another example of operation of the seventh embodiment.

FIG. 35 shows another example of operation of the seventh embodiment. Detailed description will be omitted of the same operations as in FIG. 34. Here, the access command (access request) is supplied between the first time TIME1 and the second time TIME2 (FIG. 35(*a*)).

Initially, the word line control signal TWZ (word line WL) and the sense amplifier activation signal LEZ are output successively in synchronization with the row control signal RASZ, and a refresh operation is started (FIG. 35(*b*)).

The access start signal CMDPZ is output when the word-line-on signal WONBZ is at high level and the word-line-on signal WONDZ is at low level. The precharge generator 158*h* thus outputs the precharging signal PREPZ in synchronization with the access start signal CMDPZ (FIG. 35(*c*)).

The output of the precharging signal PREPZ changes the row control signal RASZ to low level (FIG. 35(*d*)). Due to the change of the row control signal RASZ to low level, the word line WL is inactivated and the sense amplifier activation signal LEZ is inactivated (FIG. 35(*e*)). Then, the bit lines BL and /BL are precharged to end the refresh operation. The broken lines in the chart show the waveforms for situations where the access request occurs with a delay after the refresh request (the normal refresh operation shown in FIG. 36 to be seen later).

As above, when the access start signal CMDPZ is output between the first time TIME1 and the second time TIME2, the refresh operation ends in synchronization with the access start signal CMDPZ. The refresh operation that ends its operation between the first time TIME1 and the second time TIME2 will be referred to as a second short refresh operation.

The operation time of the second short refresh operation is longer than that of the first short refresh operation and shorter than that of the normal refresh operation. The operation time of the second short refresh operation is variable depending on the timing of generation of the access start signal CMDPZ.

Figure 36:
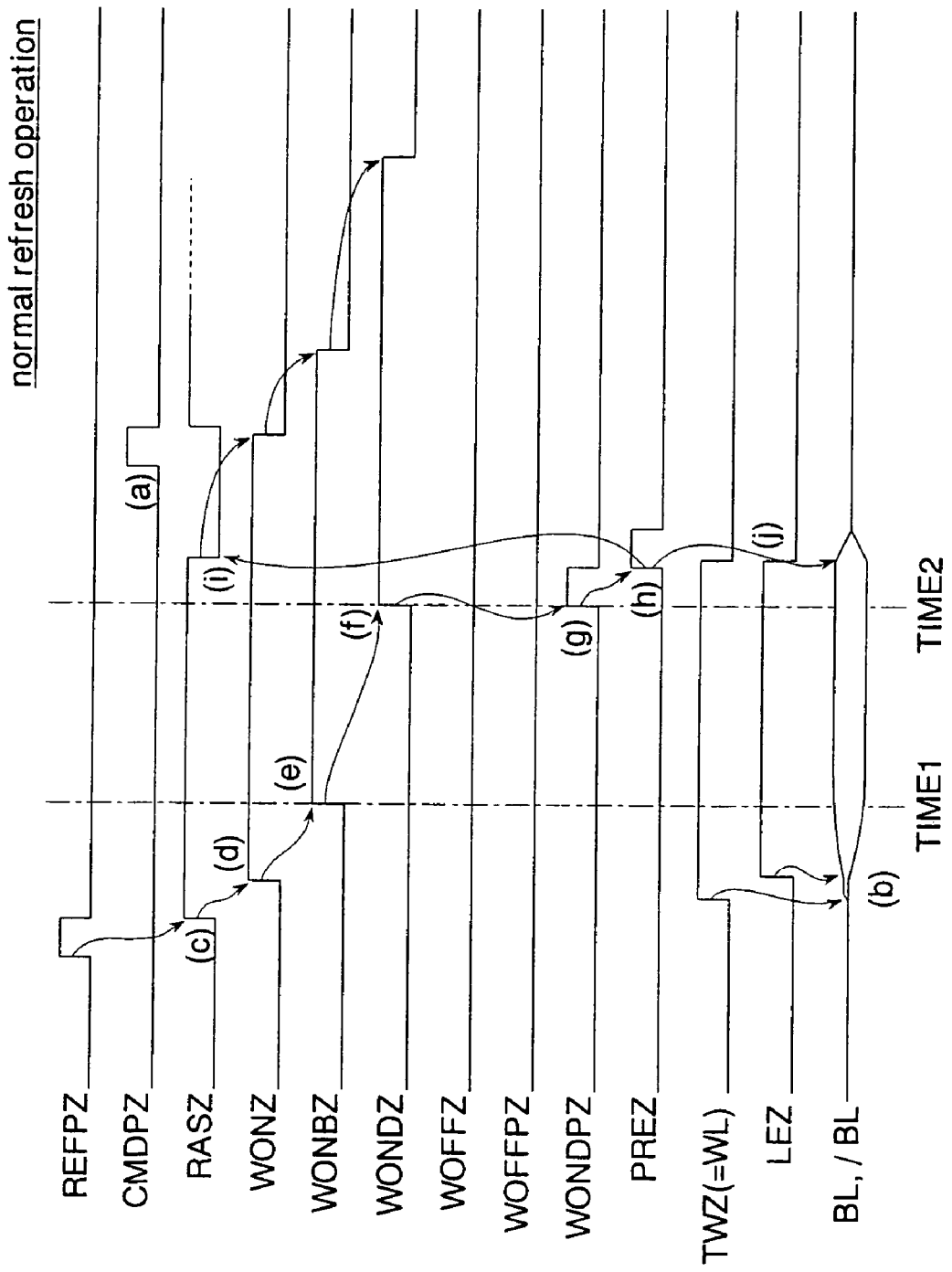
FIG. 36 is a timing chart showing another example of operation of the seventh embodiment.

FIG. 36 shows another example of operation of the seventh embodiment. Detailed description will be omitted of the same operations as in FIG. 34. In this example, the access command (access request) is supplied after the second time TIME2 (FIG. 36(*a*)).

Initially, the word line control signal TWZ (word line WL) and the sense amplifier activation signal LEZ are output successively in synchronization with the row control signal RASZ, and a refresh operation is started (FIG. 36(*b*)). Moreover, as in FIG. 34, the row control signal RASZ and the word-line-on signals WONZ, WONBZ, and WONDZ are output successively in response to the refresh start signal REFPZ (FIG. 36(*c*), (*d*), (e), (f)). In response to the word-line-on signal WONDZ, the word-line-on-pulse signal WONDPZ is output (FIG. 36(*g*)).

The precharge generator 158*h* shown in FIG. 32 outputs the precharging signal PREPZ in synchronization with the word-line-on-pulse signal WONDPZ (FIG. 36(*h*)). The output of the precharging signal PREPZ changes the row control signal RASZ to low level (FIG. 36(*i*)). Due to the change of the row control signal RASZ to low level, the word line WL is inactivated and the sense amplifier activation signal LEZ is inactivated (FIG. 36*0*)). Then, the bit lines BL and /BL are precharged to end the refresh operation.

As above, when the access start signal CMDPZ is output after the second time TIME2, the refresh operation ends in synchronization with the second time TIME2. That is, the normal refresh operation having an operation time longer than those of the first and second short refresh operations is performed.

Incidentally, the times of retention of data rewritten to the memory cells MC by the first and second short refresh operations reach or exceed 30 ms. The time of retention of data rewritten to the memory cells MC by the normal refresh operation reaches or exceeds 300 ms.

Figure 37:
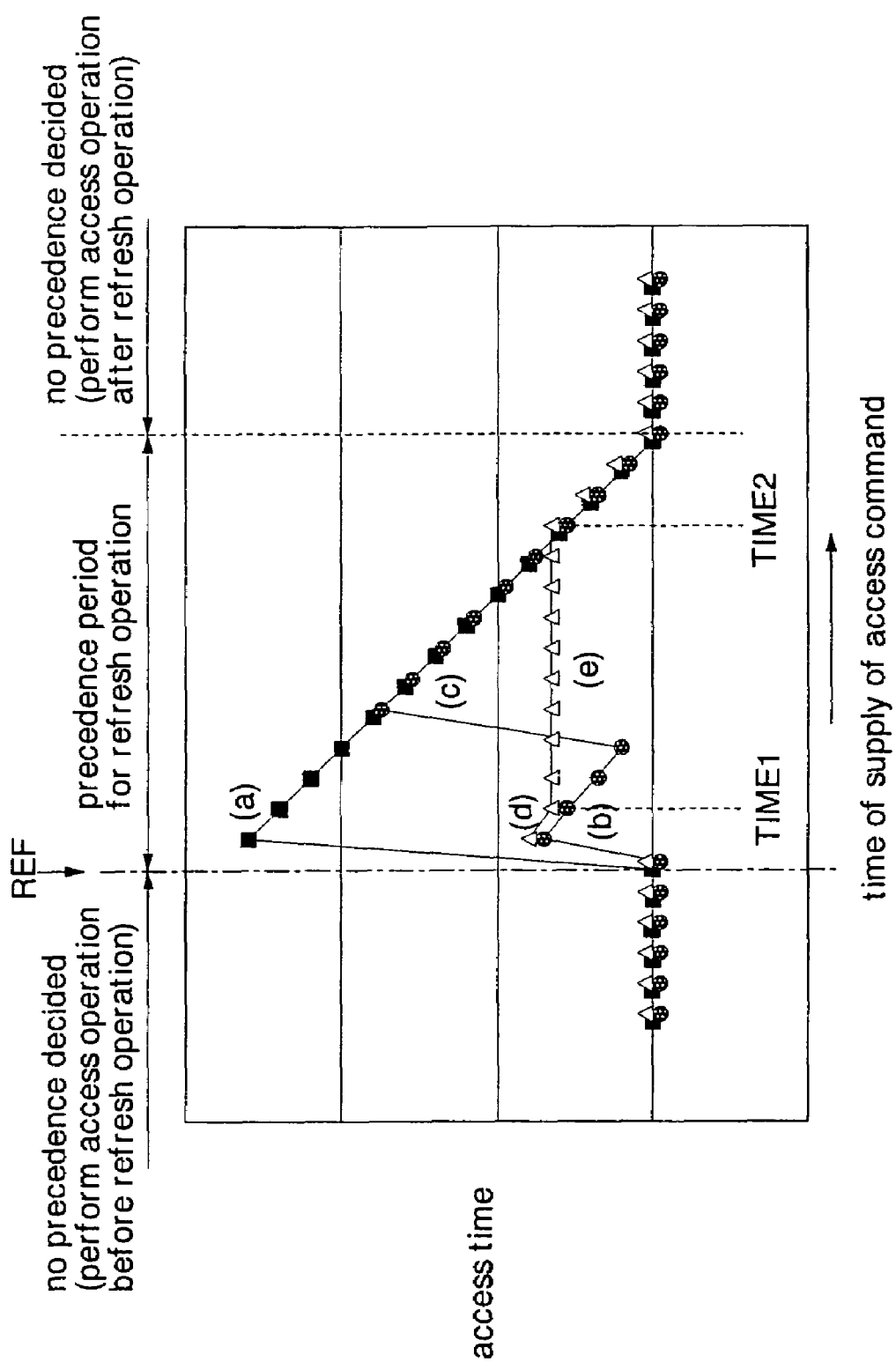
FIG. 37 is a characteristic chart showing the access time for situations where a conflict occurs between an access request and a refresh request.

FIG. 37 shows the access times for situations where a conflict occurs between an access request and a refresh request. In the chart, the black squares and the black circles indicate the access times before the application of the present embodiment. The white triangles indicate the access time according to the present embodiment.

The dashed line (REF) in the chart shows the time at which the refresh request occurs. The region on the left of the dashed line shows that the access request is earlier than the refresh request. The region on the right of the dashed line shows that the access request is later than the refresh request.

The black squares show a pseudo SRAM in which an access operation is always started a predetermined time after a refresh operation when the refresh operation has precedence over the access operation. In this case, the access time reaches its maximum when the access request occurs immediately after the refresh request (FIG. 37(*a*)).

The black circles show a pseudo SRAM which performs a short refresh operation having a shorter operation period (fixed operation time) when the access request is supplied immediately after the refresh request, and performs a normal refresh operation having a longer operation period (fixed operation time) when the access request is supplied after a while since the refresh request. In this pseudo SRAM, either one of the paths of two delay circuits is used to switch the end time of the refresh operation. In this case, the peak of the access time coincides with the time of switch between the delay circuits. Moreover, the access time makes a jump in response to the delay times of the delay circuits (quantization error). The left peak in the chart shows the case where the short refresh operation is performed with precedence (FIG. 37(b)). The right peak in the chart shows the case where the normal refresh operation is performed with precedence (FIG. 37(c)). Incidentally, when the refresh operations are switches by three or more delay circuits, there arise as many peaks as the number of delay circuits. Here, it is possible to make the maximum value of the access time smaller, whereas the switching control on the delay circuits becomes complicated. In addition, the access time makes jumps corresponding to the delay times of the delay circuits. That is, the access time shows serrate-like characteristics.

Meanwhile, in the pseudo SRAM of the present embodiment (the white triangles), the access time increases when the access request is supplied before the first time TIME1 (FIG. 37(d)). Nevertheless, the access time becomes constant subsequently (FIG. 37(e)). The reason for this is that between the first time TIME1 and the second time TIME2, the refresh operation ends in response to the access request as shown in FIG. 35. In the present embodiment, variations of the access time resulting from the operation of the arbiter 154 are thus minimized. In addition, the access time makes only a single jump.

Figure 38:
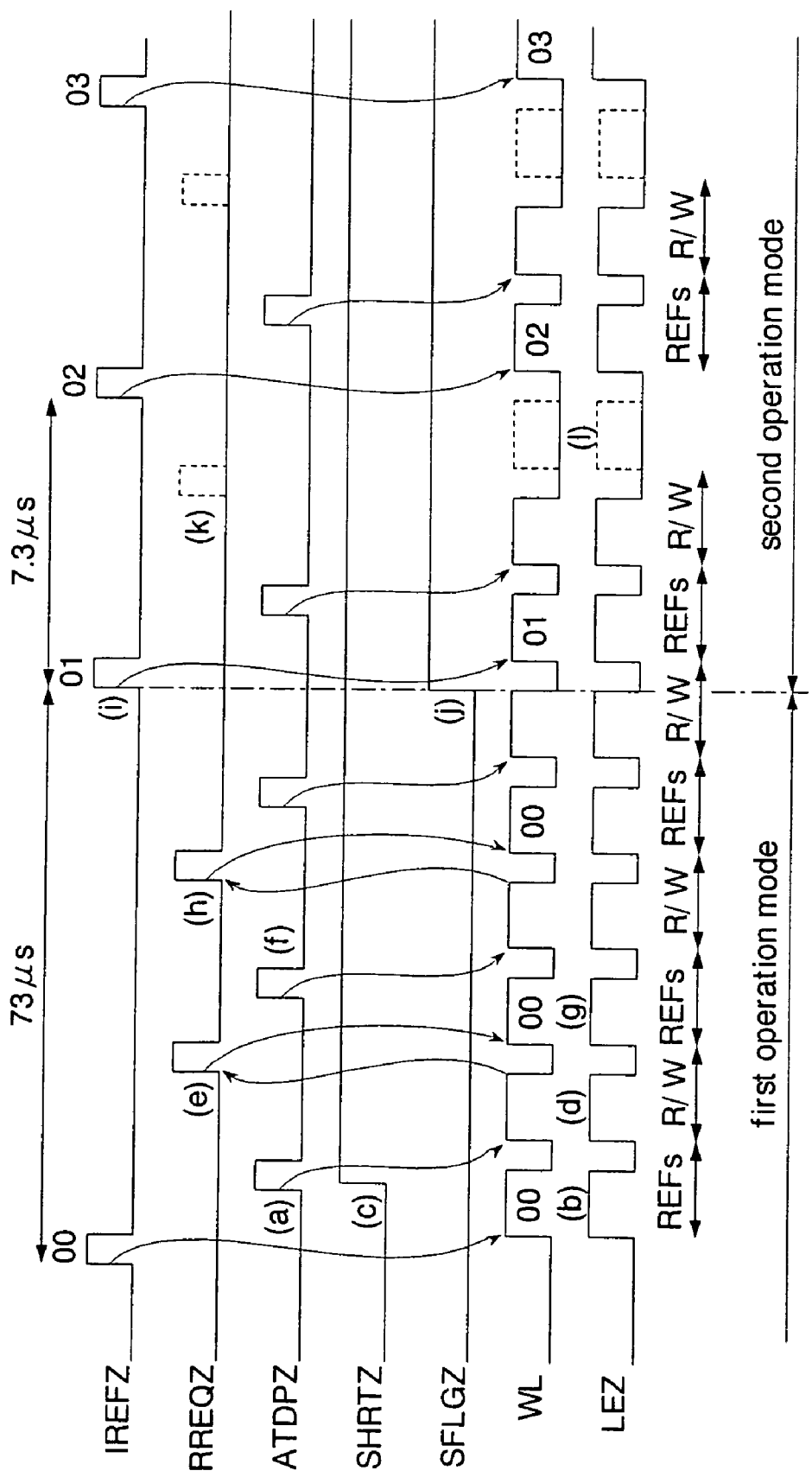
FIG. 38 is a timing chart showing a shift from a first operation mode to a second operation mode according to the seventh embodiment.

FIG. 38 shows a shift from the first operation mode to the second operation mode according to the seventh embodiment. The numerical values in the chart show refresh addresses REFAD.

In the beginning of the timing chart, normal refresh operations have been performed on all the memory cells MC. In the first operation mode, the internal refresh request signal IREFZ occurs at around every 73 µs. This figure is one obtained by dividing the time possible for the memory cells MC to retain data through a normal refresh operation (300 ms) by the number of word lines (4096). In the second operation mode, the internal refresh request signal IREFZ occurs at around every 7.3 µs. This figure is one obtained by dividing the time possible for the memory cells MC to retain data through a first or second refresh operation (30 ms) by the number of word lines (4096).

Initially, the access timing signal ATDPZ resulting from an access request is output immediately after the internal refresh request signal IREFZ corresponding to the refresh address REFAD (="00") (FIG. 38(a)). Thus, the first or second short refresh operation (REFs) is performed (FIG. 38(b)). The precedence decision circuit 160 of the core control circuit 158 shown in FIG. 33 changes the short signal SHRTZ to high level in response to the precharging signal PREPZ which is supplied before the word-line-on-pulse signal WONDPZ (FIG. 38(c)).

An access operation (R/W) corresponding to the access request is performed after the refresh operation REFs (FIG. 38(d)). Here, the access operation is a read operation or a write operation.

The re-request timer 156 shown in FIG. 31 is activated during the first operation mode (SFLGZ=low level). The re-request timer 156 outputs the re-request signal RREQZ in response to the refresh start signal REFPZ that shows the first or second short refresh operation (FIG. 38(e)). Then, after the access operation, the refresh operation for the refresh address "00" is started again.

Almost at the same time as the start of the refresh operation, the next access request is supplied (FIG. 38(f)). Consequently, the second short refresh operation is performed as the refresh operation (FIG. 38(g)). Since the normal refresh operation cannot be performed, the re-request timer 156 outputs the re-request signal RREQZ again (FIG. 38(h)). Subsequently, the first or second refresh operation corresponding to the re-request signal RREQZ is repeated.

Before the normal refresh operation for the refresh address "00" is performed, the next internal refresh request signal IREFZ for the refresh address "01" occurs (FIG. 38(i)). The precedence decision circuit 160 changes the short flag signal SFLGZ to high level in synchronization with the internal refresh request signal IREFZ (FIG. 38(j)). Due to the change of the short flag signal SFLGZ to high level, the pseudo SRAM shifts from the first operation mode to the second operation mode.

In this way, the pseudo SRAM enters the second operation mode when access requests are supplied frequently and the normal refresh operation cannot be performed in the first operation mode. The decision on the entry to the second operation mode is postponed as long as the interval of supply of the internal refresh request signal IREFZ (approximately 72 µs). When access requests cease and the normal refresh operation is performed in this interval, the pseudo SRAM will not enter the second operation mode. In the second operation mode, the interval of refresh requests is shorter, and the power consumption is higher than in the first operation mode. Since the decision on the entry to the second operation mode is postponed for a single cycle of refresh request, an unnecessary entry to the second operation mode is avoided to prevent an increase in power consumption.

The divide switch circuit 150 shown in FIG. 31 receives the short flag signal SFLGZ of high level, and selects the fuse circuit FUS2. Due to the selection of the fuse circuit FUS2, the refresh timer 152 outputs the internal refresh request signal IREFZ at around every 7.3 µs. That is, in the second operation mode, the interval of occurrence of refresh requests becomes approximately one tenth that in the first operation mode.

In the second operation mode, the re-request timer 156 is inactivated in response to the short flag signal SFLGZ of high level. This prevents the output of the re-request signal RREQZ (FIG. 38(k)), so that the refresh operation corresponding to the re-request signal RREQZ will not be performed (FIG. 38(l)). Since the interval of occurrence of refresh requests becomes shorter in the second operation mode, the data in the memory cells MC is adequately retained by performing the first or second refresh operations while the refresh counter 118 goes through a single round. In other words, the refresh operation corresponding to the re-request signal RREQZ becomes unnecessary. Prohibiting unnecessary refresh operations prevents an increase in power consumption.

Figure 39:
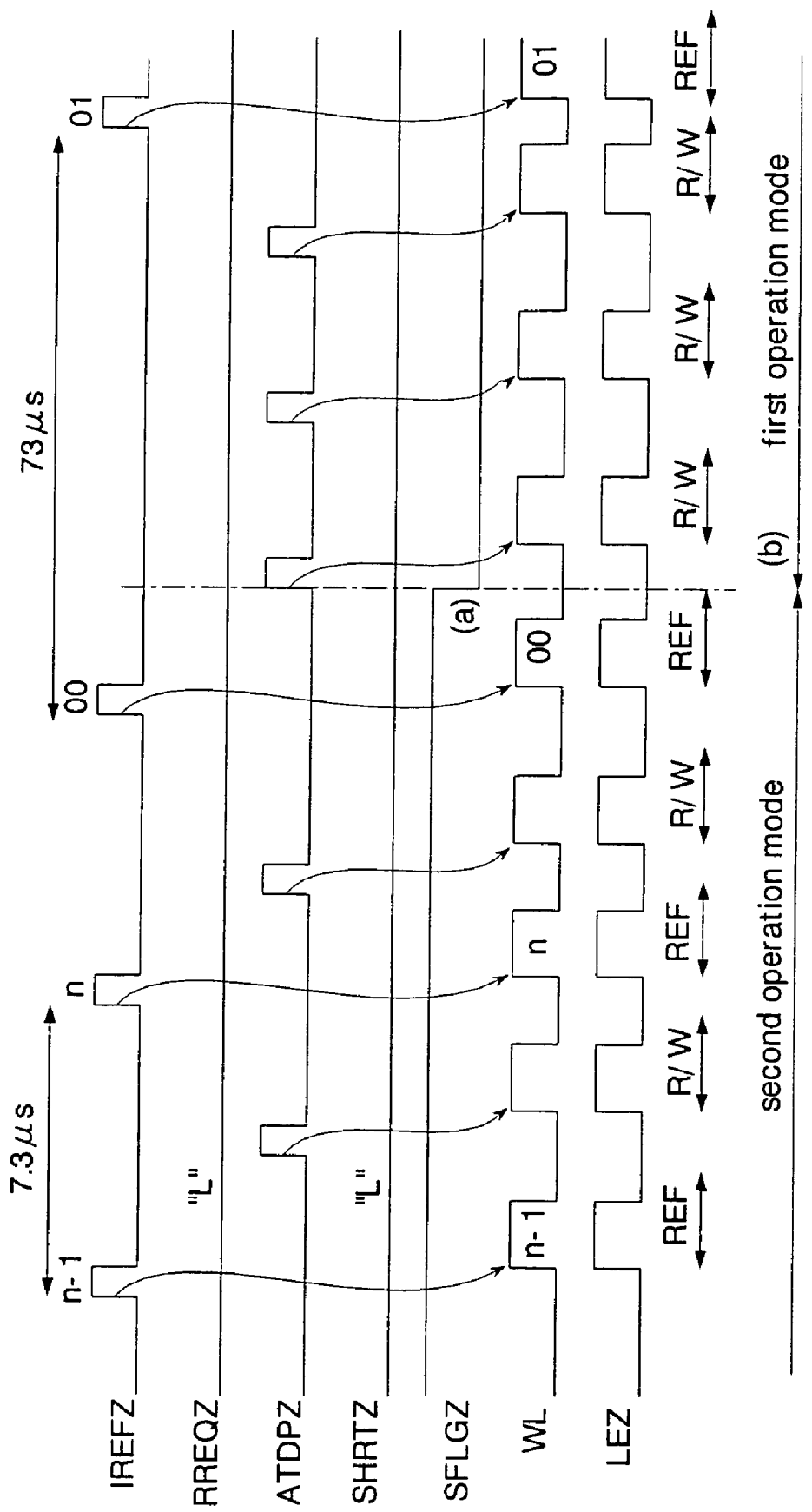
FIG. 39 is a timing chart showing a shift from the second operation mode to the first operation mode according to the seventh embodiment.

FIG. 39 shows a shift from the second operation mode to the first operation mode according to the seventh embodiment. The numerical values in the chart show refresh addresses REFAD.

When neither the first or second short refresh operation (REFs) but normal refresh operations (REF) alone are performed and the refresh counter 118 goes through a single round in the second operation mode, the core control circuit 158 changes the short flag signal SFLGZ to low level (FIG. 39(a)).

The divide switch circuit 150 receives the short flag signal SFLGZ of low level, and selects the fuse circuit FUS1. Due to the selection of the fuse circuit FUS1, the refresh timer 152 outputs the internal refresh request signal IREFZ at around every 73 µs. That is, due to the change of the short flag signal SFLGZ to low level, the operation mode returns from the second operation mode to the first operation mode, and the interval of occurrence of refresh requests becomes longer again. As above, the pseudo SRAM shifts from the second operation mode to the first operation mode when it determines that access requests are low in frequency and normal refresh operations can be performed consecutively. Entering the first operation mode allows a reduction in power consumption.

As above, in the seventh embodiment, the end time of a refresh operation is not fixed but variable depending on the timing of supply of an access requests when a conflict occurs between the refresh request and the access request. Consequently, when a conflict occurs between the refresh request and the access request, the access request after the refresh operation can be started even earlier. That is, the access time can be reduced further.

Specifically, when the access request is supplied before the first time TIME1, the end time of the refresh operation is set to the first time TIME1. Here, the first short refresh operation is performed. Consequently, the refresh operation always ends at or after the first time TIME1. Since the minimum refresh operation period is secured, it is possible to prevent the data in the memory cells MC from being corrupted by the refresh operation.

When the access request is supplied between the first time TIME1 and the second time TIME2, the end time of the refresh operation is set to the time of supply of the access request. Here, the second short refresh operation is performed. Consequently, the refresh operation can be completed in synchronization with the timing of supply of the access request. As a result, the access operation after the refresh operation can be started earlier, allowing a reduction in access time.

When the access request is supplied after the second time TIME2, the end time of the refresh operation is set to the second time TIME2. Here, the normal refresh operation is performed. Consequently, the refresh operation always ends at or before the second time TIME2. Even when no access request is supplied, the refresh operation always ends at the second time TIME2. It is therefore possible to avoid unnecessary operations of the memory core 136.

Since the end time of the refresh operation varies in accordance with the timing of supply of the access request, the access time will not vary even if the access request deviates from the refresh request gradually. This can prevent the access time from varying (the access time from jumping) depending on the difference in time between the refresh request and the access request. Since the access time makes no variation, it is possible to reduce the maximum value (worst value) of the access time.

The arbiter 154 makes it possible to perform access operations and refresh operations with reliability even if a conflict occurs between the access requests and the refresh requests.

The core control circuit 158 is provided with the delay circuits 158c and 158d (timing generators) which generate the word-line-on signal WONBZ for notifying of the first time TIME1 and the word-line-on signal WONDZ for notifying of the second time TIME2. It is therefore possible to end refresh operations in accordance with the timing of supply of access requests by using the simple logic circuits.

The decision on the shift from the first operation mode to the second operation mode is postponed until the occurrence of the next refresh request. Whether the frequency of supply of access requests is temporarily high or remains high can thus be decided with reliability. It is therefore possible to enter an optimum operation mode in accordance with the access frequency. As a result, the period of being in the second operation mode can be minimized to make the power consumption of the refresh operations the bare minimum. That is, the semiconductor memory can be reduced in power consumption.

In the second operation mode, when normal refresh operations alone are performed and the refresh counter goes through a single round, the pseudo SRAM determines that the frequency of access requests has dropped over a predetermined period, and shifts from the second operation mode to the first operation mode. Consequently, when the frequency of access requests is low, the frequency of refresh requests can be lowered with a reduction in power consumption.

As above, the interval of occurrence of refresh requests can be adjusted automatically in accordance with the frequency of access requests, thereby minimizing the power consumption resulting from the refresh operations. That is, it is possible to reduce the power consumption of the pseudo SRAM.

The invention is not limited to the above embodiments and various modifications may be made without departing from the spirit and scope of the invention. Any improvement may be made in part or all of the components.

What is claimed is:

1. A semiconductor device comprising:
   a memory core to include a plurality of volatile memory cells;
   a command control circuit that generates an access command to access the memory core in response to an access request supplied through a command terminal, the access command is a read command or a write command; and
   a control circuit coupled to the memory core, controlling the memory core to execute a first refresh operation before the memory core is accessed, and to execute a second refresh operation after the memory core is accessed, a first period of the first refresh operation is shorter than a second period of the second refresh operation, wherein a first portion of the memory core to be executed the first refresh operation is the same as a second portion of the memory core to be executed the second refresh operation.

2. The semiconductor device according to claim 1, further comprising a address input circuit receiving an external address signal in a way of address non-multiplex.

3. The semiconductor device according to claim 1, wherein the control circuit controls the memory core to execute the first and second refresh operations without receiving a refresh command signal supplied from an external of the semiconductor device.

4. The semiconductor device according to claim 1, wherein the first refresh operation includes a first read stage, a first amplifying stage and a first precharging stage and the second refresh operation includes a second read stage, a second amplifying stage and a second precharging stage, wherein:
   a period of the first read stage and a period of the second read stage is substantially identical;
   a period of the first read precharging and a period of the second precharging stage is substantially identical; and
   a period of the first amplifying stage is shorter than a period of the second amplifying stage.

5. The semiconductor device according to claim 1, wherein the control circuit includes a refresh timer generating a refresh request at predetermined cycles and refresh counter circuit generating a refresh address signal.

6. The semiconductor device according to claim 5, further comprising:
   an address input circuit receiving an external address signal through an address terminal and generating an address signal corresponding to the external address signal; and a switch circuit coupled to the refresh counter circuit and the address input circuit, selecting one of the refresh address signal and the address signal as an internal address signal.

7. The semiconductor device according to claim 1, wherein the memory core comprises:
a plurality of word lines connected to the memory cells; and
a row decoder circuit coupled to the memory cells, receiving the internal address signal and activating at least a word line of the plurality of word lines in order to refresh a first memory cell connected to the activated word line when the refresh address signal is selected as the internal address signal.

8. The semiconductor device according to claim 7, wherein the memory core further comprises:
a plurality of bit lines connected to the memory cells; and
a plurality of sense amplifiers connected to the bit lines, wherein
the first memory cell connected to the activated word line outputting data to at least a first bit line of the plurality of bit lines and a first sense amplifier of the plurality of sense amplifiers amplifying the data from the first bit line in order to refresh the first memory cell.

9. The semiconductor device according to claim 6, wherein the switching circuit selecting one of the refresh address signal and the address signal in response to a signal supplied from the control circuit.

10. The semiconductor device according to claim 1 or 9, wherein the control circuit includes a refresh control circuit generating one of a first refresh signal and a second refresh signal in response to the refresh request supplied from the refresh timer, wherein
the refresh control circuit generates the first refresh signal when the memory core executes the first refresh operation and generates the second refresh signal when the memory core executes the second refresh operation.

11. The semiconductor device according to claim 10, wherein the control circuit includes a core control circuit receiving the access command from the command control circuit and the first and second refresh signals from the refresh control circuit, the refresh control circuit generating a first timing signal when the memory core executes the first refresh operation, and generating a second timing signal when the memory core executes the second refresh operation.

12. The semiconductor device according to claim 11, wherein the core control circuit includes a first timing control circuit receiving at least the first refresh signal and generating the first timing signal and a second timing control circuit receiving at least the second refresh signal and generating the second timing signal.

13. The semiconductor device according to claim 12, wherein the first timing control circuit receiving the access command and generating the first timing signal when the memory core executes a read operation or a write operation.

14. The semiconductor device according to claim 12, wherein the core control circuit includes a access timing control circuit receiving the access command and generating an access timing signal when the memory core executes a read operation or a write operation.

15. The semiconductor device according to claim 10, wherein the refresh control circuit includes a first refresh generator circuit generating the first refresh signal at a first output terminal and a second refresh generator circuit generating the second refresh signal at a second output terminal that is different from the first terminal.

16. The semiconductor device according to claim 10, wherein the refresh control circuit includes a first refresh generator circuit generating the first refresh signal at an output terminal and a second refresh generator circuit generating the second refresh signal at the output terminal.

17. A mobile apparatus comprising:
a memory core including a plurality of volatile memory cells;
a command control circuit coupled to the memory core, outputting an access command to the memory core in order to access the memory core in response to an access request supplied through a command terminal, the access command is a read command or a write command; and
a control circuit coupled to the memory core, controlling the memory core to execute a first refresh operation before the memory core is accessed, and to execute a second refresh operation after the memory core is accessed, a first period of the first refresh operation is shorter than a second period of the second refresh operation, wherein a first portion of the memory core to be executed the first refresh operation is the same as a second portion of the memory core to be executed the second refresh operation.

18. A cellular phone comprising:
a memory core including a plurality of memory cells;
a command control circuit coupled to the memory core, outputting an access command to the memory core in order to access the memory core in response to an access request supplied through a command terminal, the access command is a read command or a write command; and
a control circuit coupled to the memory core, controlling the memory core to execute a first refresh operation before the memory core is accessed, and to execute a second refresh operation after the memory core is accessed, a first period of the first refresh operation is shorter than a second period of the second refresh operation, wherein a first portion of the memory core to be executed the first refresh operation is the same as a second portion of the memory core to be executed the second refresh operation.

19. A semiconductor device comprising:
a memory core including a plurality of volatile memory cells;
a command control circuit generating an access command for accessing the memory core in response to an access request supplied through a command terminal, the access command is a read command or a write command; and
a control circuit coupled to the memory core, controlling the memory core to execute a first refresh operation before the memory core is accessed, and to execute a second refresh operation after the memory core is accessed, wherein
the control circuit includes a first timing control circuit generating a first timing for starting the second refresh operation and a second timing control circuit generating a second timing for starting the first refresh operation.

20. The semiconductor device according to claim 19, further comprising:
a refresh control circuit generating one of a first refresh signal for the first refresh operation and a second refresh signal for the second refresh operation, the first refresh signal is inputted to the second timing control circuit and the second refresh signal is inputted to the first timing control circuit.

21. A semiconductor device comprising:

a memory core including a plurality of volatile memory cells;

a command control circuit generating an access command for accessing the memory core in response to an access request supplied through a command terminal, the access command is a read command or a write command; and a control circuit coupled to the memory core, controlling the memory core to execute a first refresh operation before the memory core is accessed, and to execute a second refresh operation after the memory core is accessed, wherein the control circuit includes a first timing control circuit generating a first timing for reading from the memory core or writing to the memory core starting the second refresh operation and a second timing control circuit generating a second timing for starting the second refresh operation and a third timing for starting the first refresh operation.

* * * * *